US012811363B2

(12) United States Patent
Chen et al.

(10) Patent No.: US 12,811,363 B2
(45) Date of Patent: Nov. 24, 2026

(54) SEMICONDUCTOR LIGHT EMITTING DEVICE

(71) Applicant: iReach Corporation, Hsinchu (TW)

(72) Inventors: Shou-Lung Chen, Taipei City (TW); Hsin-Chan Chung, Zhubei City (TW); Tzu-Chieh Hsu, Zhubei City (TW); Chi-Hsun Hsieh, Taipei City (TW)

(73) Assignee: IREACH CORPORATION, Hsinchu (TW)

( * ) Notice: Subject to any disclaimer, the term of this patent is extended or adjusted under 35 U.S.C. 154(b) by 1013 days.

(21) Appl. No.: 18/053,393

(22) Filed: Nov. 8, 2022

(65) Prior Publication Data

US 2023/0155349 A1 May 18, 2023

Related U.S. Application Data

(60) Provisional application No. 63/279,709, filed on Nov. 16, 2021.

(51) Int. Cl.

*H01S 5/042* (2006.01)
*H01S 5/02335* (2021.01)
*H01S 5/183* (2006.01)
*H01S 5/42* (2006.01)

(52) U.S. Cl.

CPC ...... *H01S 5/04256* (2019.08); *H01S 5/02335* (2021.01); *H01S 5/0425* (2013.01); *H01S 5/18308* (2013.01); *H01S 5/18344* (2013.01); *H01S 5/423* (2013.01)

(58) Field of Classification Search

CPC ............ H01S 5/04256; H01S 5/02335; H01S 5/0425; H01S 5/18308; H01S 5/18344; H01S 5/423

See application file for complete search history.

(56) References Cited

U.S. PATENT DOCUMENTS

2014/0348192 A1* 11/2014 Pruijmboom ......... H01S 5/0235 372/36
2019/0067540 A1* 2/2019 Chae .................... H10H 20/857
2020/0350742 A1* 11/2020 Chung ................ H01S 5/04254
2021/0083452 A1* 3/2021 Hanaoka ............... H01S 5/0234

* cited by examiner

*Primary Examiner* — Yuanda Zhang

(74) *Attorney, Agent, or Firm* — McClure, Qualey & Rodack, LLP

(57) ABSTRACT

A semiconductor light emitting device includes a substrate, a first epitaxial structure and a second epitaxial structure, a connecting layer, a first electrode structure, a second electrode structure, and a third electrode structure. The first epitaxial structure and the second epitaxial structure are on the substrate side by side. The connecting layer is between the first epitaxial structure and the substrate, between the second epitaxial structure and the substrate, and between the first epitaxial structure and the second epitaxial structure. The first electrode structure is on the first epitaxial structure away from the substrate. The second electrode structure is on the second epitaxial structure away from the substrate. The third electrode structure is connected to the connecting layer.

17 Claims, 30 Drawing Sheets

SEMICONDUCTOR LIGHT EMITTING DEVICE

CROSS-REFERENCE TO RELATED APPLICATION

Technical Field

The disclosure is related to a semiconductor light emitting device.

BACKGROUND

Vertical cavity surface emitting laser (VCSEL) is one among various laser components. When the VCSEL is applied to three-dimensional (3D) detection, the VCSEL has to be operated with short pulses and high currents so as to increase the luminance thereby increasing the detection distance. Moreover, a VCSEL chip with addressable-control function is to be provided to cope with application scenarios under different ambient light intensities for different detecting environments.

SUMMARY

In view of this, in one or some embodiments of the disclosure, a flip chip type vertical cavity surface emitting laser (VCSEL) is provided. In the VCSEL, metal wire bonding is not necessary. Therefore, the overall volume of the VCSEL can be reduced, so that the VCSEL has a smaller capacitance which is suitable for high frequency applications. Moreover, the VCSEL can perform addressable-control function to adjust the light emitting regions for coping with different ambient light intensities, thereby being suitable for different application scenarios.

In one or some embodiments of the disclosure, a semiconductor light emitting device is provided. The semiconductor light emitting device comprises a substrate; a first epitaxial structure and a second epitaxial structure on the substrate side by side; a connecting layer between the first epitaxial structure and the substrate, between the second epitaxial structure and the substrate, and between the first epitaxial structure and the second epitaxial structure; a first electrode structure on a surface of the first epitaxial structure away from the substrate; a second electrode structure on a surface of the second epitaxial structure away from the substrate; and a third electrode structure connected to the connecting layer.

BRIEF DESCRIPTION OF THE DRAWINGS

The disclosure will become more fully understood from the detailed description given herein below for illustration only, and thus not limitative of the disclosure, wherein:

FIG. 4A through FIG. 4E illustrate a schematic bottom perspective view, a schematic top perspective view, and schematic cross-sectional views with different cross-sections of a semiconductor light emitting device according to an exemplary embodiment, respectively, wherein FIG. 4A through FIG. 4E are provided to illustrate the configuration of the light emitting region and the common electrode structure of the semiconductor light emitting device of the exemplary embodiment;

FIG. 5A through FIG. 5C illustrate schematic top perspective views of semiconductor light emitting devices according to exemplary embodiments, wherein FIG. 5A through FIG. 5C are provided to illustrate the configurations of the back electrode structures of the semiconductor light emitting devices of the exemplary embodiments;

FIG. 6A through FIG. 6E illustrate schematic bottom perspective views of semiconductor light emitting devices according to exemplary embodiments, wherein FIG. 6A through FIG. 6E are provided to illustrate the configurations of the back electrode structures of the semiconductor light emitting devices of the exemplary embodiments;

DETAILED DESCRIPTION

Figure 1A:
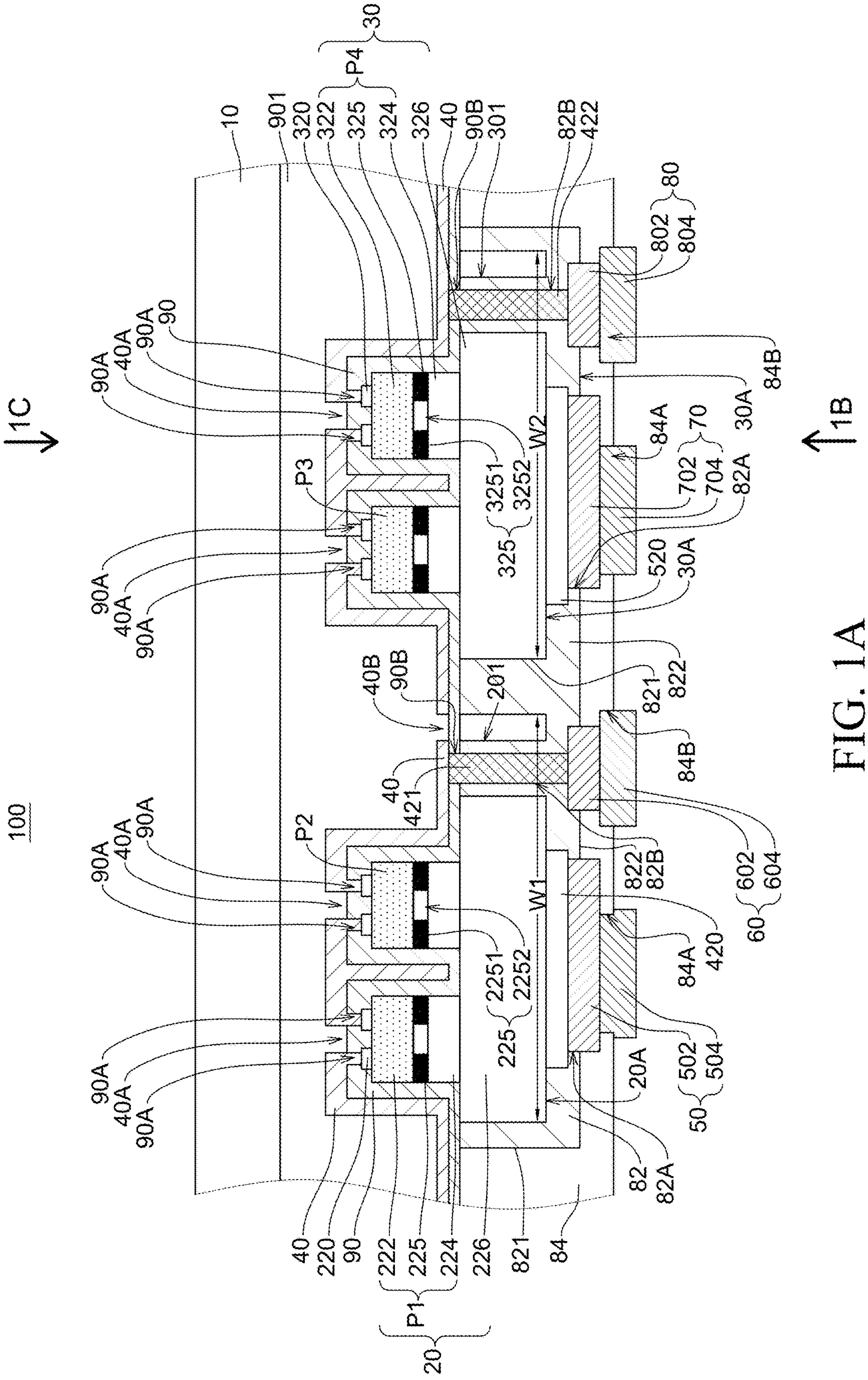
FIG. 1A through FIG. 1C illustrate a schematic cross-sectional view, a schematic bottom perspective view, and a schematic top perspective view of a semiconductor light emitting device according to an exemplary embodiment, respectively.

The following description is to be understood with the aid of the provided figures, and the concept of the disclosure is illustrated using provided exemplary embodiments. In the figures or the description, identical or similar items are denoted using identical or corresponding numbers/symbols. Besides, the figures are for illustrative purposes, wherein the thickness and shape of each layer are not the actual size or ratio of any corresponding element. It should be noted in particular that, components not shown in the drawings or described in the specification may be in a form known to persons having ordinary skills in the art.

Figure 1B:
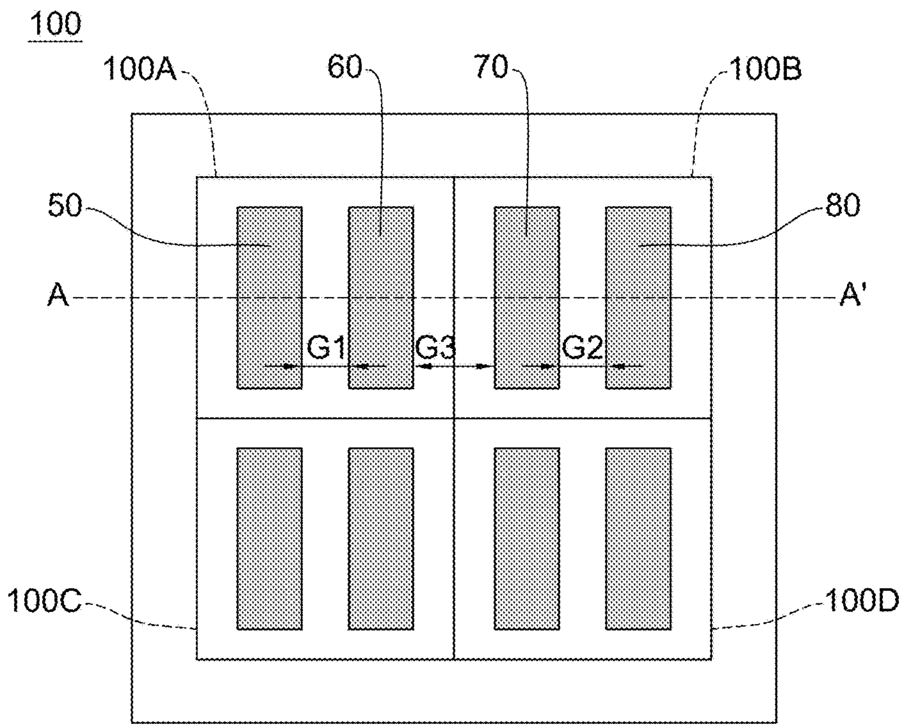
Figure 1C:
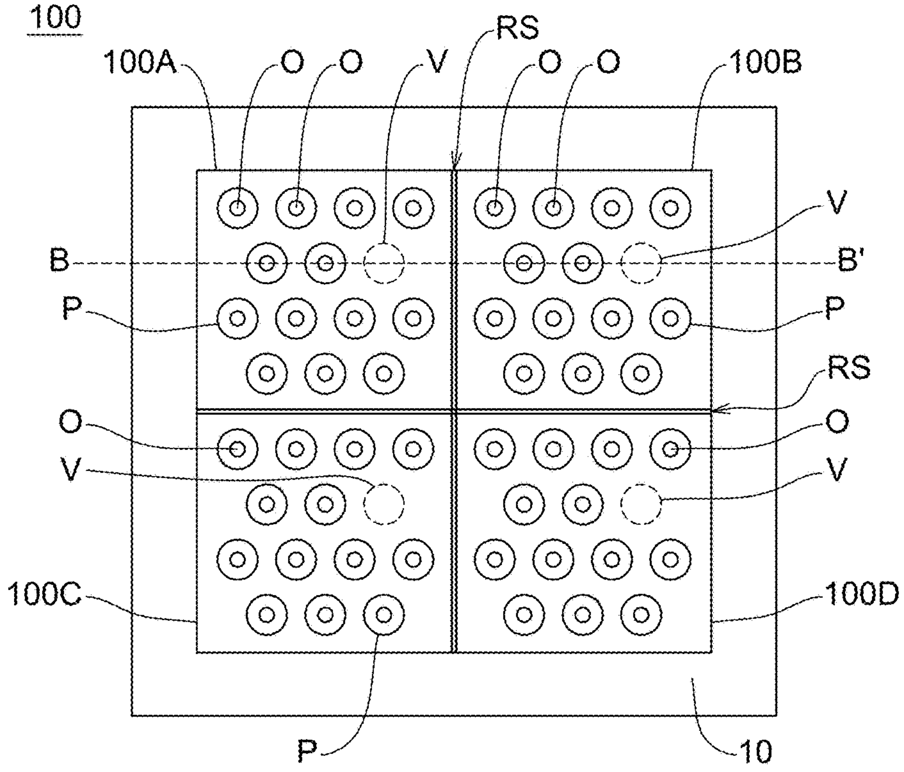

FIG. 1A through FIG. 1C illustrate a schematic cross-sectional view, a schematic bottom perspective view, and a schematic top perspective view of a semiconductor light emitting device according to an exemplary embodiment, respectively, wherein, FIG. 1A illustrates a schematic cross-sectional view along the line A-A' shown in FIG. 1B, and FIG. 1A illustrates a schematic cross-sectional view along the line B-B' shown in FIG. 1C. FIG. 2A through FIG. 2K illustrate schematic cross-sectional views showing manufacturing steps of a semiconductor light emitting device according to the embodiment shown in FIG. 1A through FIG. 1C.

Please refer to FIG. 1A and FIG. 2A through FIG. 2K, which illustrate schematic cross-sectional views of a semiconductor light emitting device according to an exemplary embodiment of the disclosure. In this embodiment, the semiconductor light emitting device 100 comprises a substrate 10 and epitaxial structures 20, 30 on one side of the substrate 10, and a preset distance is between the epitaxial structure 20 and the epitaxial structure 30, so that the epitaxial structure 20 and the epitaxial structure 30 are not in contact with each other, but the disclosure is not limited thereto. The semiconductor light emitting device 100 further comprises a metal connecting layer 40 between the epitaxial structure 20 and the substrate 10 and between the epitaxial structure 30 and the substrate 10. The semiconductor light emitting device 100 further comprises electrode structures 50, 60, 70, 80. The electrode structures 50, 60 are on a surface 20A of the epitaxial structure 20 away from the substrate 10, and the electrode structures 70, 80 are on a surface 30A of the epitaxial structure 30 away from the substrate 10. The electrode structures 50, 60 are respectively connected to semiconductor layers with the same conductive type, and the electrode structures 70, 80 are respectively connected to semiconductor layers with the same conductive type.

The epitaxial structure 20 comprises a plurality of epitaxial columnar structures P1, P2 (in the embodiment shown in FIG. 1A, the number of the epitaxial columnar structures is two, but the disclosure is not limited thereto) and a mesa structure 226. The epitaxial structure 30 comprises a plurality of epitaxial columnar structures P3, P4 (in the embodiment shown in FIG. 1A, the number of the epitaxial columnar structures is two, but the disclosure is not limited thereto) and a mesa structure 326. The epitaxial columnar structures P1, P2 and the epitaxial columnar structures P3, P4 have the same or substantially the same construction. In this embodiment, each of the epitaxial columnar structures P1, P2 comprises a semiconductor structure 222, a current confinement layer 225, and an active structure 224 sequentially on the substrate 10. The epitaxial columnar structures P1, P2 are between the mesa structure 226 and the substrate 10, and the epitaxial columnar structures P1, P2 are in a regular arrangement or a random arrangement. Likewise, each of the epitaxial columnar structures P3, P4 of the epitaxial structure 30 comprises a semiconductor structure 322, a current confinement layer 325, and an active structure 324 sequentially on the substrate 10. The epitaxial columnar structures P3, P4 are on the mesa structure 326, and the epitaxial columnar structures P3, P4 are in a regular arrangement or a random arrangement. Here, the term "regular arrangement" indicates the epitaxial columnar structures have a certain spatial relationship, and the epitaxial columnar structures are arranged in a constant and repeated manner. In some epitaxial columnar structures that are in a regular arrangement, the distance between two adjacent epitaxial columnar structures is substantially the same; in some other epitaxial columnar structures that are in a regular arrangement, the epitaxial columnar structures are arranged along a certain direction. Moreover, in one or some embodiments of the disclosure, the current confinement layer 225 may be arranged between the active structure 224 and the semiconductor structure 222, and the current confinement layer 325 may be arranged between the active structure 324 and the semiconductor structure 322, as the embodiment shown in FIG. 1A. Alternatively, in some embodiments, the current confinement layer 225 may be arranged between the active structure 224 and the mesa structure 226, and the current confinement layer 325 may be arranged between the active structure 324 and the mesa structure 326. In one embodiment, a current confinement layer 225 is between the active structure 224 and the semiconductor structure 222, a current confinement layer 225 is between the active structure 224 and the mesa structure 226, a current confinement layer 325 is between the active structure 324 and the semiconductor structure 322, and a current confinement layer 325 is between the active structure 324 and the mesa structure 326; that is, in this embodiment, a plurality of current confinement layers is in the epitaxial structure 20 and/or the epitaxial structure 30. Each of the mesa structure 226 and the mesa structure 326 has a semiconductor structure, and the semiconductor structure of the mesa structure 226 and the semiconductor structure of the mesa structure 326 substantially have the same construction. In this embodiment, the semiconductor structure 222 and the semiconductor structure 322 have the same conductive type (e.g., P-type), and the semiconductor structure of the mesa structure 226 and the semiconductor structure of the mesa structure 326 have the same conductive type (e.g., N-type); the semiconductor structure 222 and the semiconductor structure of the mesa structure 226 have opposite conductive types, and the semiconductor structure 322 and the semiconductor of the mesa structure 326 have opposite conductive types. In this embodiment, the mesa structure 226 has a width W1, and the mesa structure 326 has a width W2 equal to the width W1. In other embodiments, the width W1 may be greater than or less than the width W2.

Please refer to FIG. 1A. In this embodiment, each of surfaces of the epitaxial columnar structures P1, P2 adjacent to the substrate 10 have a contact structure 220 and each of surfaces of the epitaxial columnar structures P3, P4 adjacent to the substrate 10 have a contact structure 320. The contact structure 220 and the contact structure 320 may be multilayered metal structures; the contact structure 220 or the contact structure 320 served as a multilayered metal structure for contacting a P-type semiconductor structure may be Ti/Pt/Au, the contact structure 220 or the contact structure 320 served as a multilayered metal structure for contacting an N-type semiconductor structure may be Au/GeAu/Au, but the disclosure is not limited thereto. The contact structure 220 is connected to the semiconductor structure 222, and the contact structure 320 is connected to the semiconductor structure 322. From a top view, the contact structure 220 and the contact structure 320 are ring-shaped.

Please refer to FIG. 1A. In this embodiment, the semiconductor light emitting device 100 further comprises a passivation layer 90. The passivation layer 90 covers side portions of the epitaxial columnar structures P1, P2 and portions of upper surfaces of the epitaxial columnar structures P1, P2, and the passivation layer 90 also covers side portions of the epitaxial columnar structures P3, P4 and portions of upper surfaces of the epitaxial columnar structures P3, P4. The passivation layer 90 is light transmittable for the light emitted from each of the epitaxial columnar structures. In detail, in this embodiment, the passivation layer 90 has a plurality of openings 90A so as to expose the contact structure 220 on the epitaxial structure 20 and the contact structure 320 on the epitaxial structure 30. In this embodiment, from a top view, the opening 90A is ring-shaped. The metal connecting layer 40 is covered on the passivation layer 90. In this embodiment, the metal connecting layer 40 is between the epitaxial structure 20 and the epitaxial structure 30, and the metal connecting layer 40 is electrically connected to the contact structure 220 and the contact structure 320 through the openings 90A. The metal connecting layer 40 has a plurality of openings 40A on the epitaxial columnar structures P1, P2, P3, P4, so that the lights emitted by the active structure 224 and the active structure 324 can be emitted toward the substrate 10 through the openings 40A. Please refer to FIG. 1A and FIG. 1C. In this embodiment, the semiconductor light emitting device 100 further comprises a spacing 40B between the epitaxial columnar structure P2 and the epitaxial columnar structure P3 to separate the metal connecting layer 40 on the epitaxial columnar structure P2 and the metal connecting layer 40 on the epitaxial columnar structure P3 from each other. In the top view shown in FIG. 1C, the spacing 40B is illustrated by the schematic cross-sectional structure of the elongated groove structure RS between the connecting layer 40 of the light emitting region 100A and the connecting layer 40 of the light emitting region 100B. In this embodiment, the semiconductor light emitting device 100 further comprises an adhesive layer 901, and the epitaxial structure 20 and the epitaxial structure 30 are connected to the substrate 10 through the adhesive layer 901. The substrate 10 and the adhesive layer 901 are light transmittable for the light emitted from each of the epitaxial columnar structures. The passivation layer 90 further comprises a plurality of openings 90B. From the top view, the opening 90B is for example circular shaped, and the metal connecting layer 40 is filled in the openings 90B so as to be conducted to the structure below the passivation layer 90. Details are illustrated in the following paragraphs.

Please refer to FIG. 1A. In this embodiment, the semiconductor light emitting device 100 has an electrode connecting layer 420 and an electrode connecting layer 520, the electrode connecting layer 420 is on one side of the mesa structure 226 away from the substrate 10, and the electrode connecting layer 520 is on one side of the mesa structure 326 away from the substrate 10. The electrode connecting layer 420 is connected to the semiconductor structure, and the electrode connecting layer 520 is electrically connected to the semiconductor structure. The semiconductor light emitting device 100 comprises a passivation layer 82. The passivation layer 82 covers side portions of the electrode connecting layers 420, 520 and portions of surfaces of the electrode connecting layers 420, 520, and the passivation layer 82 covers side portions of the mesa structures 226, 326 and portions of surfaces of the mesa structures 226, 326. In detail, in this embodiment, the passivation layer 82 has a side portion 821, an upper portion 822, and a plurality of openings 82A. The electrode connecting layer 420 and the electrode connecting layer 520 are exposed through the openings 82A and electrically connected to the electrode structure 50 and the electrode structure 70 through the openings 82A, respectively. The epitaxial structure 20 has a through hole 201 defined through the mesa structure 226, and the epitaxial structure 30 has a through hole 301 defined through the mesa structure 326. The passivation layer 82 is filled in the through holes 201, 301, and the passivation layer 82 further comprises a plurality of openings 82B in the through hole 201 and the through hole 301, respectively. The conductive layer 421 is filled in the opening 82B in the through hole 201, the conductive layer 422 is filled in the opening 82B in the through hole 301, and the conductive layer 421 and the conductive layer 422 are electrically connected to the metal connecting layer 40 through the openings 90B and the openings 82B, respectively. In this embodiment, the electrode structure 60 is connected to the conductive layer 421 and electrically connected to the metal connecting layer 40 on the epitaxial structure 20, and the electrode structure 80 is connected to the conductive layer 422 and electrically connected to the metal connecting layers 40 on the epitaxial structure 30.

Please refer to FIG. 1A. In this embodiment, the semiconductor light emitting device 100 further comprises a passivation layer 84. The passivation layer 84 covers the side portion 821 and portions of the upper surface 822 of the passivation layer 82, and the passivation layer 84 has a plurality of openings 84A and a plurality of openings 84B corresponding to the openings 82A and the openings 82B, respectively. The electrode structure 50 and the electrode structure 70 are electrically connected to the electrode connecting layer 420 and the electrode connecting layer 520 through the openings 44A, and the electrode structure 60 and the electrode structure 80 are electrically connected to the metal connecting layer 40 through the openings 84B.

Please refer to FIG. 1A. In this embodiment, the conductive types of the semiconductor structure 222 and the semiconductor structure 322 are P-type, and the conductive types of the semiconductor structure (the mesa structure 226) and the semiconductor structure (the mesa structure 326) are N-type. Because the electrode structure 60 and the electrode structure 80 are electrically connected to the metal connecting layer 40, and the metal connecting layer 40 is electrically connected to the semiconductor structure 222 and the semiconductor structure 322, the electrode structure 60 and the electrode structure 80 are both P-type electrodes; because the electrode structure 50 and the electrode structure 70 are electrically connected to the semiconductor structure and the semiconductor structure, respectively, the electrode structure 50 and the electrode structure 70 are both N-type electrodes. The conductive type of the epitaxial structure 20 is controlled by the electrode structure 50 and the electrode structure 60, the conductive type of the epitaxial structure 30 is controlled by the electrode structure 70 and the electrode structure 80, and the electrode structures 50, 60, 70, 80 are separated from each other. Therefore, the epitaxial structure 20 and the epitaxial structure 30 can be controlled independently; for example, the epitaxial structure 20 or the epitaxial structure 30 can be lighted up independently, details will be illustrated later.

For the sake of clarity of the drawings, in FIG. 1A, two epitaxial structures (the epitaxial structure 20 and the epitaxial structure 30) are illustrated, and each of the epitaxial structures comprises two epitaxial columnar structures (the epitaxial structure 20 has two epitaxial columnar structures P1, P2, and the epitaxial structure 30 has two epitaxial columnar structures P3, P4) as an illustrative example. However, in actual product applications, the number of the epitaxial structures and the number of the epitaxial columnar structures may be adjusted according to the current and the power requirements of the semiconductor light emitting device (such as a VSCEL); for example, may be but not limited to 10-1000. The current confinement layer 225 comprises a current limiting region 2251 and a current conduction region 2252, the current limiting region 2251 surrounds the current conduction region 2252, and the electrical conductivity of the current conduction region 2252 is greater than the electrical conductivity of the current limiting region 2251, so that the current can be concentrated in the current conduction region 2252. Likewise, the current confinement layer 325 comprises a current limiting region 3251 and a current conduction region 3252, the current limiting region 3251 surrounds the current conduction region 3252, and the electrical conductivity of the current conduction region 3252 is greater than the electrical conductivity of the current limiting region 3251.

Please refer to FIG. 1A. In this embodiment, the semiconductor light emitting device 100 is a flip chip type vertical cavity surface emitting laser (VCSEL). Subsequently, the semiconductor light emitting device 100 can be attached to an external circuit substrate (e.g., a printed circuit board (PCB)) with solders.

Please refer to FIG. 1A. In this embodiment, each of the semiconductor structure 222, the semiconductor structure 322, the mesa structure (the semiconductor structure) 226, and the mesa structure (the semiconductor structure) 326 comprises a plurality of film layers with different reflection indexes, and the film layers are alternately and periodically stacked with each other (for example, AlGaAs layers with high aluminum amount and AlGaAs layers with low aluminum amount are alternately and periodically stacked with each other), so that a distributed Bragg reflector (DBR) structure can be formed. Therefore, the lights emitted by the active structure 224 and the active structure 324 can be reflected in two reflective mirrors so as to form a coherent light. The reflective index of the semiconductor structure 222 is less than the reflective index of the mesa structure (the semiconductor structure) 226, and the reflective index of the semiconductor structure 322 is less than the reflective index of the mesa structure (the semiconductor structure) 326, thereby allowing the coherent light to be emitted toward the substrate 10. In one embodiment, the materials of the semiconductor structure 222, the semiconductor structure 322, the mesa structure (the semiconductor structure) 226, the mesa structure (the semiconductor structure) 326, the active structure 224, and the active structure 324 comprise group III-V material compound semiconductors, such as AlGaInAs series, AlGaInP series, AlInGaN series, AlAsSb series, InGaAsP series, InGaAsN series, AlGaAsP series, or the like, and the materials of the semiconductor structure 222, the semiconductor structure 322, the mesa structure (the semiconductor structure) 226, the mesa structure (the semiconductor structure) 326, the active structure 224, and the active structure 324 may be, such as AlGaInP, GaAs, InGaAs, AlGaAs, GaAsP, GaP, InGaP, AlInP, GaN, InGaN, AlGaN, or the like. In the embodiments of the disclosure, if not specifically illustrated, the abovementioned chemical formulae refer to "compounds conforming to stoichiometry" and "compounds not conforming to stoichiometry", wherein "compounds conforming to stoichiometry" may refer to compounds in which a total stoichiometric quantity of group III elements is identical to a total stoichiometric quantity of group V elements; on the contrary, "compounds not conforming to stoichiometry" may refer to compounds in which the total stoichiometric quantity of group III elements is not identical to the stoichiometric quantity of group V elements. For example, the chemical formula AlGaInAs series refers to a compound having group III element Al and/or Ga and/or In, and group V element As, wherein the total stoichiometric quantity of group III elements (Al and/or Ga and/or In) is identical to the total stoichiometric quantity of group V elements (As). Furthermore, if the aforementioned chemical formulae refer to compounds conforming to stoichiometry, the AlGaInAs series represents $(Al_{y1}Ga_{(1-y1)})_{t-x1}In_{x1}As$, wherein $0 \le x1 \le 1$, and $0 \le y1 \le 1$; the AlGaInP series represents $(Al_{y2}Ga_{(1-y2)})_{1-x2}In_{x2}P$, wherein $0 \le x2 \le 1$, and $0 \le y2 \le 1$; the AlInGaN series represents $(Al_{y3}Ga_{(1-y3)})_{1-x3}In_{x3}N$, wherein $0 \le x3 \le 1$, and $0 \le y3 \le 1$; the AlAsSb series represents $AlAs_{x4}Sb_{(1-x4)}$, wherein $0 \le x4 \le 1$; the InGaAsP series represents $In_{x5}Ga_{1-x5}As_{1-y4}P_{y4}$, wherein $0 \le x5 \le 1$, and $0 \le y4 \le 1$; the InGaAsN series represents $In_{x6}Ga_{1-x6}As_{1-y5}N_{y5}$, wherein $0 \le x6 \le 1$, and $0 \le y5 \le 1$; and the AlGaAsP series represents $Al_{x7}Ga_{1-x7}As_{1-y6}P_{y6}$, wherein $0 \le x7 \le 1$, and $0 \le y6 \le 1$.

Depending on the materials of the active structure 224 and the active structure 324, the active structure 224 and the active structure 324 can emit infrared lights with peak wavelengths between 700 nm and 1700 nm, red lights with peak wavelengths between 610 nm and 700 nm, yellow lights with peak wavelengths between 490 nm and 550 nm, blue or deep blue lights with peak wavelengths between 400 nm and 490 nm, or ultraviolet lights with peak wavelengths between 250 nm and 400 nm. In this embodiment, the peak wavelengths of the active structure 224 and the active structure 324 are infrared lights between 750 nm and 1200 nm.

The materials of the current confinement layer 225 and the current confinement layer 325 may be group III-V compound semiconductor materials. In this embodiment, the materials of the current confinement layer 225 and the current confinement layer 325 are AlGaAs, and the materials of the active structure 224, the active structure 324, the semiconductor structure 222, the semiconductor structure 322, the mesa structure 226, and the mesa structure 326 all comprise aluminum. The aluminum amounts of the current confinement layer 225 and the current confinement layer 325 are greater than the aluminum amounts of the active structure 224, the active structure 324, the semiconductor structure 222, the semiconductor structure 322, the mesa structure 226, and the mesa structure 326. For example, the aluminum amounts of the current confinement layer 225 and the current confinement layer 325 are greater than 97%. In this embodiment, the oxygen amounts of the current limiting region 2251 and the current limiting region 3251 are respectively greater than the oxygen amounts of the current conduction region 2252 and the current conduction region 3252, so that the electrical conductivity of the current limiting region 2251 is less than the electrical conductivity of the current conduction region 2252, and the electrical conductivity of the current limiting region 3251 is less than the electrical conductivity of the current conduction region 3252. The adhesive layer 901 is made of a material having high transmittance for the lights emitted by the active structure 224 and the active structure 324; for example, the transmittance of the adhesive layer 901 is greater than 80%. The material of the adhesive layer 901 is an insulation material, for example, B-staged bisbenzocyclobutene (BCB), epoxy resin, polyimide, SOG (spin-on glass), silicone, or perfluorocyclobutance (PFCB).

The materials of the passivation layer 90, the passivation layer 82, and the passivation layer 84 comprise a non-conductive material. The non-conductive material comprises an organic material or an inorganic material. The organic material may comprise epoxy resin photoresist (e.g., SU8), B-staged bisbenzocyclobutene (BCB), perfluorocyclobutance (PFCB), epoxy resin, acrylic resin, cyclic olefin polymer (COC), poly(methyl methacrylate) (PMMA), poly(ethylene terephthalate) (PET), polycarbonate (PC), polyetherimide, or fluorocarbon polymer. The inorganic material may comprise silicone, glass, $Al_2O_3$, $SiN_x$, $SiO_x$, $TiO_x$, or $MgF_x$. In one embodiment, the passivation layer 90, the passivation layer 82 and/or the passivation layer 84 comprise one or several layers (e.g., a distributed Bragg reflector (DBR) structure formed by alternately stacking two sublayers (for example, the $SiO_x$ sublayer and the $TiO_x$ sublayer) with each other).

The materials of the metal connecting layer 40, the electrode connecting layer 420, the electrode connecting layer 520, the conductive layer 421, and the conductive layer 422 may comprise a metal which may be, for example, Al, Ag, Cr, Pt, Ni, Ge, Be, Au, Ti, W, or Zn. The materials of the electrode structure 50, the electrode structure 60, the electrode structure 70, and the electrode structure 80 may be metal materials, for example, Au, Sn, Ti, or the alloy thereof. The electrode structure 50, the electrode structure 60, the electrode structure 70, and the electrode structure 80 may have the same material(s) and the same structure. Moreover, the electrode structure 50, the electrode structure 60, the electrode structure 70, and the electrode structure 80 may be multilayered structures with different compositions, respectively. The electrode structure 50, the electrode structure 60, the electrode structure 70, and the electrode structure 80 may be multilayered structures.

Please refer to FIG. 1A. In this embodiment, the electrode structure 50 may be a multilayered structure, from a direction away from the substrate 10, the electrode structure 50 for example comprises a Ti layer and an Au layer, or a Ti layer and a Pt layer and an Au layer, or a TiW layer and an Au layer. The electrode structure 50 comprises a middle layer 502 and an attaching layer 504; the electrode structure 60 comprises a middle layer 602 and an attaching layer 604; the electrode structure 70 comprises a middle layer 702 and an attaching layer 704; the electrode structure 80 comprises a middle layer 802 and an attaching layer 804. The electrode structure 50, the electrode structure 60, the electrode structure 70, and the electrode structure 80 may respectively comprise at least one element, while the electrode connecting layer 420, the electrode connecting layer 520, the conductive layer 421, and the conductive layer 422 do not contain the element. Therefore, during the die-bonding or large-current operation, the situation that external solders (which contain Sn) damage the electrode connecting layer 420, the electrode connecting layer 520, the conductive layer 421, and the conductive layer 422 which cause electrical failure can be prevented. Hence, the reliability of the semiconductor light emitting device 100 according to one or some embodiments can be further improved. The element can be provided to prevent the solders from diffusing into the electrode connecting layer 420, the electrode connecting layer 520, the conductive layer 421, and the conductive layer 422, and the element may be Ni and/or Pt. In detail, in this embodiment, the electrode structure 50, the electrode structure 60, the electrode structure 70, and the electrode structure 80 may respectively comprise multiple layers; for example, the materials of the middle layer 502, the middle layer 602, the middle layer 702, and the middle layer 802 are different from the materials of the electrode connecting layer 420, the electrode connecting layer 520, the conductive layer 421, and the conductive layer 422 so as to prevent the solders (e.g., Sn or AuSn alloy) from diffusing to the electrode connecting layer 420, the electrode connecting layer 520, the conductive layer 421, and the conductive layer 422. Therefore, in one embodiment, the materials of the middle layer 502, the middle layer 602, the middle layer 702, and the middle layer 802 preferably contain metal elements except Au, Sn, and Cu, for example Ni and/or Pt. The attaching layer 504, the attaching layer 604, the attaching layer 704, and the attaching layer 804 comprise a metal material with high ductility; preferably in one embodiment comprise Au. In other words, in one embodiment, as shown in FIG. 1A, from a direction away from the substrate 10, each of the electrode structure 50, the electrode structure 60, the electrode structure 70, and the electrode structure 80 may sequentially comprise a Ni layer, a Pt layer, and an Au layer. In another embodiment, the electrode structure 50 may only have the attaching layer 504, the electrode structure 60 may only have the attaching layer 604, the electrode structure 70 may only have the attaching layer 704, and the electrode structure 80 may only have the attaching layer 804.

Please refer to FIG. 1B and FIG. 1C. FIG. 1B illustrates a schematic bottom perspective view of the semiconductor light emitting device 100 as shown in FIG. 1A; that is, FIG. 1B illustrates a schematic view of the semiconductor light emitting device 100 seen from the electrode structure 50, the electrode structure 60, the electrode structure 70, and the electrode structure 80 (as the direction shown in FIG. 1A indicated by the arrow 1B), and FIG. 1A illustrates a cross-sectional view along the line A-A' shown in FIG. 1B. FIG. 1C illustrates a schematic top perspective view of the semiconductor light emitting device 100 as shown in FIG. 1A; that is, FIG. 1C illustrates a schematic view of the semiconductor light emitting device 100 seen from the substrate 10 (as the direction shown in FIG. 1A indicated by the arrow 1C), and FIG. 1A illustrates a cross-sectional view along the line B-B' shown in FIG. 1C.

As shown in FIG. 1B, the semiconductor light emitting device has the electrode structure 50, the electrode structure 60, the electrode structure 70, and the electrode structure 80. In this embodiment, the electrode structure 50, the electrode structure 60, the electrode structure 70, and the electrode structure 80 substantially have the same surface area. A gap G1 is between the electrode structure 50 and the electrode structure 60, and a gap G2 is between the electrode structure 70 and the electrode structure 80 which is substantially equal to the gap G1. Moreover, in this embodiment, a gap G3 is between the electrode structure 60 and the electrode structure 70 which is greater than the gap G1 and the gap G2. The extension direction of the gap G1, the gap G2, and the gap G3 is parallel to the side length direction of the semiconductor light emitting device 100 (for example, parallel to the direction along the line A-A' shown in FIG. 1B).

Please refer to FIG. 1C, which illustrates a top perspective view of the semiconductor light emitting device 100, and FIG. 1C is provided to illustrate the configuration of the light emitting regions and the light emitting apertures of the semiconductor light emitting device 100 shown in FIG. 1A. In this embodiment, the semiconductor light emitting device 100 comprises four light emitting regions 100A, 100B, 100C, 100D, and the back surface of each of the light emitting regions has a pair of electrode structures for achieving the addressable-control purpose. As shown in FIG. 1B and FIG. 1C, the electrode structure 50 and the electrode structure 60 are correspondingly on the back surface of the light emitting region 100A, and the electrode structure 70 and the electrode structure 80 are correspondingly on the back surface of the light emitting region 100B. Each of the light emitting regions 100A, 100B, 100C, 100D comprises a plurality of light emitting apertures O, and the position of each of the light emitting apertures O corresponds to a central area of a corresponding one of the epitaxial columnar structures P (the epitaxial columnar structures Pb, P2 and the epitaxial columnar structures P3, P4 shown in FIG. 1A).

As shown in FIG. 1C, in this embodiment, the light emitting apertures O are arranged regularly. In the manufacturing process of the semiconductor light emitting device, portions of the semiconductor epitaxial layer on which the electrode structures 60 and the electrode structure 80 are to be formed are removed by etching so as to be served as the reserved positions V of the electrode structure 60 and the electrode structure 80 of the semiconductor light emitting device according to one or some embodiments of the disclosure. The manufacturing process of the semiconductor light emitting device according to one or some embodiments of the disclosure will be illustrated later.

Please refer to FIG. 1B and FIG. 1C. In this embodiment, the semiconductor light emitting device 100 is divided into a plurality of light emitting regions 100A, 100B, 100C, 100D, and each of light emitting regions 100A, 100B, 100C, 100D has an independent electrode pair for performing addressable-control on the light emitting region. However, the number of the light emitting regions and the electrode structures are not limited thereto, and the light emitting position (which light emitting region emits light) and the luminance (the number of the light emitting regions being emitting lights) of the semiconductor light emitting device 100 can be controlled according to actual application requirement (for example, detection applications, illumination applications, or the like). Specifically, take the light emitting regions 100A, 100B as an illustrative example, in this embodiment, the light emitting region 100A corresponds the electrode structure 50 and the electrode structure 60, the light emitting region 100B corresponds to the electrode structure 70 and the electrode structure 80, and the electrode structure 50, the electrode structure 60, the electrode structure 70, and the electrode structure 80 are electrically connected to a current control device (not shown). The current control device can determine whether to apply currents to certain electrode structure(s) (50, 60, 70, and/or 80) according to the ambient light intensity. Therefore, different numbers of the light emitting regions can be lighted up so as to achieve the addressable-control function.

FIG. 2A through FIG. 2L illustrate schematic cross-sectional views showing manufacturing steps of a semiconductor light emitting device 100 according to an exemplary embodiment.

Figure 2A:
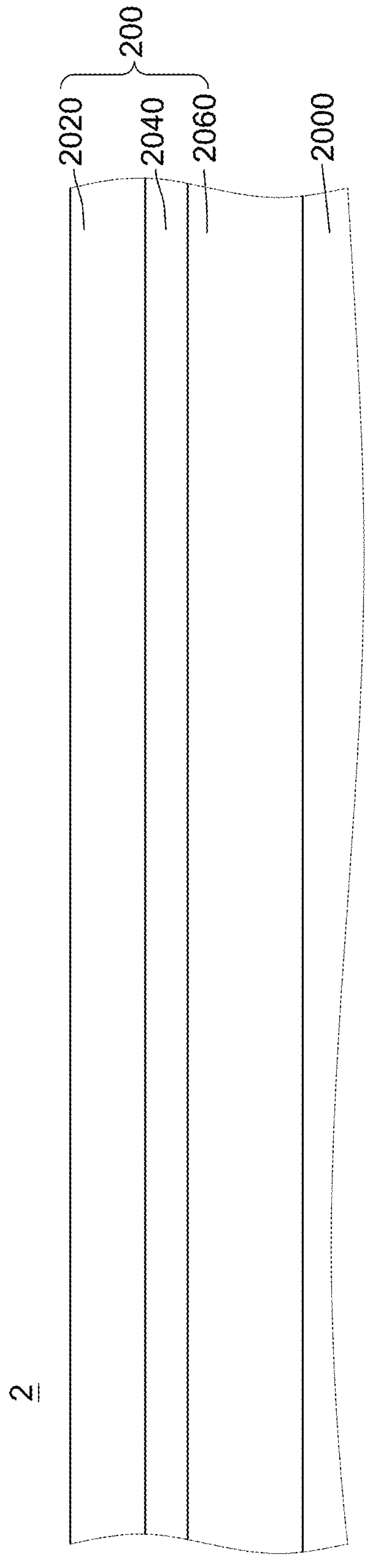
FIG. 2A through FIG. 2K illustrate schematic cross-sectional views showing manufacturing steps of a semiconductor light emitting device according to an exemplary embodiment.

As shown in FIG. 2A, a chip 2 is provided. The chip 2 comprises a semiconductor epitaxial layer 200 formed on the growth substrate 2000. The semiconductor epitaxial layer 200 comprises a semiconductor layer 2060, an active layer 2040, and a semiconductor layer 2020 sequentially on the growth substrate 2000, wherein the semiconductor layer 2060, the active layer 2040, and/or the semiconductor layer 2020 may be a multilayered structure. The semiconductor epitaxial layer 200 may be formed on the growth substrate 2000 by an epitaxy process; the epitaxy process may be but not limited to metal-organic chemical vapor deposition (MOCVD), hydride vapor phase epitaxy (HYPE), molecular beam epitaxy (MBE), liquid phase epitaxy (LPE), or the like. The growth substrate 2000 comprises group III-V materials, and the lattice constant of the material of the growth substrate 2000 corresponds to the lattice constant of the material of the semiconductor epitaxial layer 200. In this embodiment, the material of the growth substrate 2000 is GaAs. In other embodiments, the material of the growth substrate 2000 may be InP, sapphire, GaN, SiC, or the like.

Figure 2B:
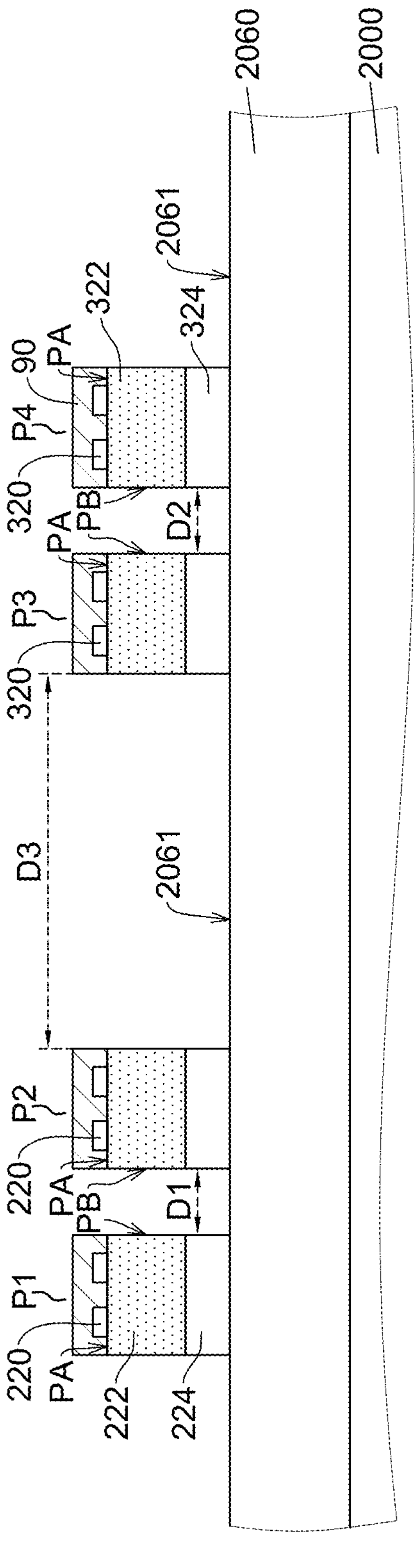

Next, as shown in FIG. 2B, after the contact structures 220, 320 are formed on the upper surface of the semiconductor layer 2020, the passivation layer 90 is formed to cover the semiconductor layer 2020 and the contact structures 220, 320, wherein the passivation layer 90 may be single-layered or multi-layered insulating structure. Then, the etching process is applied to the chip 2 to remove portions of the semiconductor layer 2020 and portions of the active layer 2040 so as to form the epitaxial columnar structures P1, P2 and the epitaxial columnar structures P3, P4 and to expose the end surface 2061 of the semiconductor layer 2060. Each of the epitaxial columnar structures P1, P2 and the epitaxial columnar structures P3, P4 has an upper surface PA and a side surface PB. Wherein, the upper surfaces PA of the epitaxial columnar structures P1, P2 have a contact structure 220, and the epitaxial columnar structures P3, P4 have a contact structure 320. In this embodiment, a distance D1 is between the epitaxial columnar structure P1 and the epitaxial columnar structure P2, and a distance D2 is between the epitaxial columnar structure P3 and the epitaxial columnar structure P4. A distance D3 is between the epitaxial columnar structure P2 and the epitaxial columnar structure P3 which is greater than the distance D1 and greater than the distance D2. Therefore, the greater distance D3 can be provided for connecting the electrode structure 60 to the electrode structure 80 in the subsequent process (as the reserved positions V shown in FIG. 1C). In this embodiment, the distance D1 is substantially equal to the distance D2, and the distance D3 is 1.5 to 5 times of the distance D1 and/or the distance D2.

Figure 2C:
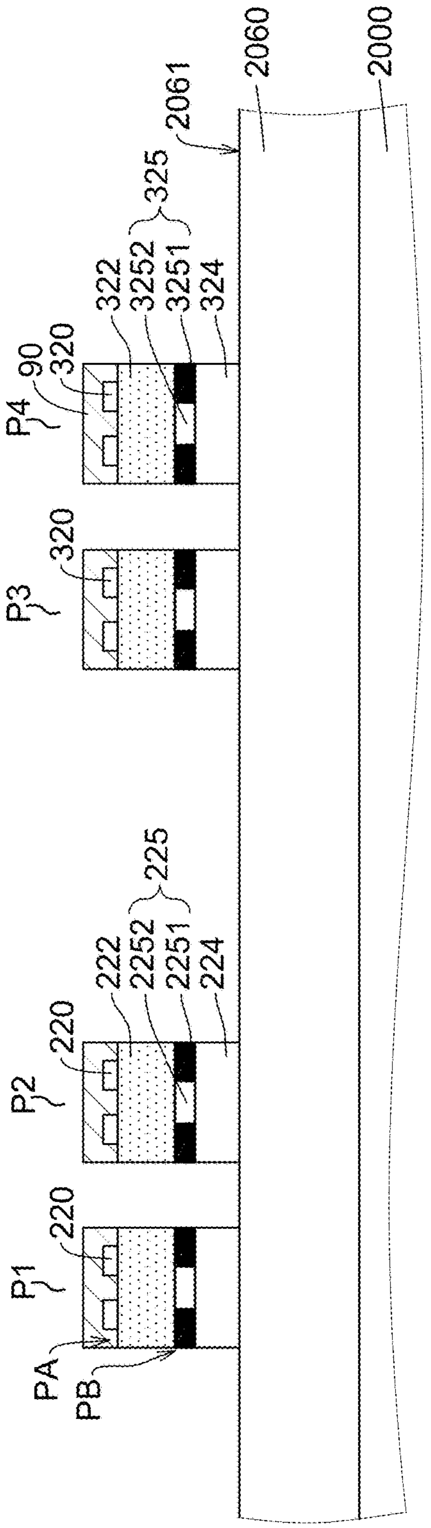

Next, as shown in FIG. 2C, the current confinement layers 225, 325 are formed inside each of the epitaxial columnar structures P. In this embodiment, the formation of the current confinement layers 225, 325 may be achieved by allowing the materials of the regions where the current restriction regions 2251, 3251 are to be formed to be oxidized through an oxidation process. For example, the aluminum amount of at least one of the layers of the semiconductor structure 222 is greater than 97% (the layer of the semiconductor structure 222 is defined as the layer which the current confinement layer 225 is to be formed) and is greater than the aluminum amount of the active structure 224 and the aluminum amount of the semiconductor structure 222. Therefore, during the oxidation process, the oxidation rate of the high aluminum amount regions in the epitaxial columnar structures P1, P2 (defined as the regions which the current confinement layer 225 is to be formed), along a direction from the side surface PB toward the interior of the epitaxial columnar structures P1, P2 is greater than the aluminum amounts of rest regions of the epitaxial columnar structures P1, P2. Consequently, the current limiting region 2251 having low electrical conductivity can be formed. Alternatively, in some embodiments, the ion implantation process may be applied to form the current limiting regions 2251, 3251 having low electrical conductivity in the epitaxial columnar structures P1, P2, P3, P4, and photomasks are utilized to define the current conduction regions 2252, 3252. The ion implantation process may be achieved by implanting hydrogen ion ($H^+$), helium ion ($He^+$), or argon ion ($Ar^+$) in the regions which the current limiting regions are to be formed. The ion concentration of the current limiting region is much greater than the ion concentration of the current conduction region, thus allowing the current limiting region to have a lower electrical conductivity. In another embodiment, the oxidation process and the ion implantation process may be applied to the epitaxial columnar structures P1, P2, P3, P4 at the same time; for example, the current limiting regions of some of the epitaxial columnar structures are formed by the ion implantation process, while the current limiting regions of the other some of the epitaxial columnar structures are formed by the oxidation process. Alternatively, in some embodiments, some of the epitaxial columnar structures not only have a current limiting region which is formed by the ion implantation process but also have a current limiting region which is formed by the oxidation process (not shown).

Figure 2D:
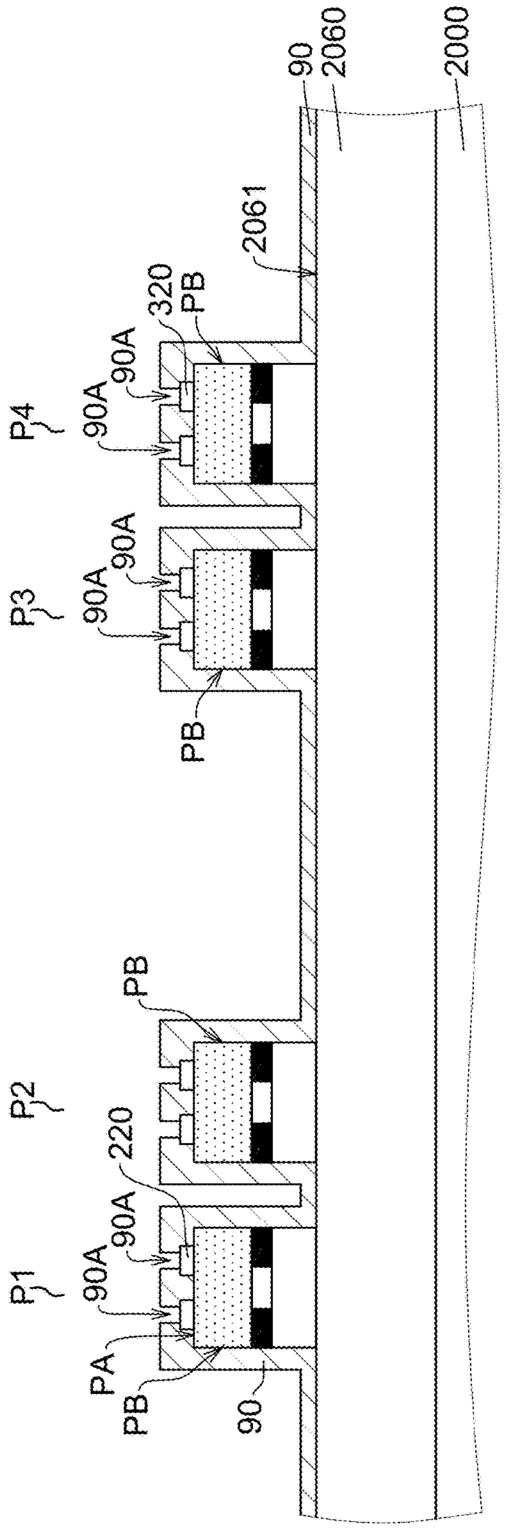

As shown in FIG. 2D, then, the passivation layer 90 is formed to cover the side surfaces PB and the upper surfaces PA of the epitaxial columnar structures P1, P2, P3, P4 and the end surface 2061 of the semiconductor layer 2060. The passivation layer 90 covers the side surfaces PB of the epitaxial columnar structures P1, P2, P3, P4 and the end surface of the semiconductor layer 2060, and the passivation layer 90 covers the upper surfaces PA of the epitaxial columnar structures P1, P2, P3, P4 and the contact structures 220, 320. Furthermore, the openings 90A are formed in the passivation layer 90 to expose portions of the contact structure 220 and portions of the contact structure 320. From a top view, the opening 90A may be ring-shaped, circular-shaped, elliptical-shaped, polygonal-shaped, square-shaped, irregular-shaped, or the like. In this embodiment, the opening 90A is ring-shaped, but the disclosure is not limited thereto.

Figure 2E:
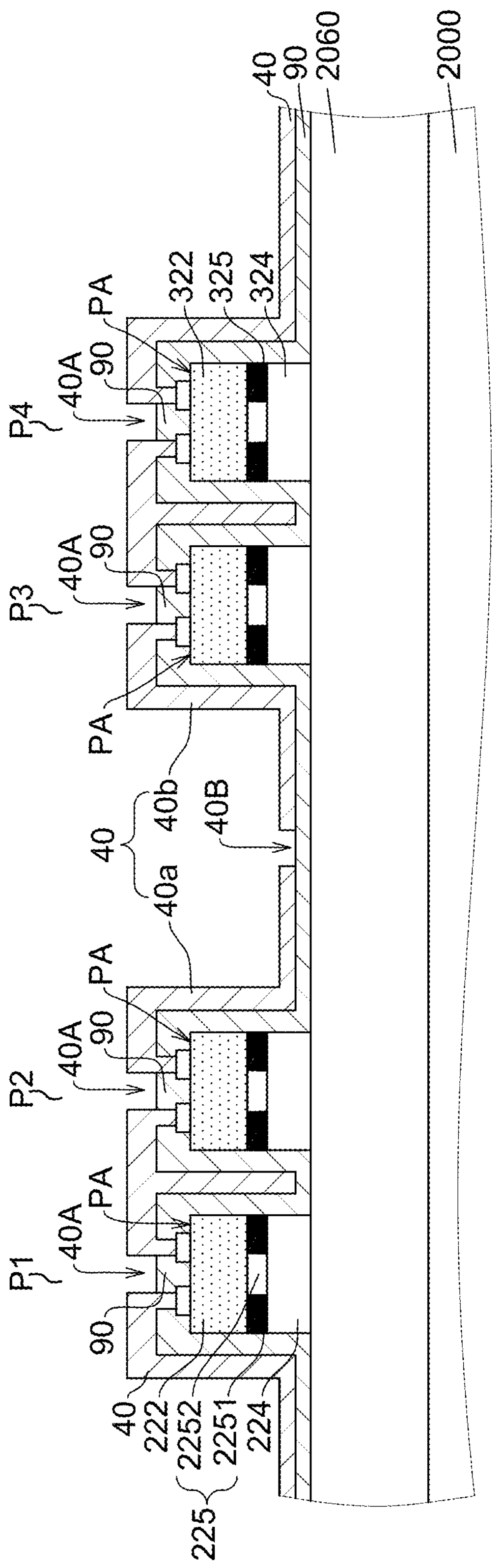

Next, as shown in FIG. 2E, the metal connecting layer 40 is formed on the passivation layer 90 and in the openings 90A, and the metal connecting layer 40 is connected to the contact structure 220 and the contact structure 320, so that the metal connecting layer 40 is further electrically connected to the semiconductor structure 222 and the semiconductor structure 322. The openings 40A of the metal connecting layer 40 are formed on the upper surfaces PA of the epitaxial columnar structures P1, P2, P3, P4, so that the light generated by the active structures 224, 324 can be emitted out of the semiconductor light emitting device 100 through the openings 40A. A spacing 40B is also formed in the metal connecting layer 40 and is on the end surface 2061 of the semiconductor layer 2060 so as to divide the metal connecting layer 40 into a portion 40*a* and a portion 40*b* that are separated from each other; in other words, in this embodiment, a groove structure is formed between the portion 40*a* and the portion 40*b*, and portions of the surface of the passivation layer 90 are exposed. From the top view, the shape of the opening 40A may be circular-shaped, elliptical-shaped, polygonal-shaped, square-shaped, irregular-shaped, or the like. In this embodiment, from the top view, the opening 40 is circular-shaped, and the spacing 40B is formed as an elongated groove structure (e.g., the elongated groove structure RS shown in FIG. 1C), but the disclosure is not limited thereto. In this embodiment, the openings 40A are substantially on central areas of the upper surfaces PA of the epitaxial columnar structures P1, P2, P3, P4, but the disclosure is not limited thereto.

Figure 2F:
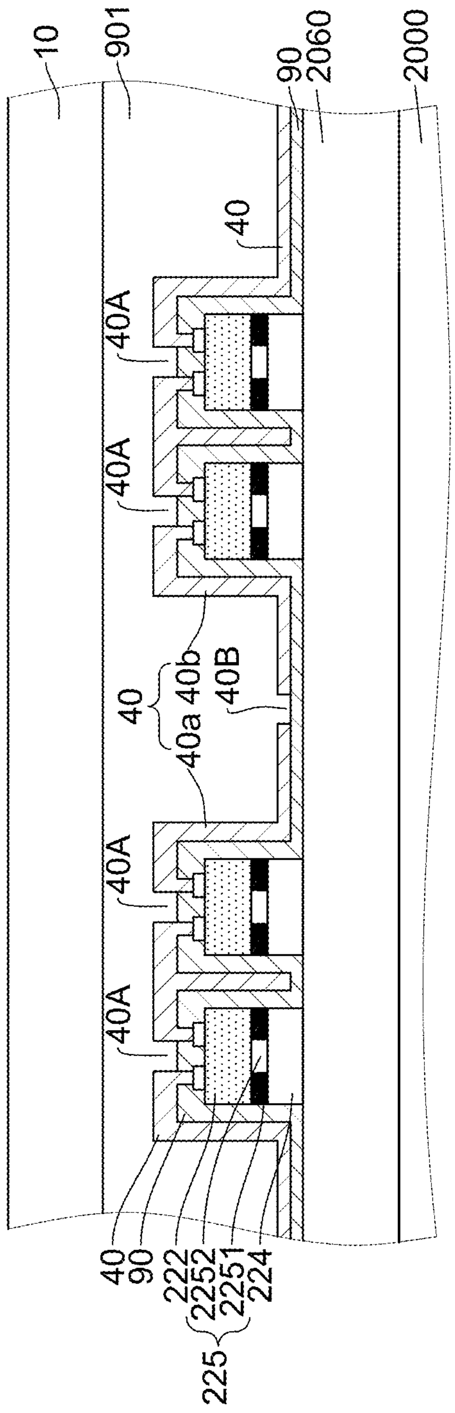
Figure 2G:
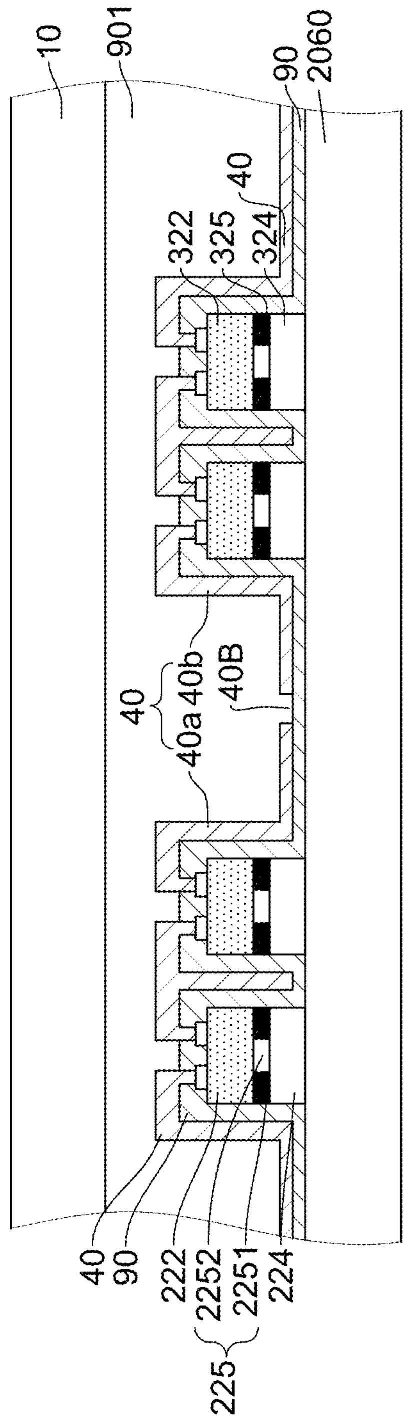

As shown in FIG. 2F, the epitaxial columnar structures P1, P2, P3, P4 and the semiconductor layer 2060 are attached to the substrate 10 through the adhesive layer 901. In this embodiment, the substrate 10 is made of a material having a high transmittance for the lights emitted by the active structure 224 and the active structure 324, for example, a sapphire having a transmittance greater than 80%. After the epitaxial columnar structures P1, P2, P3, P4 and the semiconductor layer 2060 are attached to the substrate 10, the growth substrate 2000 on the semiconductor layer 2060 is removed, so that the structure shown in FIG. 2G can be formed.

Figure 2H:
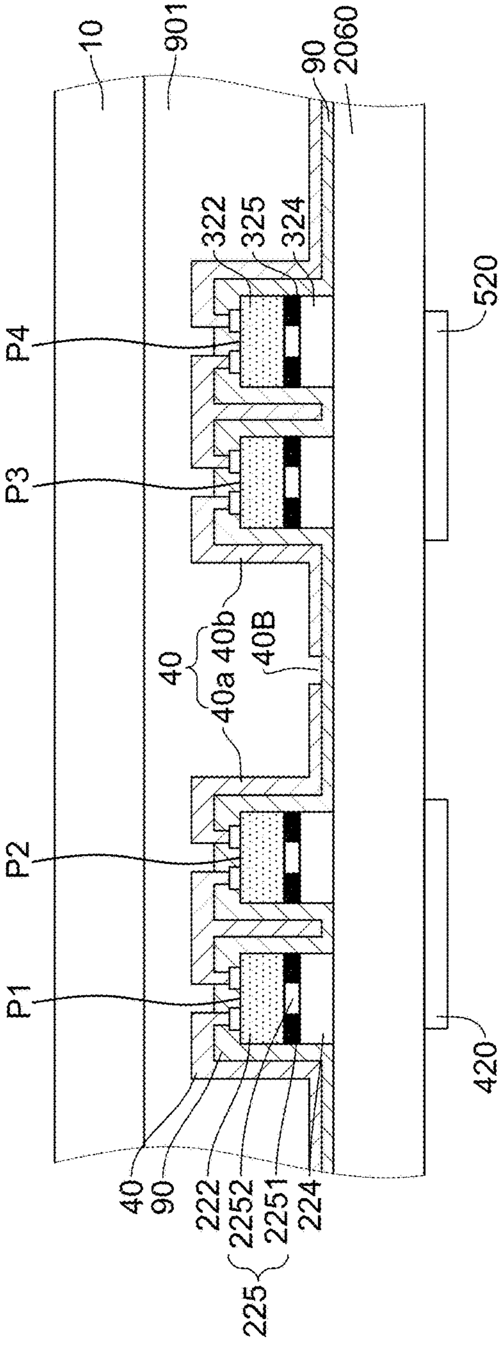

Next, the electrode connecting layer 420 and the electrode connecting layer 520 are formed on the semiconductor layer 2060 which is exposed after the growth substrate 2000 is removed, wherein the electrode connecting layer 420 corresponds to the epitaxial columnar structures P1, P2 and the electrode connecting layer 520 corresponds to the epitaxial columnar structures P3, P4, and the electrode connecting layer 520 and the electrode connecting layer 420 are separated from each other, so that the structure shown in FIG. 2H can be formed.

Figure 2I:
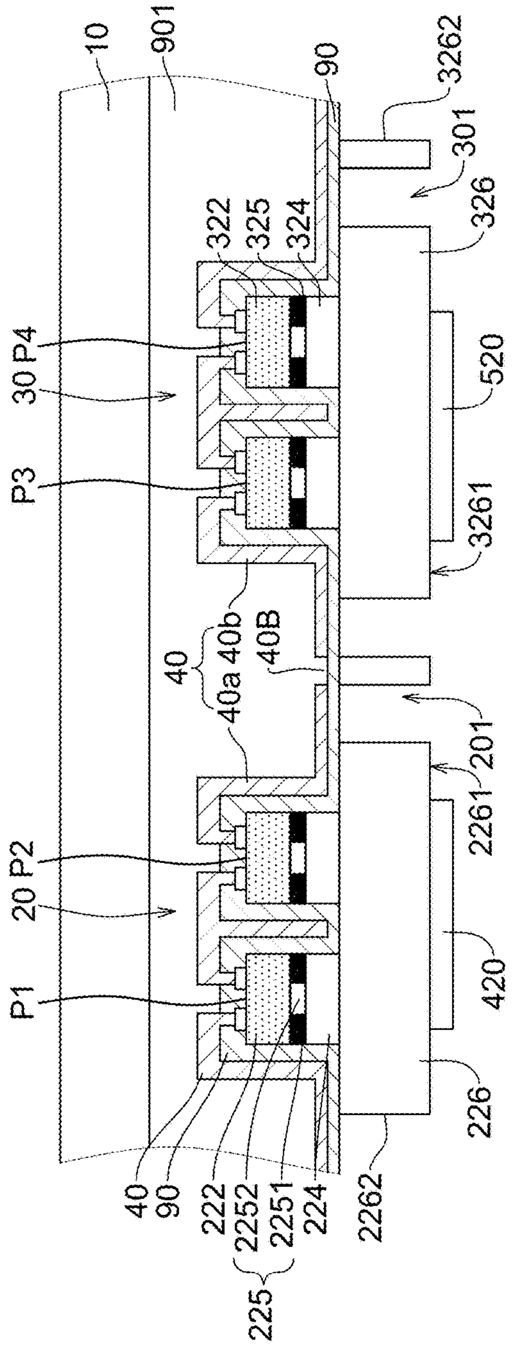

As shown in FIG. 2I, next, the etching process is applied to remove portions of the semiconductor layer 2060 to form the mesa structure 226 and the mesa structure 326, thereby further forming the mesa structure 226 and the epitaxial columnar structures P1, P2 on the mesa structure 226 and forming the mesa structure 326 and the epitaxial columnar structures P3, P4 on the mesa structure 326. Furthermore, a through hole 201 is formed in the mesa structure 226, and a through hole 301 is formed in the mesa structure 326. The shape of the through holes 201, 301 is not limited, that is, the through hole may have an arc profile, a circular or elliptical profile, a polygonal profile, or a profile with any shape. The mesa structure 226 has an upper surface 2261 and a side surface 2262, and the mesa structure 326 has an upper surface 3261 and a side surface 3262. Portions of the passivation layer 90 are exposed through the through hole 201 and the through hole 301. In this embodiment, the electrode connecting layer 420 just covers portions of the mesa structure 226, and the electrode connecting layer 520 just covers portions of the mesa structure 326.

Figure 2J:
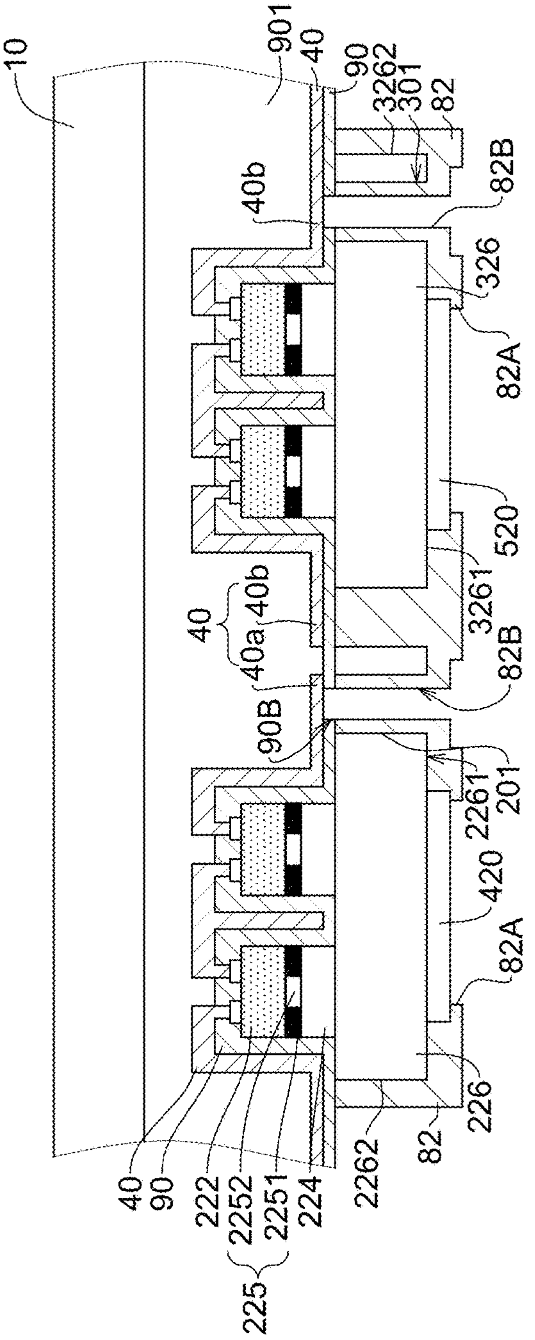

Next, please refer to FIG. 2I and FIG. 2J. The passivation layer 82 is formed to cover portions of the upper surfaces 2261, 3261 and the side surfaces 2262, 3262 of the mesa structures 226, 326, and the passivation layer 82 is also filled into the through hole 201 and the through hole 301 and connected to the passivation layer 90. Next, the etching process is applied to remove portions of the passivation layer 82 and the passivation layer 90 to form the openings 82B, 90B, wherein the openings 82B are in communication with the openings 90B, and the openings 82B respectively correspond to the through holes 201, 301 so as to expose portions of the metal connecting layer 40. The portion 40*a* of the metal connecting layer 40 is exposed through the opening 82B on the epitaxial structure 20, the portion 40*b* of the metal connecting layer 40 is exposed through the opening 82B on the epitaxial structure 30, and some of the openings 82B, 90B are formed between the epitaxial structure 20 and the epitaxial structure 30. Please further refer to FIG. 2J. The openings 82A are also formed in the passivation layer 82 to expose the electrode connecting layer 420 and the electrode connecting layer 520.

Figure 2K:
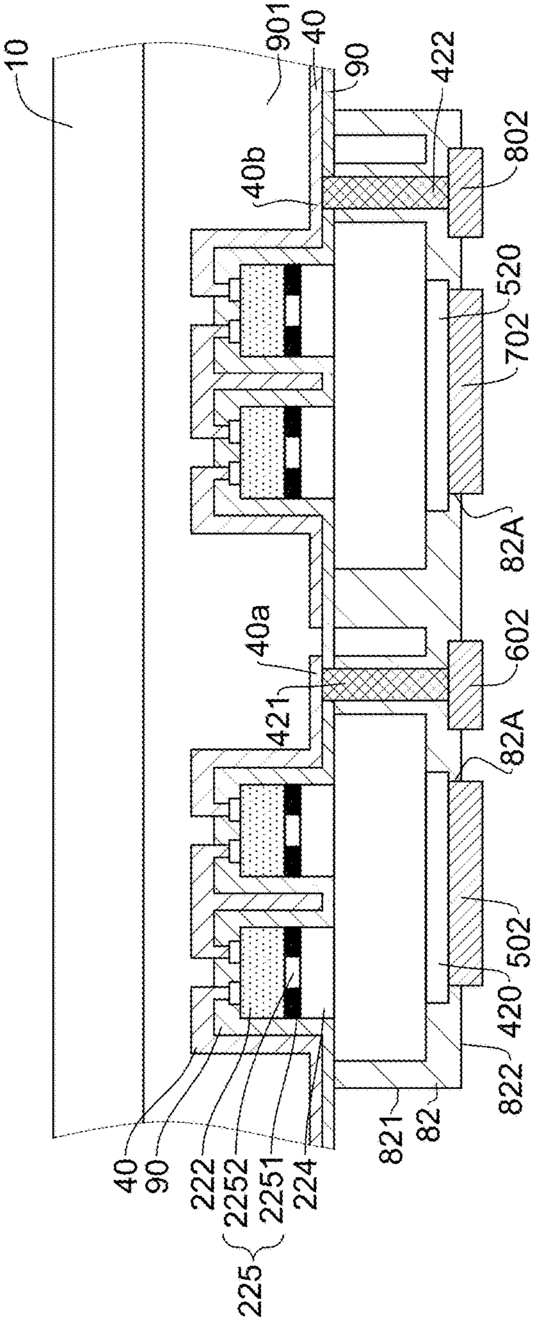

Next, as shown in FIG. 2K, conductive materials are filled into the openings 90B and the openings 82B corresponding to the through hole 201 and the through hole 301 respectively so as to form the conductive layer 421 and the conductive 422, so that the conductive layer 421 is directly in contact with and electrically connected to the portion 40*a* of the metal connecting layer 40, and the conductive layer 422 is directly in contact with and electrically connected to the portion 40*b* of the metal connecting layer 40. Next, the middle layer 502 is formed on the electrode connecting layer 420, the middle layer 602 is formed on the conductive layer 421, the middle layer 702 is formed on the electrode connecting layer 520, and the middle layer 802 is formed on the conductive layer 422. Specifically, in this embodiment, the middle layer 502 and the middle layer 702 are directly in contact with and electrically connected to the electrode connecting layer 420 and the electrode connecting layer 520 through the openings 82A, respectively, and the middle layer 602 and the middle layer 802 are electrically connected to the conductive layer 421 and the conductive layer 422, respectively. In another embodiment, the conductive layer 421 and the middle layer 602 are formed together in the same step, and the conductive layer 422 and the middle layer

802 are formed together in the same step; that is, in this embodiment, the conductive layer 421, the conductive layer 422, the middle layer 602, and the middle layer 802 have the same material.

Next, please refer to FIG. 1A again. The passivation layer 84 is formed to cover the side portion 821 and portions of the upper surface 822 of the passivation layer 82. The openings 84A are formed in the passivation layer 84 to expose portions of the middle layer 502 and portions of the middle layer 602, and the openings 84B are formed in the passivation layer 84 to expose the middle layer 702 and the middle layer 802.

Last, please refer to FIG. 1A again. The attaching layer 504 is formed on the middle layer 502, the attaching layer 604 is formed on the middle layer 602, the attaching layer 704 is formed on the middle layer 702, and the attaching layer 804 is formed on the middle layer 802. The attaching layer 504 is connected to the middle layer 502 through the opening 84A to form the electrode structure 50, the attaching layer 604 is connected to the middle layer 602 through the opening 84B to form the electrode structure 60, the attaching layer 704 is connected to the middle layer 702 through the opening 84A to form the electrode structure 70, and the attaching layer 804 is connected to middle layer 802 through the opening 84B to form the electrode structure 80. Accordingly, the semiconductor light emitting device 100 shown in FIG. 1A is formed. The surfaces of some of the attaching layers 504, 604, 704, 804 substantially have the same height, so that the solders can be applied to connect the semiconductor light emitting device 100 with external circuits conveniently in the subsequent process. In another embodiment, the step of forming the middle layers 502, 602, 702, 802 can be omitted in the manufacturing process of the semiconductor light emitting device, so that the attaching layer 504 is directly in contact with the electrode connecting layer 420, the attaching layer 604 is directly in contact with the conductive layer 421, the attaching layer 704 is directly in contact with the electrode connecting layer 421, and the attaching layer 804 is directly in contact with the conductive layer 422.

Figure 3A:
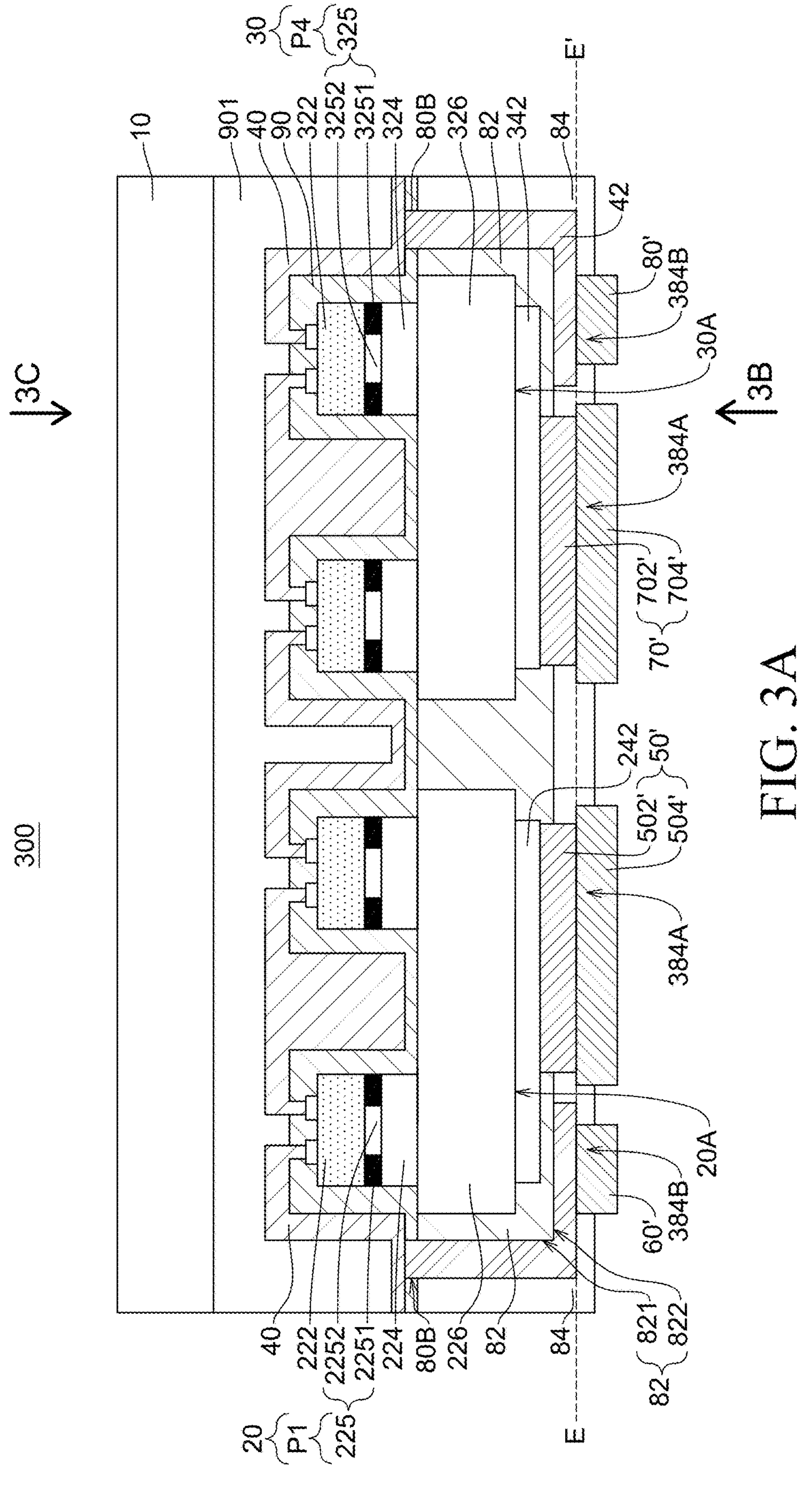
FIG. 3A through FIG. 3C illustrate a schematic cross-sectional view, a schematic bottom perspective view, and a schematic top perspective view of a semiconductor light emitting device according to an exemplary embodiment, respectively.
Figure 3B:
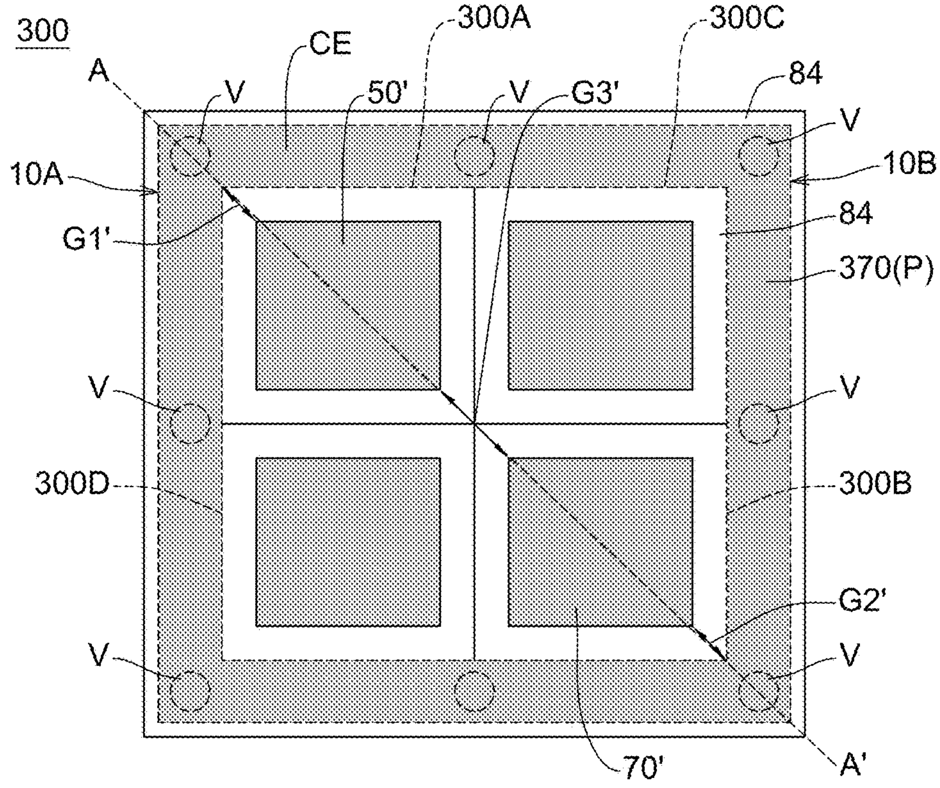
Figure 3C:
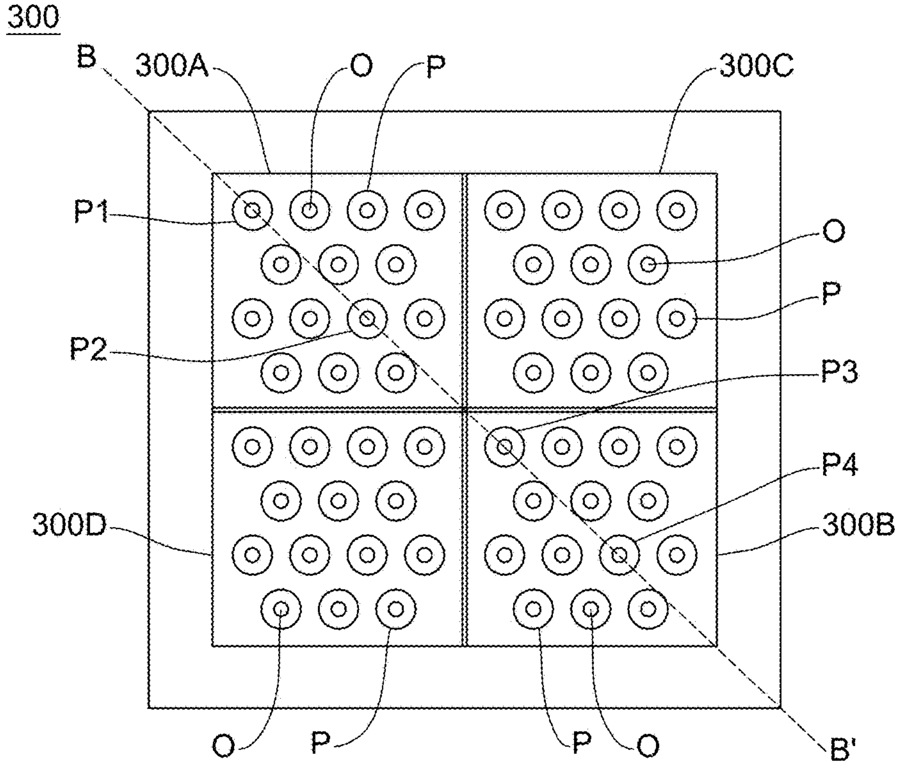

Please refer to FIG. 3A through FIG. 3C, which respectively illustrate a schematic cross-sectional view, a schematic bottom perspective view, and a schematic top perspective view of a semiconductor light emitting device 300 according to another exemplary embodiment, wherein FIG. 3A illustrates a cross-sectional view along the line B-B' shown in FIG. 3C. The semiconductor light emitting device 300 of this embodiment has a similar construction with the semiconductor light emitting device 100 shown in FIG. 1A. In this embodiment, the semiconductor light emitting device 300 also comprises a substrate 10 and epitaxial structures 20, 30 on one side of the substrate 10, and a preset distance is between the epitaxial structure 20 and the epitaxial structure 30, so that the epitaxial structure 20 and the epitaxial structure 30 are not in contact with each other. The semiconductor light emitting device 300 further comprises a metal connecting layer 40 between the epitaxial structure 20 and the substrate 10 and between the epitaxial structure 30 and the substrate 10. The semiconductor light emitting device 300 further comprises electrode structures 50', 60', 70', 80'. The electrode structure 50' is on a surface 20A of the epitaxial structure 20 away from the substrate 10, and the electrode structure 70' is on a surface 30A of the epitaxial structure 30 away from the substrate 10. The electrode structures 60', 80' form a common electrode 370, and the common electrode 370 is connected to the metal connecting layer 40 through a common electrode connecting layer 42, so that the common electrode 370 is electrically connected to the semiconductor structure 222 and the semiconductor structure 322. In this embodiment, because the conductive type of the semiconductor structures 222, 322 is P-type, the common electrode 370 is a P-type electrode, and the electrode structures 50', 70' are N-type electrodes.

Please refer to FIG. 3A through FIG. 3C. In the semiconductor light emitting device 300 of this embodiment, the metal connecting layer 40 does not have the spacing (the spacing 40B shown in FIG. 1A); in other words, in this embodiment, the epitaxial structure 20 and the epitaxial structure 30 are together electrically connected to the metal connecting layer 40, and the electrode structure 60' and the electrode structure 80' are respectively connected to the common electrode connecting layer 42, so that the electrode structure 60' and the electrode structure 80' are together electrically connected to the metal connecting layer 40. Therefore, the area utilization rate of the electrodes with respect to the semiconductor light emitting device 300 can be increased. Please refer to FIG. 3A and FIG. 3B, from a cross-sectional view, the common electrode connecting layer 42 is at an outer side of the epitaxial structure 20 and the epitaxial structure 30. In detail, in this embodiment, from a bottom perspective view, the substrate 10 has a side 10A and a side 10B opposite to the side 10A, the common electrode structure CE (the structure of the common electrode connecting layer 42 shown in FIG. 3B) is closer to the side 10A as compared to the epitaxial structure 20 and is closer to the side 10B as compared to the epitaxial structure 30, and the common electrode connecting layer 42 covers the side portion 821 and the upper portion 822 of the passivation layer 82.

Please refer to FIG. 3B and FIG. 3C. FIG. 3B illustrates a schematic bottom perspective view of the semiconductor light emitting device 300 seen from plane defined by the line E-E' shown in FIG. 3A; that is, FIG. 3B illustrates a schematic view of the semiconductor light emitting device 300 seen from the electrode structure 50', the electrode structure 70', and the common electrode structure CE (as the direction shown in FIG. 3A indicated by the arrow 3B), and FIG. 3A illustrates a cross-sectional view along the line A-A' shown in FIG. 3B. FIG. 3C illustrates a schematic top perspective view of the semiconductor light emitting device 300 as shown in FIG. 3A; that is, FIG. 3C illustrates a schematic view of the semiconductor light emitting device 300 seen from the substrate 10 (as the direction shown in FIG. 3A indicated by the arrow 3C), and FIG. 3A illustrates a cross-sectional view along the line B-B' shown in FIG. 3C. As shown in FIG. 3B and FIG. 3C, in this embodiment, the semiconductor light emitting device 300 comprises four light emitting regions 300A, 300B, 300C, 300D, and the back surface of each of the light emitting regions has an electrode structure for achieving the addressable-control purpose. For example, the electrode structure 50' is correspondingly on the back surface of the light emitting region 300A, and the electrode structure 70' is correspondingly on the back surface of the light emitting region 300B. Each of the light emitting regions 300A, 300B, 300C, 300D comprises a plurality of epitaxial columnar structures P, and a central area of each of the epitaxial columnar structure has a light emitting aperture O (in this embodiment, each of the light emitting regions is served as a light emitting unit, and each of the light emitting units comprises for example 14 light emitting apertures). The light emitting apertures O are arranged regularly, and the light is emitted from the light emitting aperture O toward the substrate 10.

Please refer to FIG. 3A through FIG. 3C at the same time. The common electrode structure CE in the semiconductor light emitting device 300 is disposed on a peripheral region of the semiconductor light emitting device 300, the electrode structure 50' and the electrode structure 70' are surrounded by the common electrode structure CE, and the common electrode structure CE surrounds the light emitting regions 300A, 300B, 300C, 300D. In this embodiment, the surface area of the common electrode structure CE is greater than the surface area of the electrode structure 50' and the surface area of the electrode structure 70', but the disclosure is not limited thereto; a gap G1' is between the electrode structure 50' and the common electrode structure CE, and a gap G2' is between the electrode structure 70' and the common electrode structure CE which is substantially equal to the gap G1'. Moreover, in this embodiment, a gap G3' is between the electrode structure 50' and the electrode structure 70' which is greater than the gap G1' and the gap G2', and the extension direction of the gap G1', the gap G2', and the gap G3' is parallel to the diagonal line of the semiconductor light emitting device 300 (for example, parallel to the line A-A' shown in FIG. 3B). In this embodiment, in the manufacturing process of the semiconductor light emitting device, portions of the semiconductor epitaxial layer on which the common electrode connecting structure is to be formed are removed to form through holes so as to be served as the reserved positions V of the common electrode connecting structures of the semiconductor light emitting device according to one or some embodiments of the disclosure (as shown in FIG. 3B). Then, an electrical conductive material is filled into the through holes at the reserved positions V, so that an electrical conducting structures (for example, the common electrode connecting structure 42 shown in FIG. 3A) is formed at the reserved positions V, as the manufacturing process of the semiconductor light emitting device 100 mentioned above. However, in this embodiment, the through holes are formed on a peripheral region of the overall light emitting regions for forming the common electrode structure, without sacrificing (reducing) the position and the number of the light emitting apertures in the light emitting regions. Therefore, the position of the common electrode structure is at the outer side of the epitaxial columnar structures P.

In this embodiment, the semiconductor light emitting device 300 comprises a common electrode structure CE and a common P electrode (the common electrode 370) being surrounding-typed on the peripheral region of the light emitting regions 300A, 300B, 300C, 300D. Therefore, the area utilization rate of the electrodes with respect to the semiconductor light emitting device 300 can be increased. Moreover, the N electrode structures of the light emitting regions 300A, 300B, 300C, 300D are arranged independently (that is, the electrode structures 50', 70' respectively) so as to achieve the addressable-control function for each of the light emitting units. Therefore, for a single semiconductor light emitting device 300, the lighting conditions of the light emitting regions at different positions or the number of the lighting emitting regions being lighting can be controlled independently. Hence, the light emitting position and the luminance of the semiconductor light emitting device 300 can be controlled according to actual application requirements (for example, detection applications, illumination applications, or the like).

From the illustrations of the embodiments mentioned above, in the semiconductor light emitting device, the addressable-control function for each of the light emitting regions is achieved by utilizing the independent electrode structure of each of the light emitting regions (which may be one of the N electrode structure and the P electrode structure; for example, the independent electrode structure is an N electrode structure), and the area utilization rate of the electrodes with respect to the whole semiconductor light emitting device 300 can be increased by utilizing the common electrode structure (which may be the other one of the N electrode structure and the P electrode structure; for example, the common electrode structure is a P electrode structure) formed by the through hole. In one or some embodiments of the disclosure, through an etching process, the through hole structure (the reserved position V for the common electrode structure) may be formed in the light emitting regions of the semiconductor light emitting device or formed on a suitable portion out of the light emitting regions of the semiconductor light emitting device. That is, the position of the common electrode structure may be arranged according to actual application requirements; for example, the common electrode structure may be arranged at one or several of the light emitting apertures in the light emitting regions to replace the light emitting aperture(s) (as the embodiment shown in FIG. 1A through FIG. 1C) or may be arranged at a suitable position out of the light emitting regions (as the embodiment shown in FIG. 3A through FIG. 3C).

Please refer to FIG. 4A through FIG. 4E, which a schematic bottom perspective view, a schematic top perspective view, and schematic cross-sectional views with different cross-sections of a semiconductor light emitting device 400 according to an exemplary embodiment, respectively. The semiconductor light emitting device 400 of this embodiment has a similar construction with the semiconductor light emitting device 100 shown in FIG. 1A. In this embodiment, the electrodes structures of the semiconductor light emitting device 400 are at an outer side of the light emitting regions, and the electrode structures and the light emitting regions do not overlap with each other. Specifically, in this embodiment, the structure of the semiconductor light emitting device 400 is formed by a structure of a light emitting section and a structure of a non-light emitting section. The structure of the light emitting section of the semiconductor light emitting device 400 comprises four light emitting regions 400A, 400B, 400C, 400D, and the structure of the non-light emitting section of the semiconductor light emitting device 400 comprises electrode structures 50A, 50B, 60A, 60B, 70A, 70B, 80A, 80B, but the numbers of the light emitting regions and the electrode structures are not limited thereto. In this embodiment, the electrode structure 50A and the electrode structure 60A at the outer side of the light emitting region 400A are adapted to control the light emitting region 400A, the electrode structure 70A and the electrode structure 80A at the outer side of the light emitting region 400B are adapted to control the light emitting region 400B, the electrode structure 70B and the electrode 80B at the outer side of the light emitting region 400C are adapted to control the light emitting region 400C, and the electrode structure 50B and the electrode structure 60B at the outer side of the light emitting region 400D are adapted to control the light emitting region 400D. In this embodiment, the electrode structures 50A, 50B, 60A, 60B, 70A, 70B, 80A, 80B are separated from each other. In this embodiment, the semiconductor light emitting device 400 may optionally comprise thermal conductive structures TP on the back surfaces of the light emitting regions 400A, 400B, 400C, 400D so as to conduct the heat generated by the light emitting regions outwardly, thus increasing the heat dissipation performance of the semiconductor light emitting device 400. The material of the thermal conductive structure TP may be metal, and the area of the thermal conductive structure covers the area of the epitaxial columnar structures P for achieving heat dissipation of each of the light emitting regions, but the disclosure is not limited thereto. In one embodiment, for example, the electrode structure 60A and the electrode structure 80A may have internal connecting structures electrically connected with each other, so that the electrode structure 60A and the electrode structure 80A can form a common electrode structure. In another embodiment, for example, the electrode structure 60A and the electrode structure 80B which are arranged diagonally or the electrode structure 60B and the electrode structure 80A which are arranged diagonally may have internal connecting structures, so that two electrode structures with different conductive types can be formed individually, thereby further improving the current distribution of the semiconductor light emitting device, but the disclosure is not limited thereto.

Figure 4A:
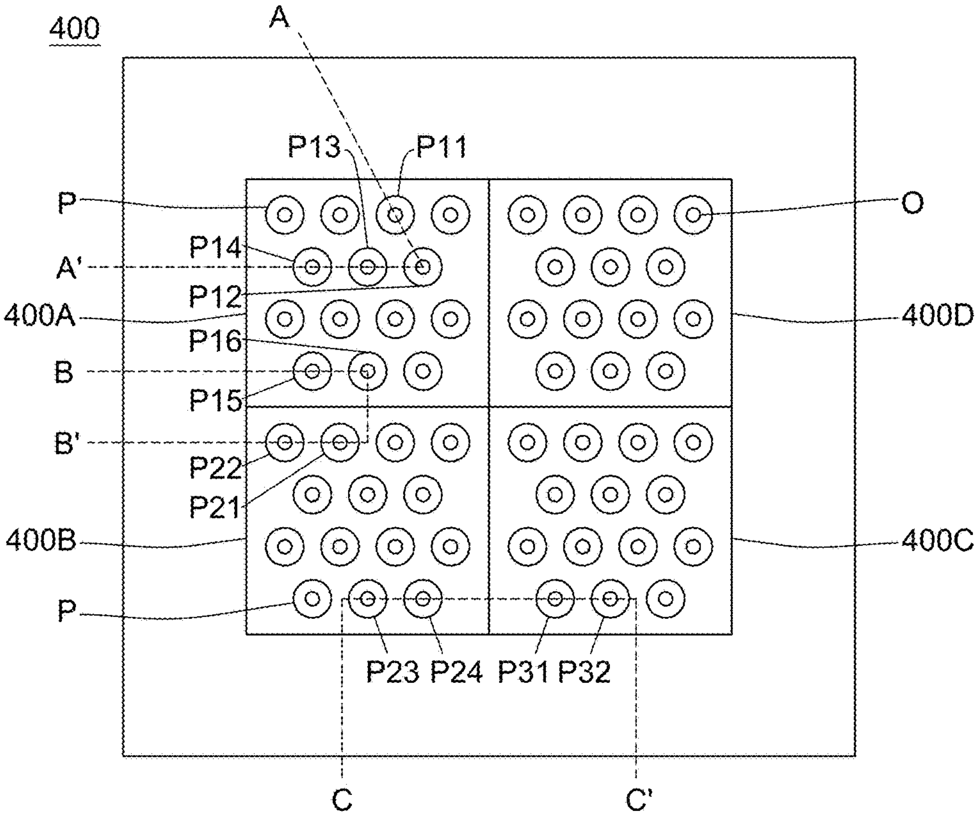
Figure 4B:
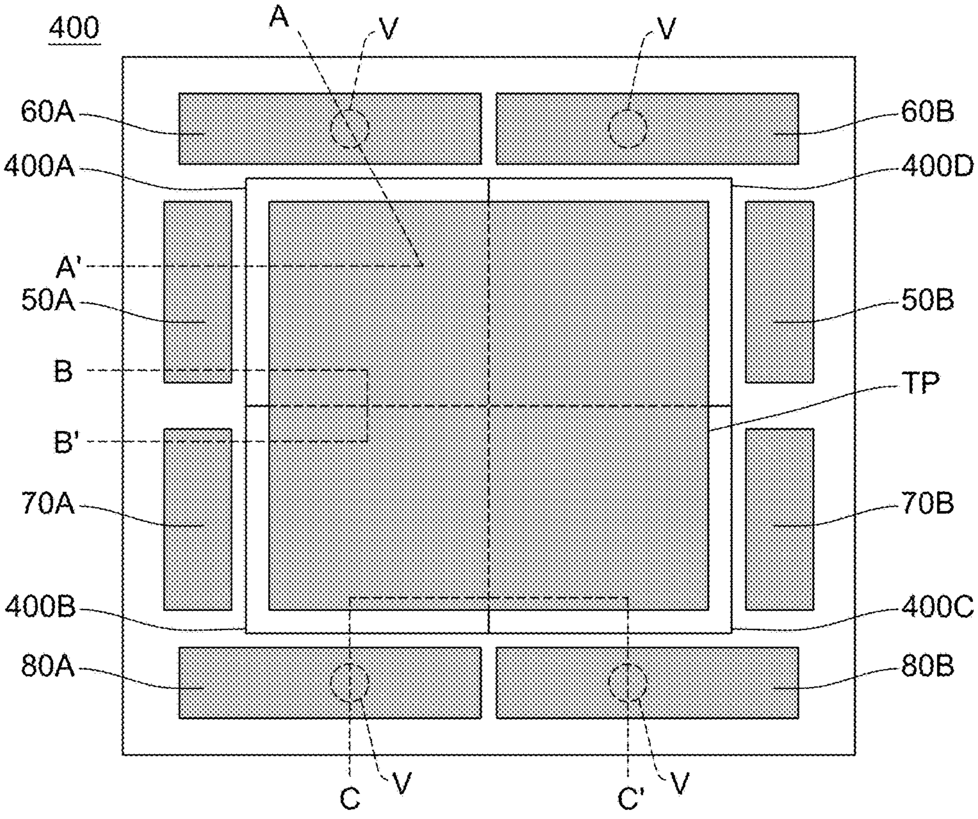
Figure 4C:
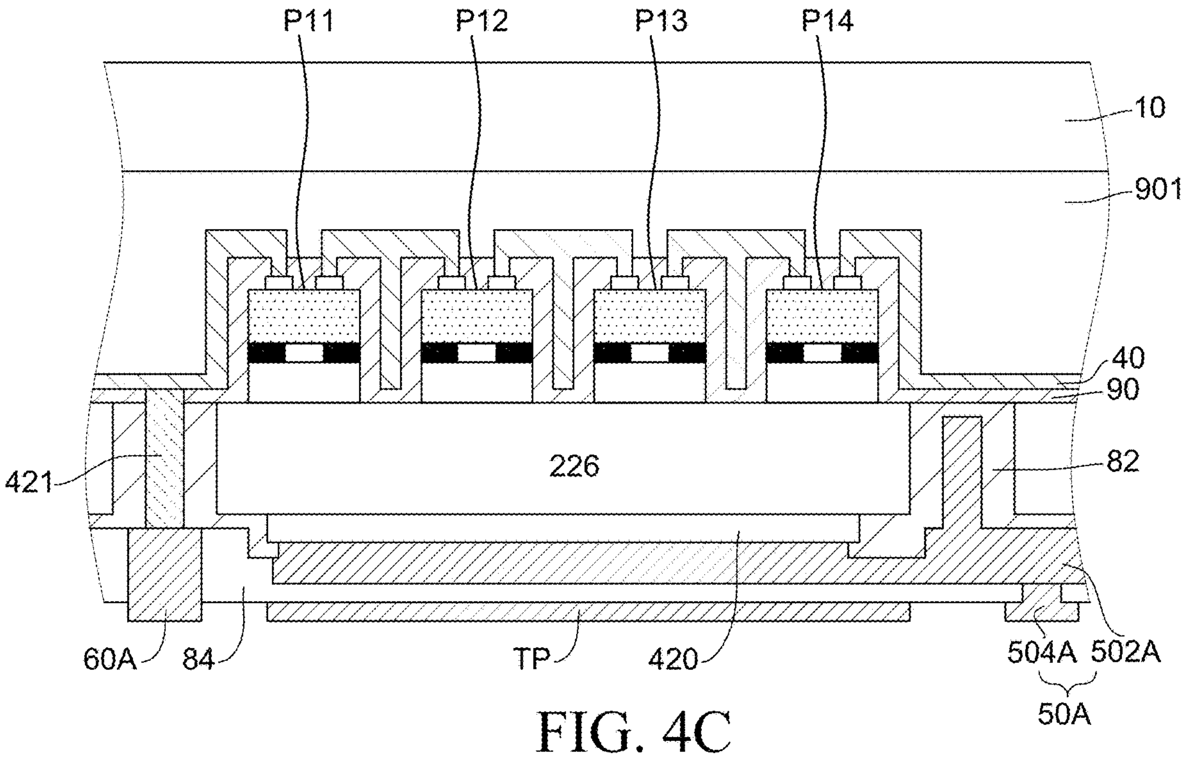
Figure 4D:
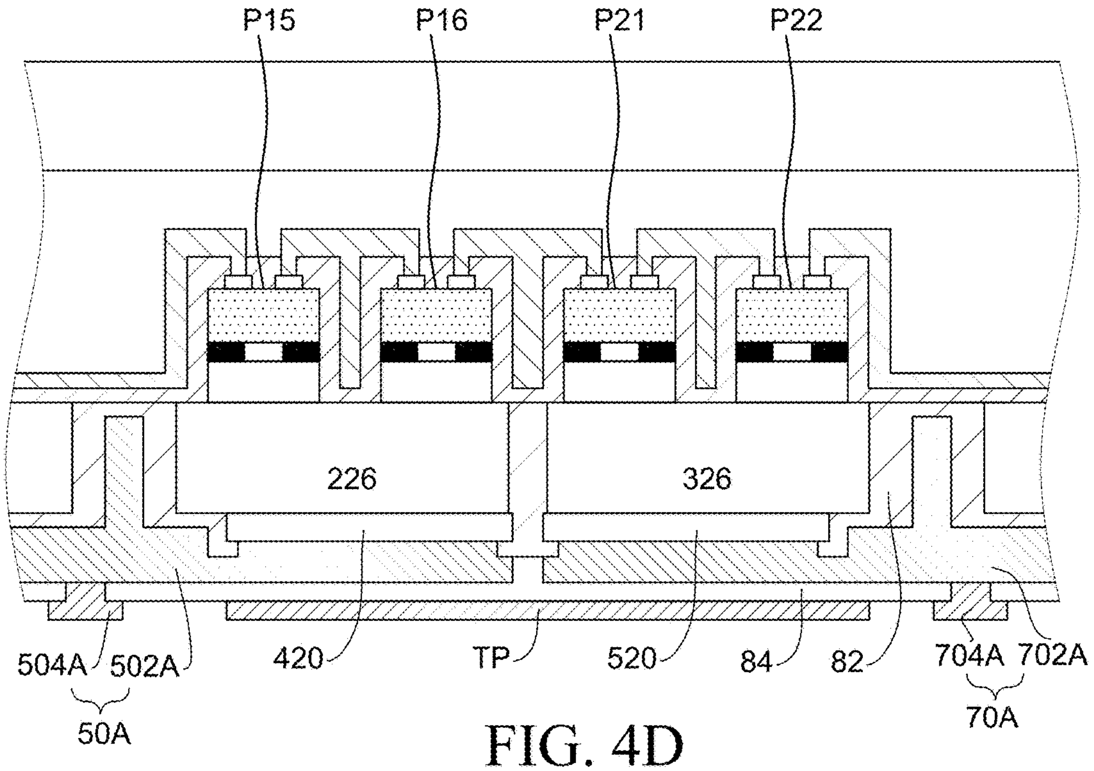
Figure 4E:
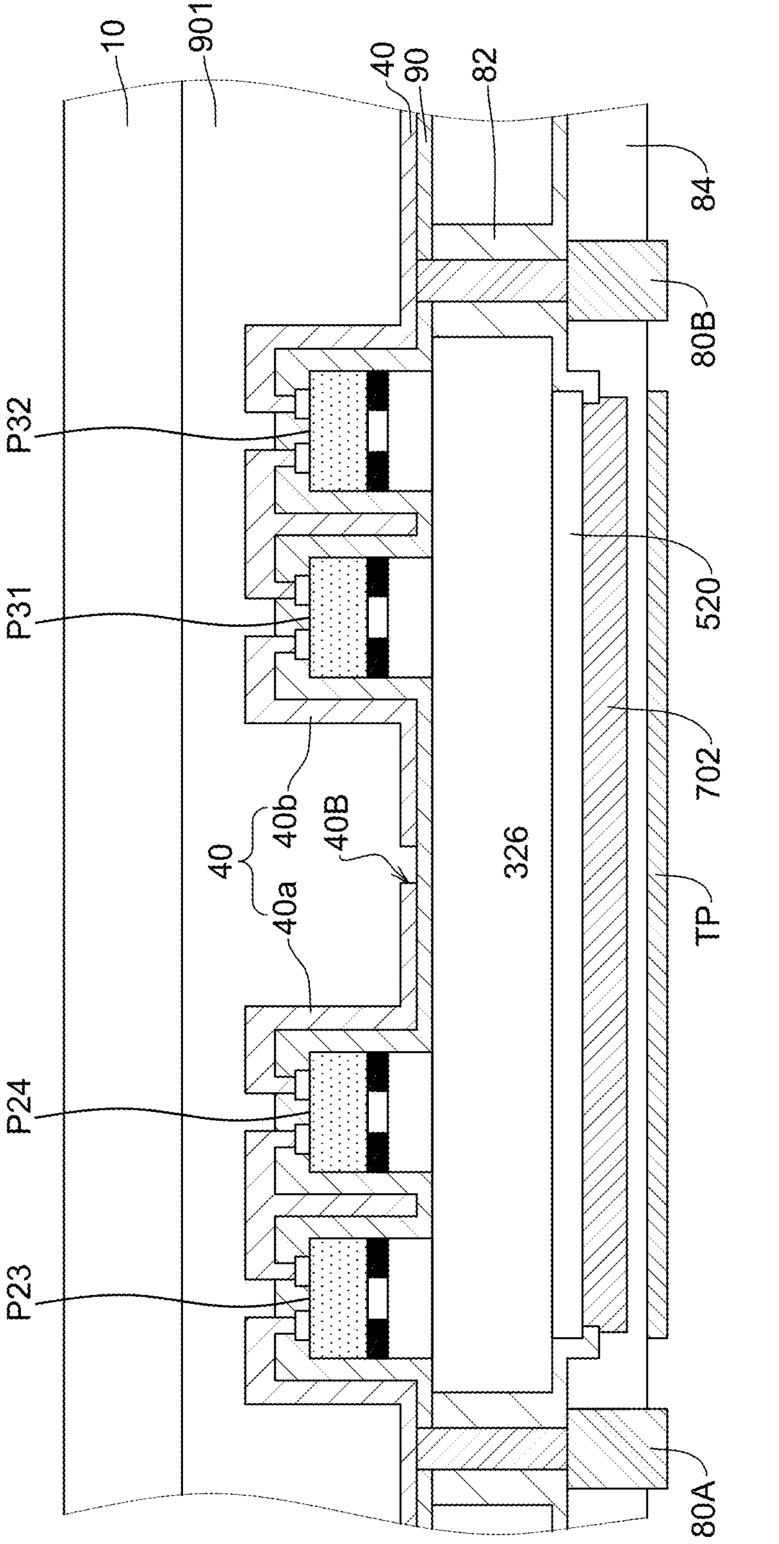

Please refer to FIG. 4C through FIG. 4E, which illustrate schematic cross-sectional views with different cross-sections of a semiconductor light emitting device 400 according to an exemplary embodiment, respectively; wherein FIG. 4C illustrates a cross-sectional structure along the line A-A' shown in FIG. 4A, FIG. 4D illustrates a cross-sectional structure along the line B-B' shown in FIG. 4A, and FIG. 4E illustrates a cross-sectional structure along the line C-C' shown in FIG. 4A.

As shown in FIG. 4C, the four epitaxial columnar structures P11, P12, P13, P14 (corresponding to the light emitting apertures) of the light emitting region 400A are on the same mesa structure 226, and the electrical control signal passes through the electrode structure 50A and the electrode structure 60A at the outer side of the mesa structure 226 to control the lighting condition of the light emitting region 400A. In this embodiment, the electrode structure 50A is electrically connected to the semiconductor structure (corresponding to the mesa structure 226) through the electrode connecting layer 420, and the electrode structure 60A is connected to the conductive layer 421 so as to be electrically connected to the metal connecting layer of the semiconductor light emitting device 400. In this embodiment, the semiconductor light emitting device 400 further comprises a thermal conductive structure TP covering the passivation layer 84 for heat dissipation.

FIG. 4D illustrates the epitaxial columnar structures P15, P16, P21, P22 in different light emitting regions 400A, 400B, wherein the epitaxial columnar structures P15, P16 are on the mesa structure 226, and the epitaxial columnar structures P21, P22 are on the mesa structure 326. As shown in FIG. 4D, each of the electrode structures 50A, 70A is independently electrically connected to a corresponding one of the mesa structures 226, 326, and the electrode structure 50A and the electrode structure 70A are not electrically connected to each other (the electrode structure 50A and the electrode structure 70A are separated by the passivation layer 84), so that the electrical control signals can respectively pass through the electrode structure 50A at the outer side of the light emitting region 400A and the electrode structure 70A at the outer side of the light emitting region 40B so as to control the lighting conditions of the light emitting region 400A and the light emitting region 400B independently. Likewise, the thermal conductive structure TP covers the passivation layer 84, and the area of the thermal conductive structure TP covers the area of all of the epitaxial columnar structures P for achieving heat dissipation of each of the light emitting regions.

In the cross-sectional structure shown in FIG. 4E, the epitaxial columnar structures P23, P24 of the light emitting region 400B and the epitaxial columnar structures P31, P32 of the light emitting region 400C are on the same mesa structure 326. As shown, the electrode structure 80A at the outer side of the light emitting region 400B and the electrode structure 80B at the outer side of the light emitting region 400C are not electrically connected to each other, so that the lighting condition of the light emitting region 400B and the lighting condition of the light emitting region 400C can be controlled independently. Likewise, the thermal conductive structure TP covers the passivation layer 84 for achieving heat dissipation of the light emitting regions.

Please further refer to FIG. 4A through FIG. 4E. The electrode structure of this embodiment and the electrode structure shown in FIG. 1A have the same or similar construction. In other words, in this embodiment, each of the electrode structures 50A, 60A, 70A, 80A, 80B may comprise a middle layer (for example, the middle layer 502A/702A) and an attaching layer (for example, the attaching layer 504A/704A).

Figure 5A:
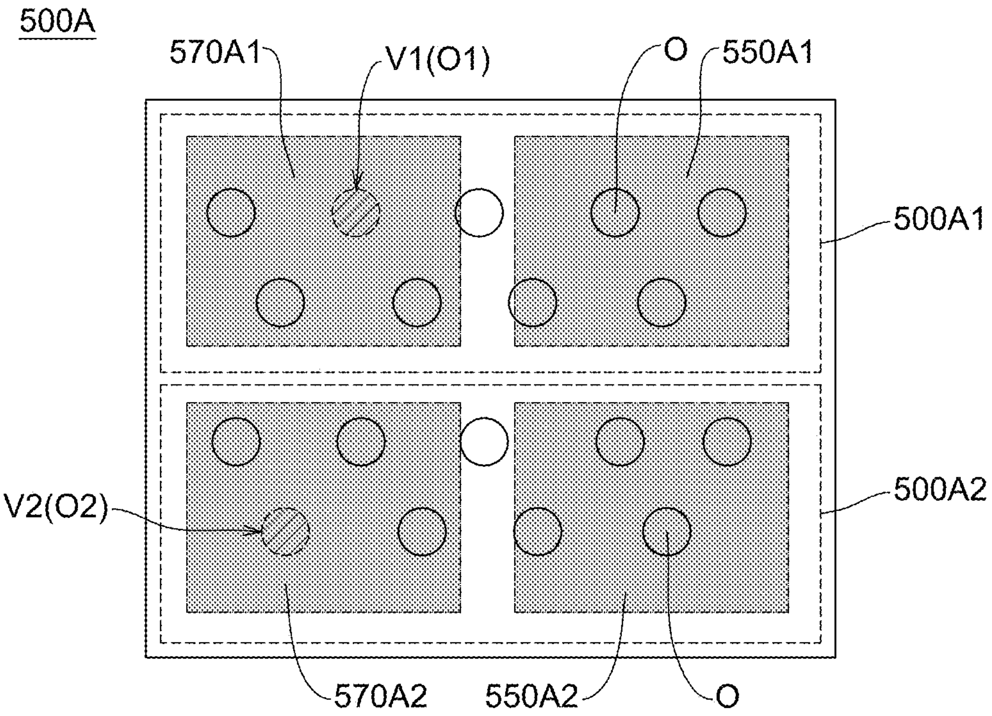
Figure 5B:
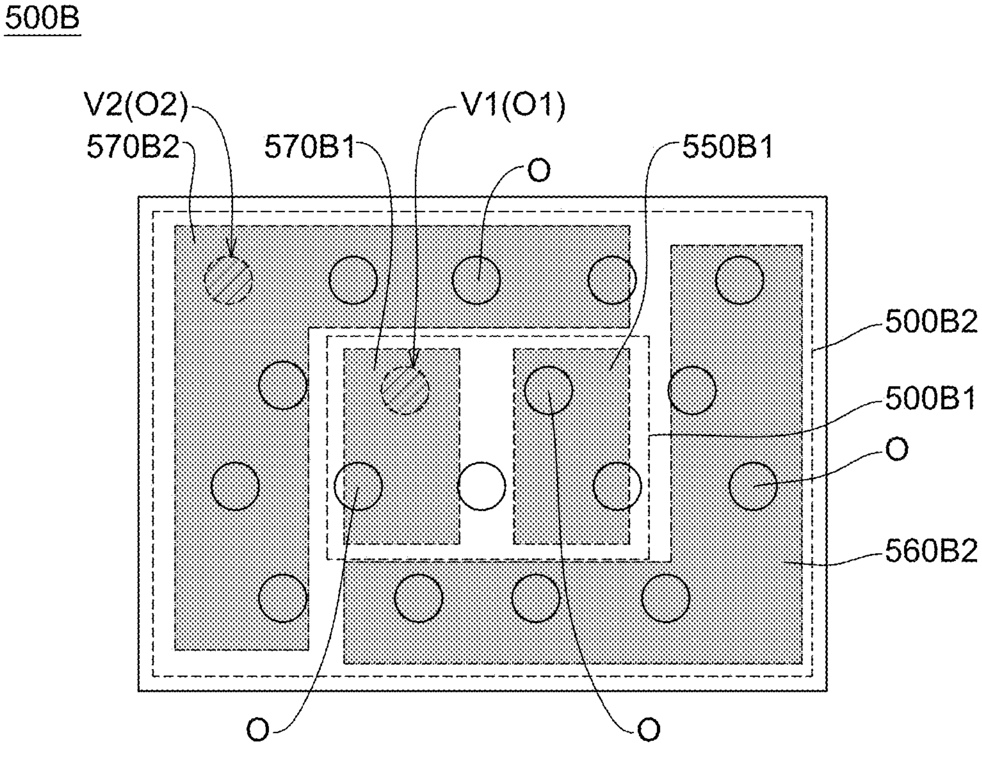
Figure 5C:
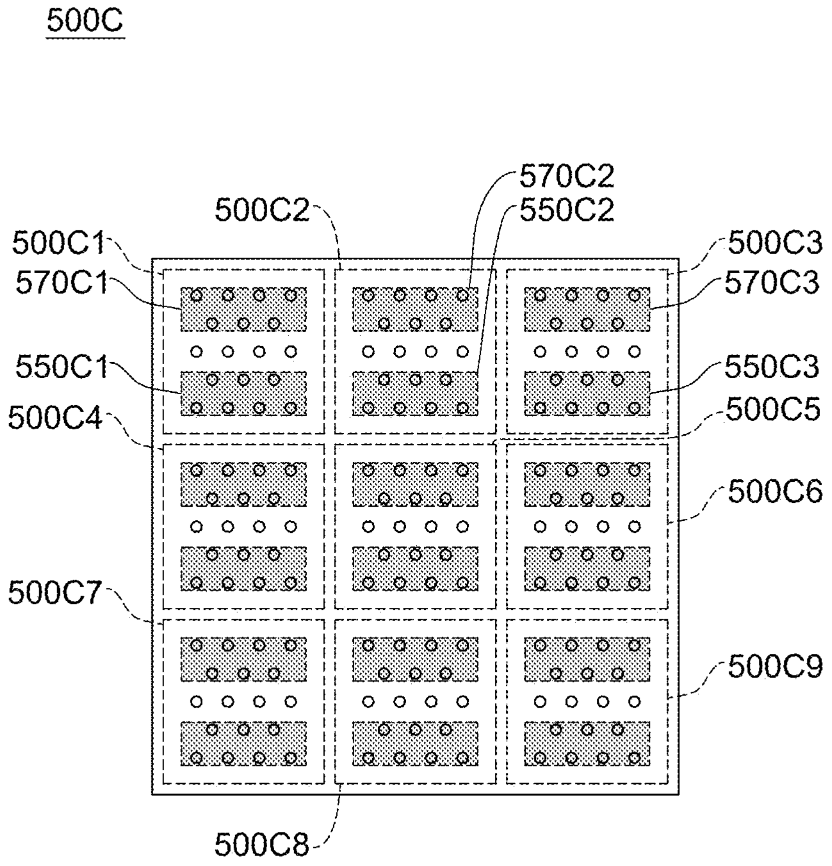

FIG. 5A through FIG. 5C illustrates schematic top perspective views of semiconductor light emitting devices according to exemplary embodiments, wherein FIG. 5A through FIG. 5C are provided to illustrate the configurations of the light emitting regions and the electrode structures corresponding to the light emitting regions of the semiconductor light emitting devices according to one or some embodiments of the disclosure. As the embodiment shown in FIG. 5A, the semiconductor light emitting device 500A has a light emitting region 500A1 and a light emitting region 500A2 arranged side by side, and each of the light emitting regions 500A1, 500A2 has a plurality of light emitting apertures (for example, eight light emitting apertures O). In this embodiment, the manufacturing process mentioned above may be adopted, so that the portions of the light emitting regions 500A1, 500A2 at which the light emitting apertures O1, O2 are to be formed are served as the reserved regions V1, V2. Therefore, in the semiconductor light emitting device 500A, electrical connecting structures (for example, the conductive layer 421 or the conductive layer 422 shown in FIG. 1A) capable of electrically connecting the semiconductor epitaxial structure to the electrode structures (for example, the electrode structures 570A1, 570A2) can be formed in the reserved regions V1, V2. The lighting condition of the light emitting region 500A1 can be controlled through the electrode structures 570A1, 550A1, and the lighting condition of the light emitting region 500A2 can be controlled through the electrode structure 570A2, 550A2. In brief, in this embodiment, the light emitting region 500A1 and the light emitting region 500A2 can be lighted up alone or together by controlling the driving electrical signals to be inputted to the electrode structures 570A1, 570A2. Therefore, the lighting condition (for example, the change of the luminance and the change of the light distribution pattern) of the semiconductor light emitting device 500A can be flexibly adjusted or dynamically controlled according to user requirements.

As the embodiment shown in FIG. 5B, the semiconductor light emitting device 500B has a light emitting region 500B1 and a light emitting region 500B2 surrounding the light emitting region 500B1. The light emitting region 500B1 may be at a center portion of the semiconductor light emitting device 500B, but the disclosure is not limited thereto. In this embodiment, the manufacturing process mentioned above may be adopted, so that electrical connecting structures (for example, the conductive layer 421 or the conductive layer 422 shown in FIG. 1A) capable of electrically connecting to the electrode structures (for example, the electrode structures 570B1, 570B2) can be formed in the reserved regions V1, V2 in the light emitting regions 500B1, 500B2. In this embodiment, similar to the embodiment shown in FIG. 5A, the lighting condition of the light emitting region 500B1 can be controlled by the electrical signal passing through the electrode structures 570B1, 550B1, and the lighting condition of the light emitting region 500B2 can be controlled by the electrical signal passing through the electrode structures 570B2, 550B2. In brief, in this embodiment, the light emitting region 500B1 and the light emitting region 500B2 can be lighted up alone or together (the light emitting regions may have the same or different luminance) by controlling the electrical signals. Therefore, the luminance and the light distribution pattern of the semiconductor light emitting device 500B can be flexibly adjusted according to user requirements.

As the embodiment shown in FIG. 5C, in this embodiment, the semiconductor light emitting device 500C comprises a plurality of light emitting regions (for example, nine light emitting regions 500C1-500C9), the light emitting regions are arranged as an array (for example, a 3×3 array), and each of the light emitting regions has a plurality of light emitting apertures (for example, 18 light emitting apertures O). The lighting condition of the light emitting region 500C1 can be controlled by the electrical signal passing through the electrode structures 570C1, 550C1, the lighting condition of the light emitting region 500C2 can be controlled by the electrical signal passing through the electrode structures 570C2, 550C2, the lighting condition of the light emitting region 500C3 can be controlled by the electrical signal passing through the electrode structures 570C3, 550C3, and so forth. In brief, in this embodiment, by controlling the electrical signals, the light emitting regions 500C1-500C9 can be lighted up alone or two or more of the light emitting regions 500C1-500C9 can be lighted up together. Therefore, the luminance and the light distribution pattern of the semiconductor light emitting device 500C can be flexibly adjusted according to user requirements.

According to one or some embodiments of the disclosure, the number of the light emitting apertures and the number of the through holes contained in one of the light emitting regions may be different from the number of the light emitting apertures and the number of the through hole contained in another light emitting region, depending on the area of the light emitting region. In one embodiment, the reserved region V may be at a center of the light emitting region for current diffusion and current distribution.

FIG. 6A through FIG. 6E illustrate schematic bottom perspective views of semiconductor light emitting devices according to exemplary embodiments, wherein FIG. 6A through FIG. 6E are provided to illustrate the configurations of the electrode structures of the semiconductor light emitting devices of the exemplary embodiments. In these embodiments, the light emitting regions of the semiconductor light emitting device have the common electrode structure and have the electrode structures which are independent from each other. Therefore, the addressable-control function for each of the light emitting regions can be achieved. Moreover, owing to the configuration of the common electrode structure, the overall area or volume of the electrodes can be reduced, thus reducing the overall volume of the semiconductor light emitting device. Likewise, according to the shape, the size, and the position of each of the light emitting regions in the semiconductor light emitting device, the through hole structure for electrically connected to the electrode structures may be formed at the reserved position V. Moreover, according to the shape, the number, and the configuration of the electrode structures, the lighting conditions of the light emitting regions or the number of the light emitting regions being lighting can be addressable-controlled according to the actual application scenarios.

Figure 6A:
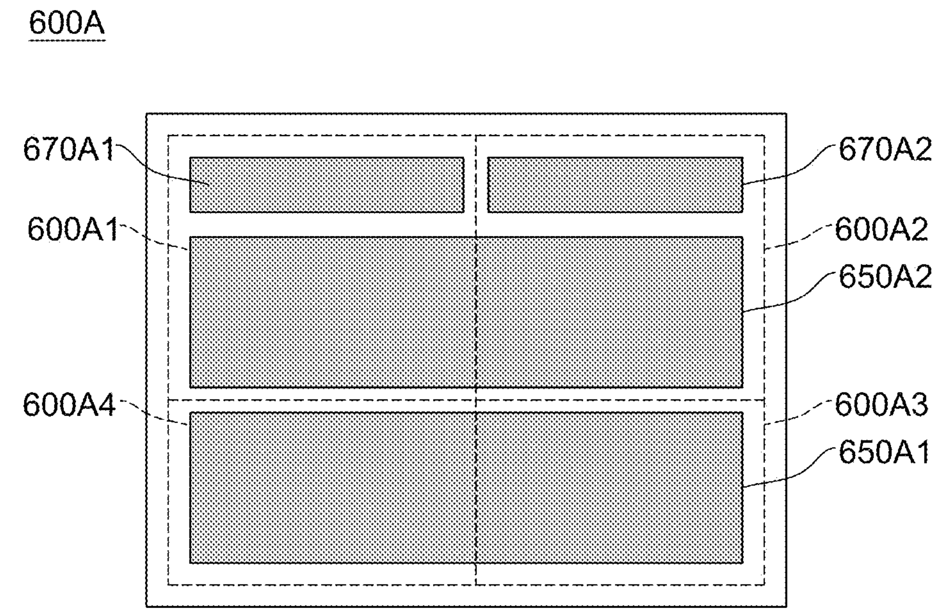

As the embodiment shown in FIG. 6A, the semiconductor light emitting device 600A has four light emitting regions 600A1-600A4 and electrode structures 650A1, 650A2, 670A1, 670A2, wherein the light emitting regions 600A1-600A4 are arranged as a 2×2 array. The electrode structure 650A1 is the common electrode structure of the light emitting region 600A3 and the light emitting region 600A4, the electrode structure 650A2 is the common electrode structure of the light emitting region 600A1 and the light emitting region 600A2, and the electrode structure 650A1 and the electrode structure 650A2 are electrically connected to semiconductor structures with the same conductive type (for example, N-type semiconductor structures). The electrode structure 670A1 is the common electrode structure of the light emitting region 600A1 and the light emitting region 600A4, the electrode structure 670A2 is the common electrode structure of the light emitting region 600A2 and the light emitting region 600A3, and the electrode structure 670A1 and the electrode structure 670A2 are electrically connected to semiconductor structures with the other conductive type (for example, P-type semiconductor structures). In other words, in this embodiment, the light emitting region 600A4 can be controlled through the electrode structure 650A1 and the electrode structure 670A1, the light emitting region 600A3 can be controlled through the electrode structure 650A1 and the electrode structure 670A2, the light emitting region 600A1 can be controlled through the electrode structure 650A2 and the electrode structure 670A1, and the light emitting region 600A2 can be controlled through the electrode structure 650A2 and the electrode structure 670A2.

Figure 6B:
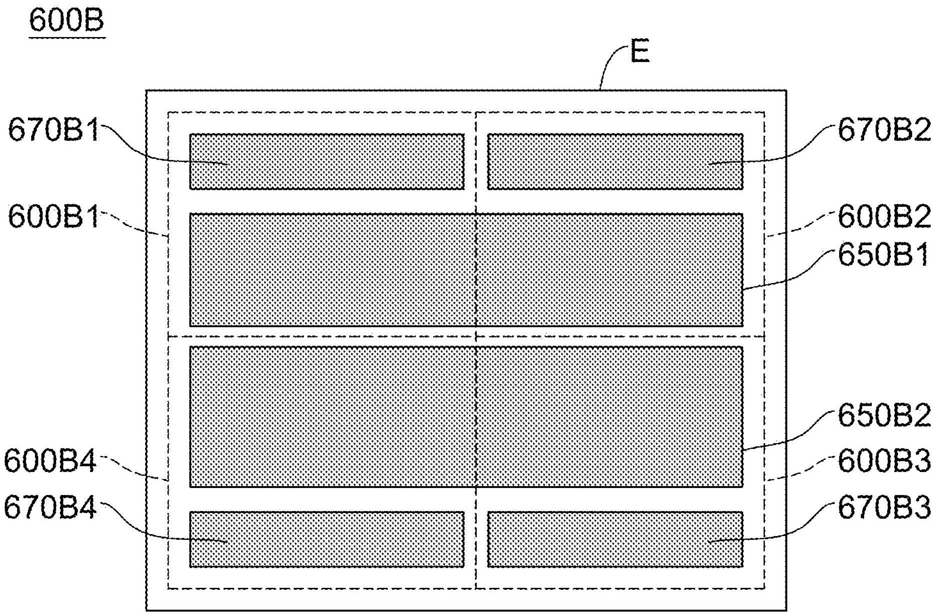

As the embodiment shown in FIG. 6B, the semiconductor light emitting device 600B has four light emitting regions 600B1-600B4, electrode structures 650B1-650B2, and electrode structures 670B1-670B4. The electrode structure 650B1 is the common electrode structure of the light emitting region 600B1 and the light emitting region 600B2, the electrode structure 650B2 is the common electrode structure of the light emitting region 600B3 and the light emitting region 600B4, and each of the electrode structures 670B1-670B4 is an independent electrode of a corresponding one of the light emitting regions 600B1-600B4, so that the lighting condition of each of the light emitting regions 600B1-600B4 can be controlled independently. Please refer to FIG. 6B again. In this embodiment, the semiconductor light emitting device 600B has an edge E, the electrode structures 670B1-670B4 served as the independent electrodes are adjacent to the edge E, and the electrode structures 650B1-650B2 served as the common electrodes are between the independent electrode structures 670B1-670B4. In other words, in this embodiment, as compared to the independent electrode structures, the common electrode structures are closer to the middle portion of the semiconductor light emitting device 600B.

Figure 6C:
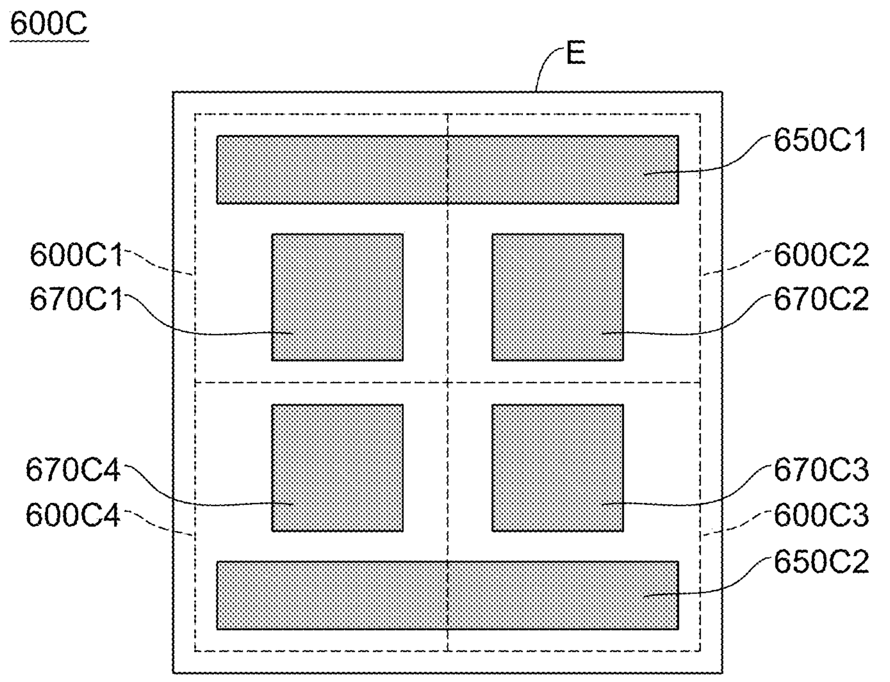

As the embodiment shown in FIG. 6C, the semiconductor light emitting device 600C has four light emitting regions 600C1-600C4, electrode structures 650C1-650C2, and electrode structures 670C1-670C4. The electrode structure 650C1 is the common electrode structure of the light emitting region 600C1 and the light emitting region 600C2, the electrode structure 650C2 is the common electrode structure of the light emitting region 600C3 and the light emitting region 600C4, and each of the electrode structures 670C1-670C4 is an independent electrode of a corresponding one of the light emitting regions 600C1-600C4, so that the lighting condition of each of the light emitting regions 600C1-600C4 can be controlled independently. Please refer to FIG. 6C again. In this embodiment, the semiconductor light emitting device 600C has an edge E, the electrode structures 650C1-650C2 served as the common electrodes are adjacent to the edge E, and the electrode structures 670C1-670C4 served as the independent electrodes are between the common electrode structures 650C1-650C2. In other words, in this embodiment, as compared to the common electrode structures, the independent electrode structures are closer to the middle portion of the semiconductor light emitting device 600C.

Figure 6D:
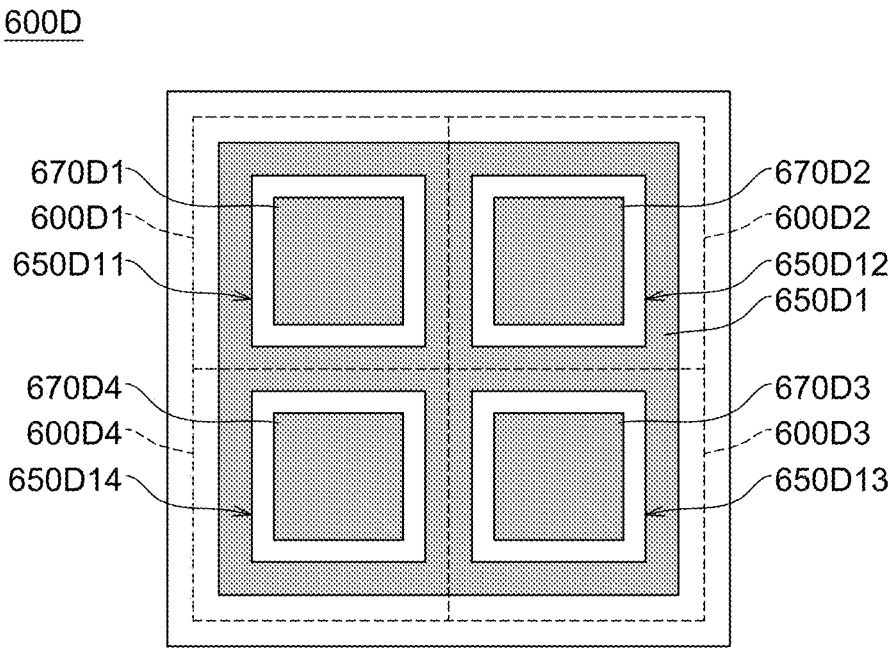

As the embodiment shown in FIG. 6D, the semiconductor light emitting device 600D has four light emitting regions 600D1-600D4, an electrode structure 650D1, and electrode structures 670D1-670D4. The electrode structure 650D1 is the common electrode structure of the light emitting region 600D1, the light emitting region 600D2, the light emitting region 600D3, and the light emitting region 600D4, and each of the electrode structures 670D1-670D4 is an independent electrode of a corresponding one of the light emitting regions 600D1-600D4, so that the lighting condition of each of the light emitting regions 600D1-600D4 can be controlled independently. In this embodiment, the common electrode structure 650D1 surrounds the independent electrode structures 670D1-670D4. For example, from the top view shown in FIG. 6D, the electrode structure 650D1 served as the common electrode has a plurality of openings (e.g., opening portions 650D11-650D14), and each of the electrode structures 670D1-670D4 served as the independent electrodes is in a corresponding one of the opening portions 650D11-650D14.

Figure 6E:
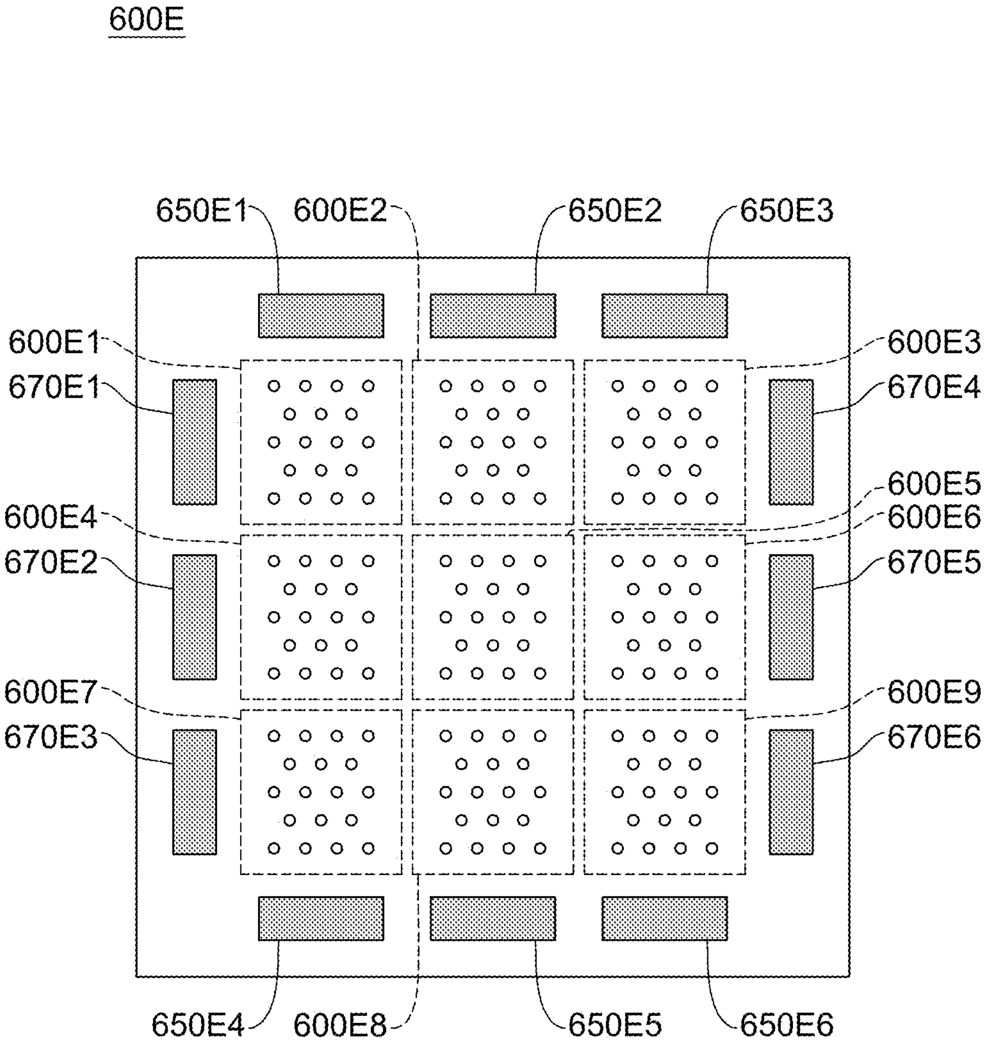

As the embodiment shown in FIG. 6E, in this embodiment, the semiconductor light emitting device 600E has a plurality of light emitting regions (for example, as the 9 light emitting regions 600E-600E9 shown in the figure), electrode structures 650E1-650E6, and electrode structures 670E1-670E6. The electrode structures 650E1-650E6 are electrically connected to semiconductor structures with the same conductive type (for example, N-type semiconductor structures), and the electrode structures 670E-670E6 are electrically connected to the semiconductor structures with the other conductive type (for example, P-type semiconductor structures). The three light emitting regions of the first column (e.g., the light emitting region 600E1, the light emitting region 600E4, and the light emitting region 600E7) can be controlled through the electrode structure 650E1, the three light emitting regions of the second column (e.g., the light emitting region 600E2, the light emitting region 600E5, and the light emitting region 600E8) can be controlled through the electrode structure 650E2, and the three light emitting regions of the third column (e.g., the light emitting region 600E3, the light emitting region 600E6, and the light emitting region 600E9) can be controlled through the electrode structure 650E3. The three light emitting regions of the first row (e.g., the light emitting region 600E1, the light emitting region 600E2, and the light emitting region 600E3) can be controlled through the electrode structure 670E1, the three light emitting regions of the second row (e.g., the light emitting region 600E4, the light emitting region 600E5, and the light emitting region 600E6) can be controlled through the electrode structure 670E2, and the three light emitting regions of the third row (e.g., the light emitting region

600E7, the light emitting region 600E8, and the light emitting region 600E9) can be controlled through the electrode structure 670E3. With the aforementioned electrode configuration, partitioned addressable-control of the array of the light emitting regions can be achieved. For example, if the light emitting region 600E1 is to be lighted up, the electrode structure 650E1 of the first column and the electrode structure 670E1 of the first row are in electrical conduction; if both the light emitting region 600E1 and the light emitting region 600E2 are to be lighted up, the electrode structure 650E1 of the first column and the electrode structure 670 E1 of the first row are in electrical conduction, and the electrode structure 650E2 of the second column and the electrode structure 670E1 of the first row are in electrical conduction; that is, in this embodiment, the electrode structure 670E1 is the common electrode of the light emitting region 600E1 and the light emitting region 600E2. In some embodiments, to increase the current distribution efficiency, the electrode structure 650E1 is at a position corresponding to one of two ends of the light emitting regions of the first column. Moreover, in this embodiment, the electrode structure 650E4 is at a position corresponding to the other end of the light emitting regions of the first column. That is, in this embodiment, the electrode structure 650E1 and the electrode structure 650E4 are at the upper and lower sides of the light emitting regions of the first column, and both the electrode structure 650E1 and the electrode structure 650E4 are electrically connected to the semiconductor structures having the same conductive type in the light emitting regions 600E1, 600E4, 600E7 of the first column. Hence the internal resistance of the semiconductor light emitting device 600E can be reduced through the symmetrical arrangement of the electrode structures. Likewise, the electrode structure 650E5 of the second column, the electrode structure 650E6 of the third column, the electrode structure 670E4 of the first row, the electrode structure 670E5 of the second row, and the electrode structure 670E6 of the third row correspond to the electrode structure 650E2 of the second column, the electrode structure 650E3 of the third column, the electrode structure 670E1 of the first row, the electrode structure 670E2 of the second row, and the electrode structure 670E3 of the third row, respectively.

According to one or some embodiments of the disclosure, the overall capacitance of the semiconductor light emitting device can be reduced through the material selection of the passivation layers and the configurations of the passivation layers. Please refer to the embodiments shown in FIG. 7A and FIG. 7B, which respectively illustrate cross-sectional views of the semiconductor light emitting devices 700A, 700B according to some embodiments, wherein the semiconductor light emitting devices 700A, 700B and the semiconductor light emitting devices 100, 300 have same or similar constructions and structures. In the following paragraphs, the differences between the semiconductor light emitting devices 700A, 700B and the semiconductor light emitting devices 100, 300 are illustrated.

Figure 7A:
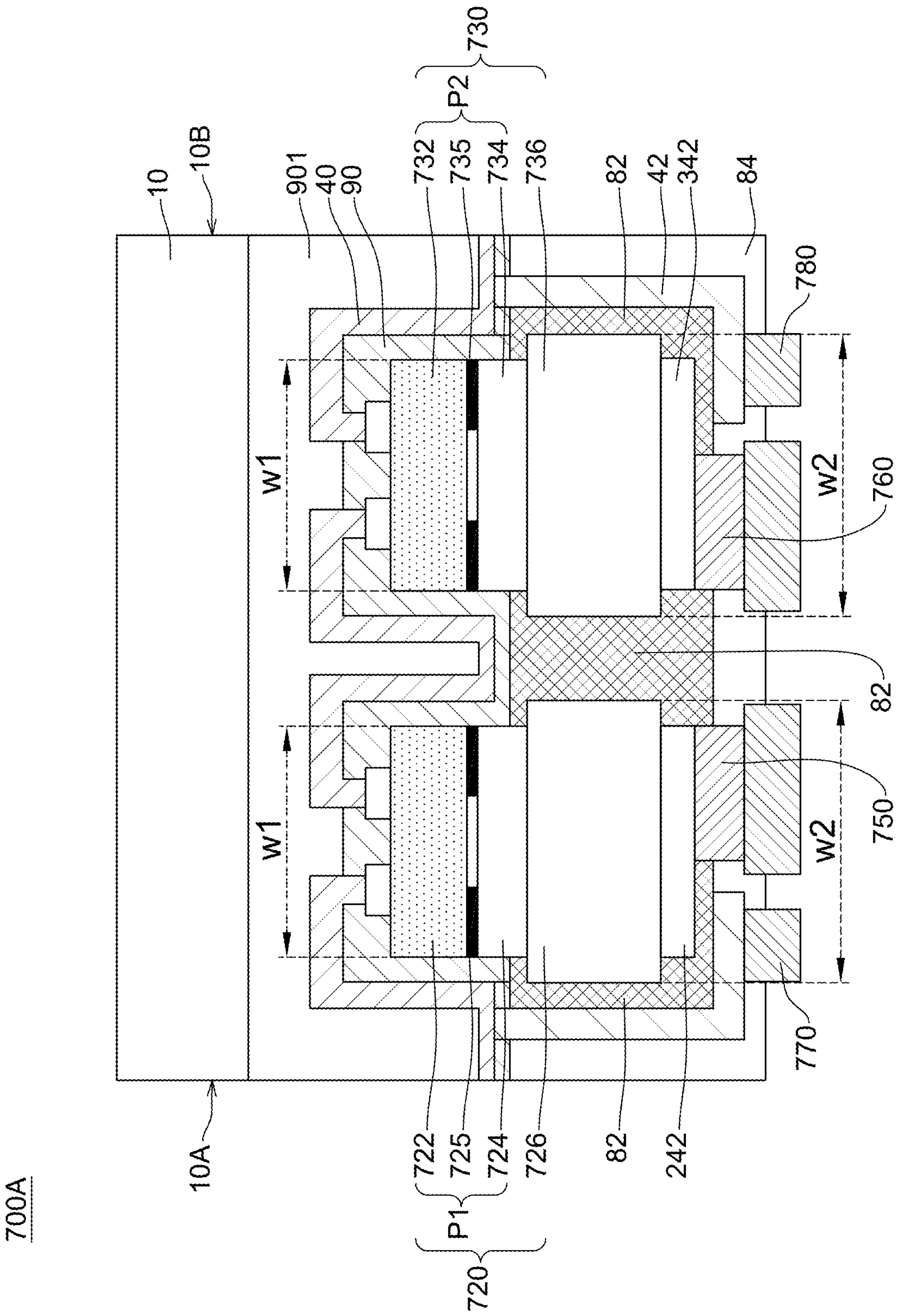
FIG. 7A and FIG. 7B illustrate schematic cross-sectional views of semiconductor light emitting devices according to exemplary embodiments.
Figure 7B:
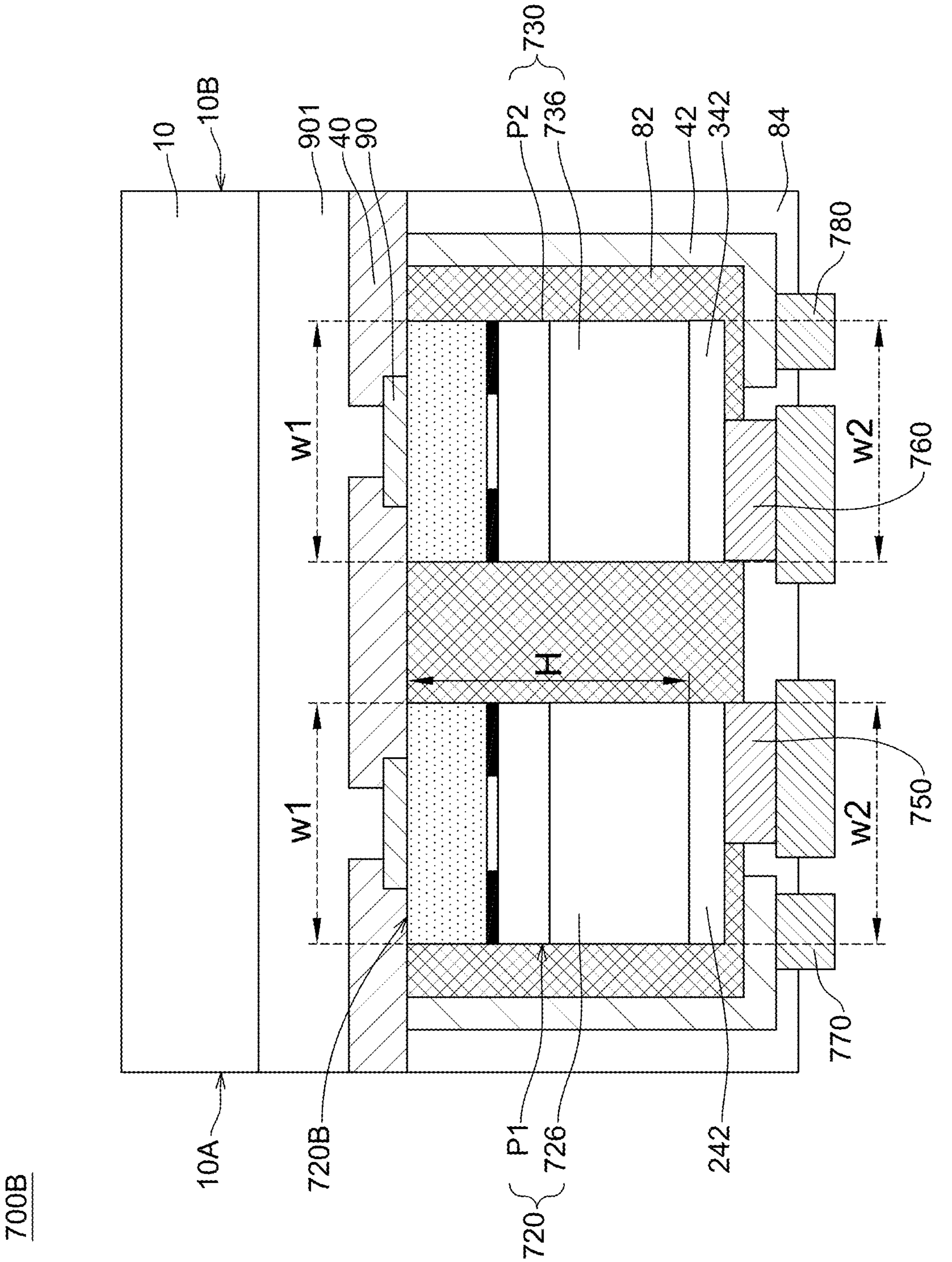

As the embodiment shown in FIG. 7A, the electrode structure 770 and the electrode structure 780 of the semiconductor light emitting device 700A are at outer sides of the epitaxial structure 720 and the epitaxial structure 730, respectively; that is, in this embodiment, the electrode structure 770 is at one side of the epitaxial structure 720 adjacent to the side 10A of the substrate 10, and the electrode structure 780 is at one side of the epitaxial structure 730 adjacent to the side 10B of the substrate 10. In the embodiments, the electrode structures 770 and 780 are respectively at the outer sides of the electrode structures 750 and 760, as shown in FIG. 7A and FIG. 7B. Also, each of the electrode structures 750 and 760 comprises a middle layer and an attaching layer, as the electrode structures 50 and 70 shown in FIG. 1A. In this embodiment, each of the epitaxial columnar structures P1, P2 has a width w1, and each of the mesa structures 726, 736 has a width w2. In this embodiment, the width w1 is less than the width w2; in other words, in this embodiment, the mesa structures 726, 736 are formed at the outer side of the epitaxial columnar structures P1, P2 and protrude from the epitaxial columnar structures P1, P2, so that each of the epitaxial columnar structures P1, P2 and a corresponding one of the mesa structures 726, 736 form a two-staged elevated structure.

Alternatively, as the embodiment shown in FIG. 7B, the compositions of the layers of the semiconductor light emitting device 700B is the same or similar to the compositions of the layers of the semiconductor light emitting device 700A, wherein the widths w2 of the mesa structure 726, 736 of the semiconductor light emitting device 700B are equal to or close to the widths w1 of the epitaxial columnar structures P1, P2; that is, in this embodiment, the width w2 is equal to the width w1. In other words, in this embodiment, each of the mesa structures 726, 736 and a corresponding one of the epitaxial columnar structures P1, P2 form a flat elevated structure which does not have the two-staged elevated structure.

In the embodiments shown in FIG. 7A and FIG. 7B, because the epitaxial structures 720, 730 respectively form the elevated structures and the electrode structures 770, 780 are respectively arranged at the outer sides of the epitaxial structure 720 and the epitaxial structure 730, the depth-to-width ratio of the spacing between the epitaxial structure 720 and the epitaxial structure 730 is greater than the spacing between the epitaxial structures of a semiconductor light emitting device known to the inventor. Therefore, in one or some embodiments of the disclosure, gluing materials with low dielectric constant (low k) (for example, spin-on-glue (SOG) gluing materials) are adopted as the material for the passivation layer in the semiconductor light emitting device. Hence, not only the gluing materials can be filled into the spacing between the epitaxial structure 720 and the epitaxial structure 730 easily, but also the surface of the overall device can be flattened which thus facilitates the distribution of the metal layer to reduce the resistance of the device. Moreover, in the subsequent die attach process, the gluing materials may be served as the cushioning layer for protecting the chip. Furthermore, owing to the application of the gluing materials, the thickness of the device is increased, thus further reducing the overall capacitance of the semiconductor light emitting device.

According to one or some embodiments of the disclosure, upon the formation of the light emitting apertures of the semiconductor light emitting device, the structural configurations of the light emitting regions can be adjusted to change the positions and the number of the light emitting apertures, thereby further increasing the density of the light emitting apertures in the light emitting regions and the flexibility of the addressable-control function; the way for forming the light emitting apertures may be, for example, the wet oxidation process. Please refer to the embodiment shown in FIG. 8A through 8C, which illustrate a schematic top perspective view and cross-sectional views of a semiconductor light emitting device 800 according to another exemplary embodiment of the disclosure, wherein FIG. 8A illustrates a schematic top perspective view of the semiconductor light emitting device 800, and FIG. 8B and FIG. 8C illustrate cross-sectional views along the line A-A' and the line B-B' shown in FIG. 8A, respectively.

Figure 8A:
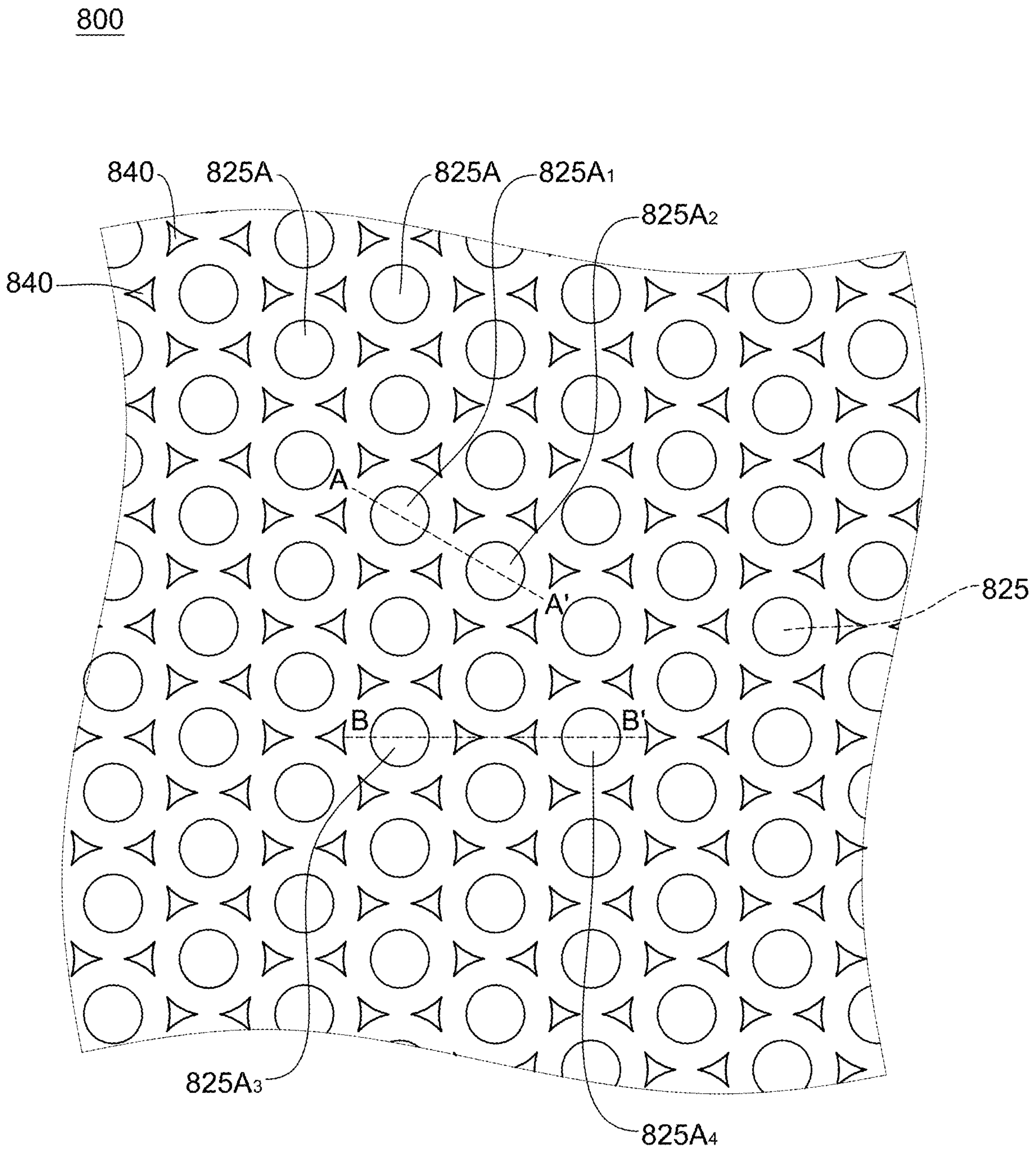
FIG. 8A through FIG. 8C illustrate a schematic top perspective view and schematic cross-sectional views of a semiconductor light emitting device according to another exemplary embodiment, respectively.
Figure 8B:
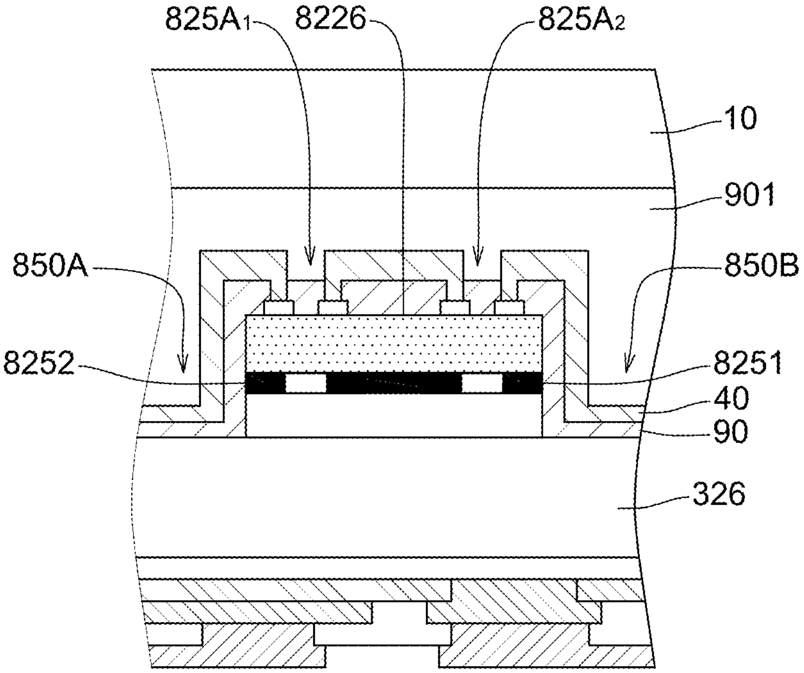
Figure 8C:
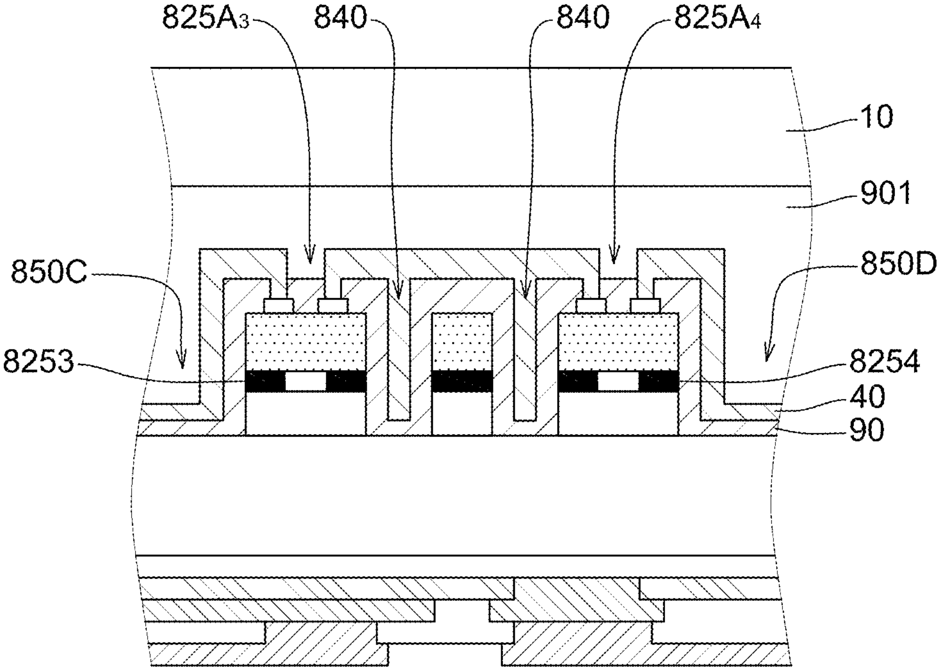

As the embodiment shown in FIG. 8A, the semiconductor light emitting device 800 comprises a plurality light emitting apertures 825A, for example, the opening $825A_1$, $825A_2$, $825A_3$, $825A_4$ as shown in FIG. 8B and FIG. 8C, and the light emitting apertures are arranged as an array. In the top view shown in FIG. 8A, the openings (the light emitting apertures) 825A in the semiconductor light emitting device 800 are of a closest packing arrangement. For example, the openings 825A are of a hexagonal closest packing arrangement; that is, in this embodiment, for each of the openings 825A, six openings 825A are formed on a peripheral portion of the opening 825A and adjacent to the opening 825A, and each of the openings 825A is surrounded by six recessed structures 840, wherein the recessed structure 840 is adapted to be applied with an oxidation process so as to form the current limiting region of each of the current confinement layers 825 inside the semiconductor light emitting device 800, but the disclosure is not limited thereto.

Please refer to the contents of Taiwan patent application number 108141545 for the illustrations of using the oxidation process to form the current limiting region of the current confinement layer. Accordingly, the epitaxial structure on the peripheral region of each of the light emitting apertures forms six recessed structures arranged uniformly (the six recessed structures are arranged equiangularly by 60 degrees). Hence, by applying the wet oxidation process to the six recessed structures, openings (the light emitting apertures of the semiconductor light emitting device) of substantially circular-shaped can be formed in the epitaxial structure of the semiconductor light emitting device. According to one or some embodiments of the disclosure, each of the recessed structures is shared by two adjacent light emitting apertures, so that the light emitting apertures can be arranged in the closest packing manner, thereby increasing the layout space for the light emitting apertures of the semiconductor light emitting device.

As shown in FIG. 8B, in the cross-sectional view along the line A-A' shown in FIG. 8A, no recessed structure is between the openings (the light emitting apertures) $825A_1$, $825A_2$; that is, in the cross-sectional view along the line A-A', the current limiting regions of the current confinement layers 8252, 8251 are respectively formed from the outer walls of the recessed structures 850A, 850B at two sides of the same mesa structure 8226 through the wet oxidation process, so that the openings (the light emitting apertures) $825A_1$, $825A_2$ are on the same mesa structure 8226. Also, as shown in FIG. 8C, in the cross-sectional view along the line B-B' shown in FIG. 8A, in addition to the recessed structures 850C, 805D, two recessed structures 840 are further formed between the opening $825A_3$ and the opening $825A_4$ adjacent to the opening $825A_3$; that is, in the cross-sectional view along the line B-B', the outer wall of the recessed structure 850C and the side wall of the recessed structure 840 are applied with the wet oxidation process to form the current limiting region of the current confinement layer 8253 so as to define the opening $825A_3$, and the side wall of the recessed structure 840 and the outer wall of the recessed structure 850D are applied with the wet oxidation process to form the current limiting region of the current confinement layer 8254 so as to define the opening $825A_4$. In one embodiment, several recessed structures are between two adjacent openings and are shared by the two adjacent openings, or only one recessed structure is between two adjacent openings and is shared by the two adjacent openings. Hence, according to one or some embodiments of the disclosure, the distance between two adjacent openings can be further reduced, so that the light emitting apertures of the semiconductor light emitting device can be arranged more densely.

Figure 9A:
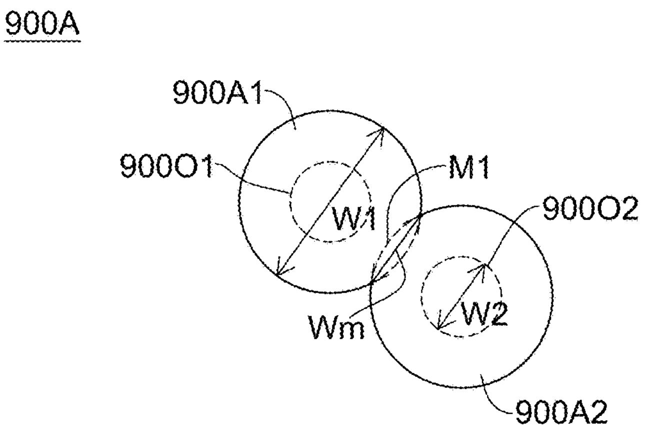
FIG. 9A through FIG. 9C illustrate schematic top perspective views of light emitting elements of semiconductor light emitting devices according to exemplary embodiments.
Figure 9B:
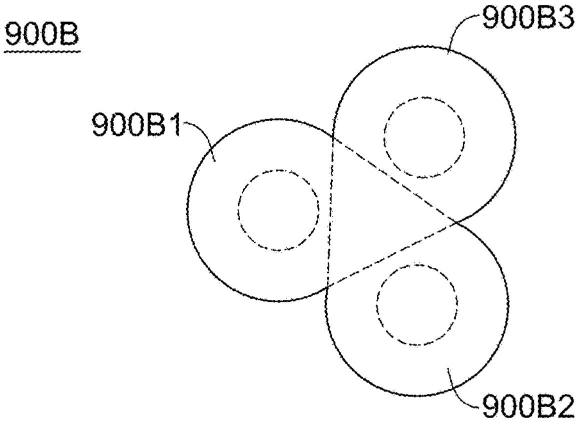
Figure 9C:
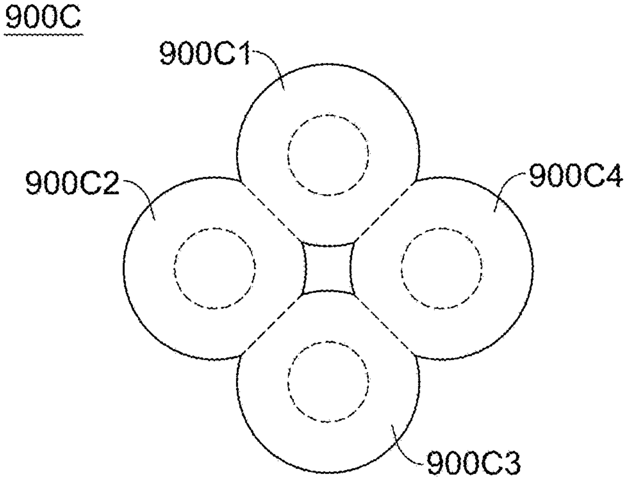

Please refer to the embodiments shown in FIG. 9A through FIG. 9C, wherein FIG. 9A through FIG. 9C illustrate schematic top perspective views of the light emitting units of the semiconductor light emitting devices according to exemplary embodiments of the disclosure. According to one or some embodiments of the disclosure, the epitaxial structures of the semiconductor light emitting device define a plurality of light emitting units; for example, as shown in FIG. 9A, in this embodiment, each of the light emitting regions of the semiconductor light emitting device may comprise a plurality of epitaxial structures, and each of the epitaxial structures defines a light emitting unit 900A. The light emitting unit 900A comprises two sub-units 900A1, 900A2 overlapped with each other and a middle region M1 in the overlapped region between the sub units 900A1, 900A2. The sub units 900A1, 900A2 respectively have conductive holes 900O1, 900O2 served as the light emitting apertures. Each of the sub-units 900A1, 900A2 has a maximum width W1, each of the conductive holes 900O1, 900O2 has a maximum width W2, and the middle region M1 has a maximum width Wm. In this embodiment, the value of the middle region M1 (Wm) is configured to satisfy the following relationship: $0<Wm<W1-W2$. Likewise, as shown in FIG. 9B and FIG. 9C, either no matter the number of the light emitting units 900B, 900C contained in the light emitting region is, or no matter the number of the sub units contained in each of the light emitting units (for example, in FIG. 9B, the light emitting unit 900B comprises three sub units 900B1, 900B2, 900B3; in FIG. 9C, the light emitting unit 900C comprises four sub units 900C1, 900C2, 900C3, 900C4), the value of the middle region M1 (Wm) satisfies the aforementioned relationship, that is, $0<Wm<W1-W2$.

Through the aforementioned configuration, the position and the number of light emitting apertures of each of the light emitting regions in the semiconductor light emitting device can be adjusted, and the position and the number of the through holes for forming the common electrode structures can be adjusted correspondingly, thereby increasing the application flexibility of addressable-control.

Figure 10A:
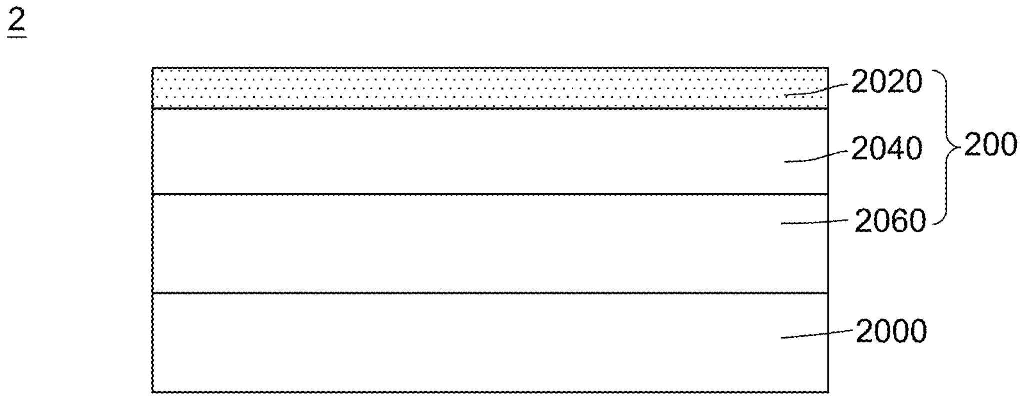
FIG. 10A through FIG. 10L illustrate schematic cross-sectional views showing manufacturing steps of a semiconductor light emitting device according to another exemplary embodiment.
Figure 10B:
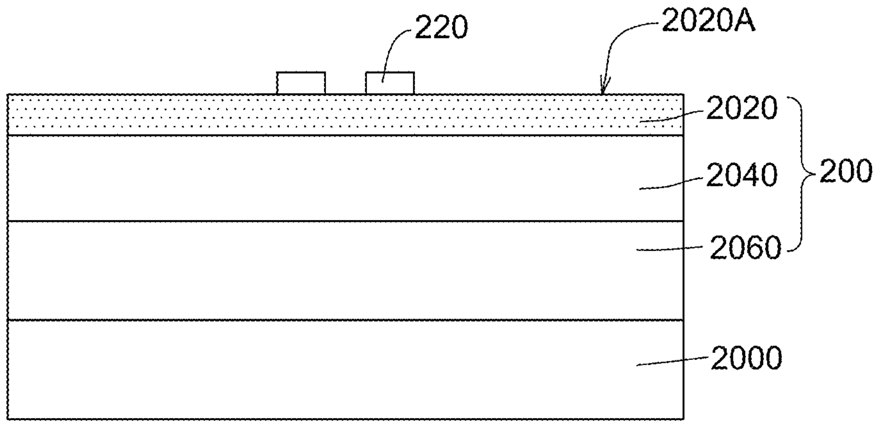
Figure 10C:
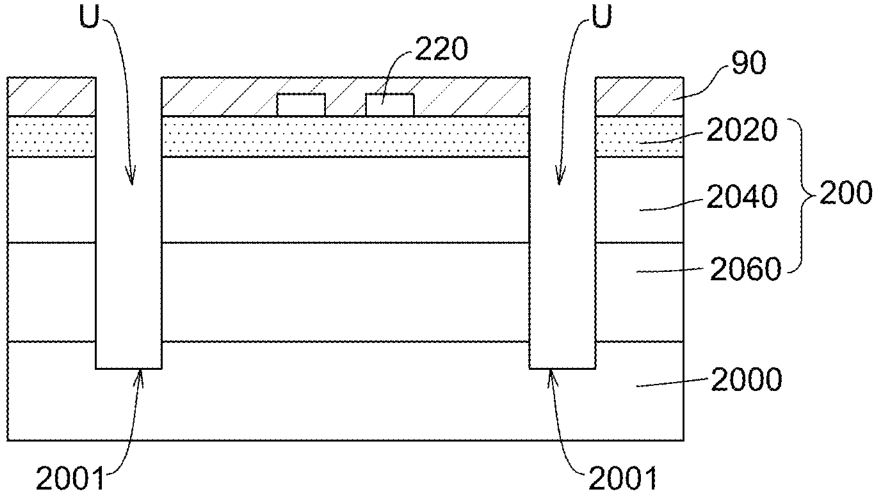
Figure 10D:
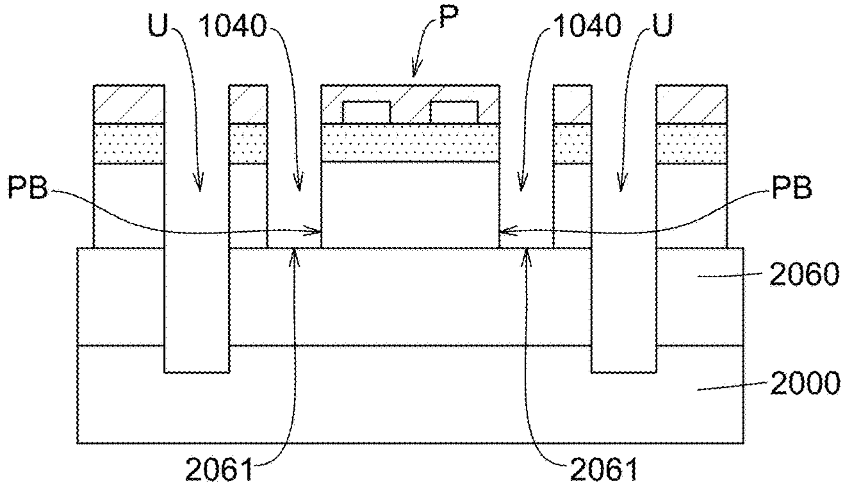
Figure 10E:
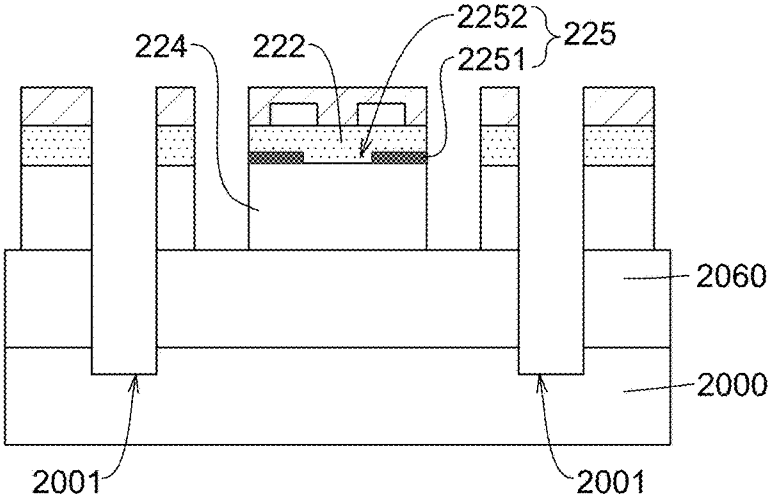

Please refer to the embodiment shown in FIG. 10A through FIG. 10L, which illustrate schematic cross-sectional structures of a semiconductor light emitting device according to an embodiment. In the manufacturing process of this embodiment, the steps shown in FIG. 10A through FIG. 10H are similar to the steps shown in FIG. 2A through FIG. 2F. In this embodiment, a chip 2 is provided. The chip 2 comprises a semiconductor epitaxial layer 200 formed on the growth substrate 2000. The semiconductor epitaxial layer 200 comprises a semiconductor layer 2060, an active layer 2040, and a semiconductor layer 2020 sequentially on the growth substrate 2000 (FIG. 10A). Then, a contact structure 220 is formed on a portion of the chip 2 on which the epitaxial columnar structure P is to be formed on (FIG. 10B). Then, a passivation layer 90 is formed on the contact structure 220 and the semiconductor epitaxial layer 200 and served as a protection layer. Next, an etching process is applied to form through holes U so as to expose the end surface 2001 of the substrate 2000 (FIG. 10C), wherein the shape of the through hole is not limited; that is, the through hole may have arc profile, circular or elliptical profile, polygonal profile, or a profile with any shape. An etching process is further applied to form the epitaxial columnar structures P and the recessed structures 1040 so as to expose portions of the end surface 2061 of the semiconductor layer 2060, wherein the epitaxial columnar structure P has a side surface PB (FIG. 10D).

Figure 10F:
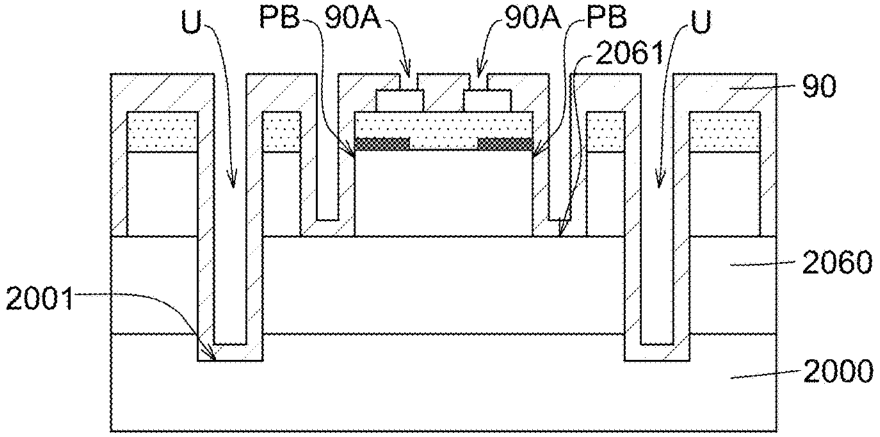

Next, a current confinement layer is formed in the epitaxial columnar structure P by using the wet oxidation process mentioned above, so that the structure shown in FIG. 10E can be formed; that is, in this embodiment, the current confinement layer 225 is formed between the semiconductor structure 222 and the active structure 224. The current confinement layer 225 comprises a current limiting region 2251 and a current conduction region 2252 surrounded by the current limiting region 2251. As shown in FIG. 10F, the passivation layer 90 is formed in the through holes U and the recessed structures 1040, and the passivation layer 90 covers the side surface PB of the epitaxial columnar structure Pb, the end surface 2061 of the semiconductor layer 2060, and the end surface 2001 of the growth substrate 2000. Next, openings 90A are formed in the passivation layer 90 to expose portions of the surface of the contact structure 220. From a top view, the opening 90A may be ring-shaped, circular-shaped, elliptical-shaped, polygonal-shaped, square-shaped, irregular-shaped, or the like. In this embodiment, the opening 90A is ring-shaped, but the disclosure is not limited thereto.

Figure 10G:
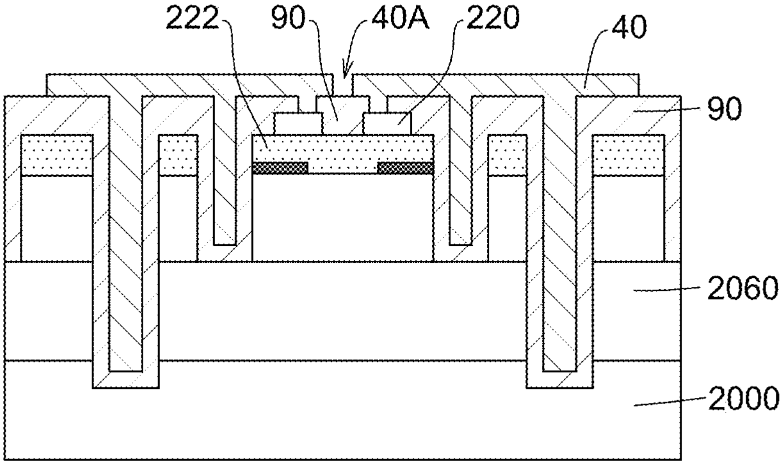
Figure 10H:
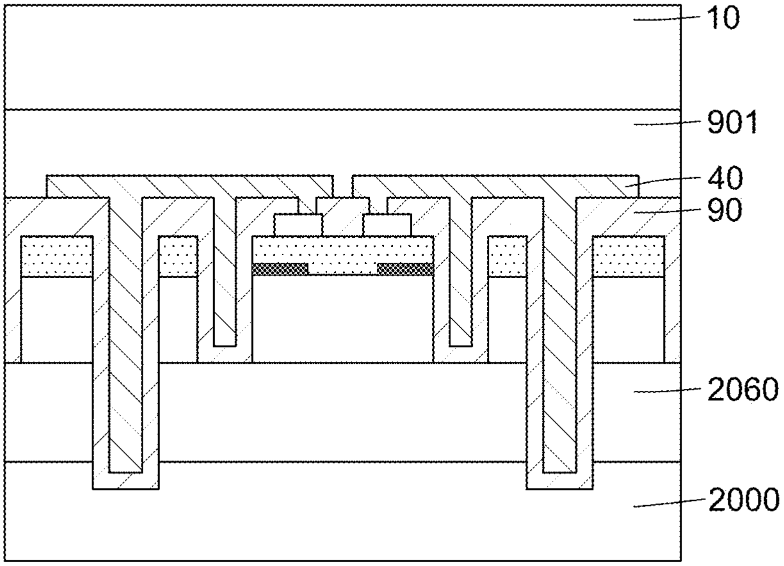

Next, as shown in FIG. 10G, a metal connecting layer 40 is formed on the passivation layer 90. The metal connecting layer 40 covers the passivation layer 90 and is filled in the openings 90A so as to be connected to the contact structure 220, so that the metal connecting layer 40 is further electrically connected to the semiconductor structure 222. The metal connecting layer 40 has an opening 40A above the epitaxial columnar structures P, and the position of the opening 40A corresponds to the position of the current conduction region 2252, so that the passivation layer 90 below the opening 40A is exposed. Next, as shown in FIG. 10H, the epitaxial columnar structure P and the semiconductor layer 2060 are adhered to the substrate 10 through the adhesive layer 901. In this embodiment, the substrate 10 is a permanent substrate.

Figure 10I:
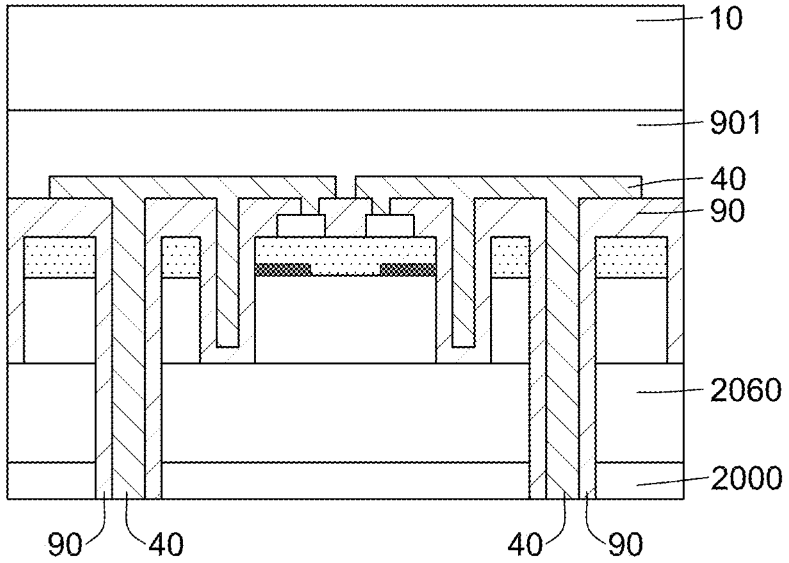
Figure 10J:
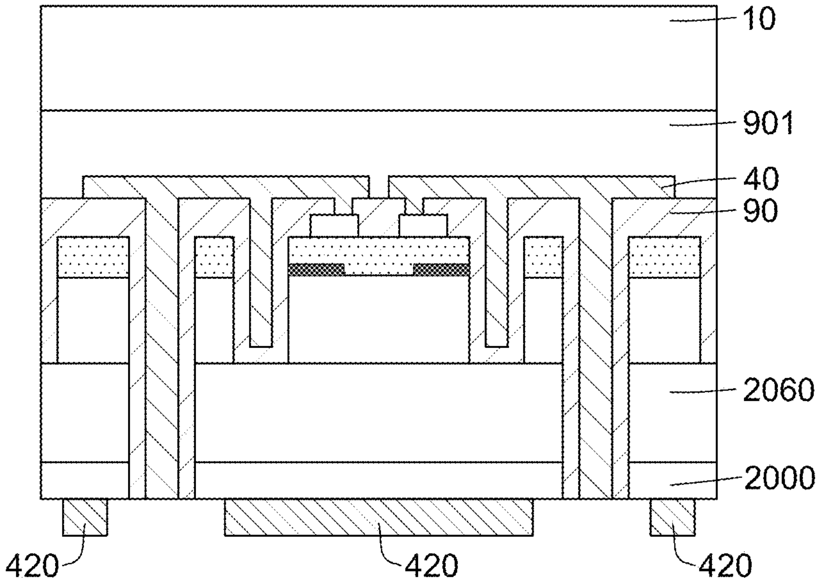

Next, as shown in FIG. 10I, portions of the growth substrate 2000 are moved to expose portions of the surfaces of the metal connecting layer 40 and the passivation layer 90. In this embodiment, the growth substrate 2000 for example is a GaAs substrate. Then, an electrode connecting layer 420 is formed on the substrate 2000, as shown in FIG. 10J. Next, a passivation layer 82 is formed to cover portions of the electrode connecting layer 420. A plurality of openings 82A, 82B are formed in the passivation layer 82 so as to expose portions of the electrode connecting layer 420 and the metal connecting layer 40, respectively.

Figure 10K:
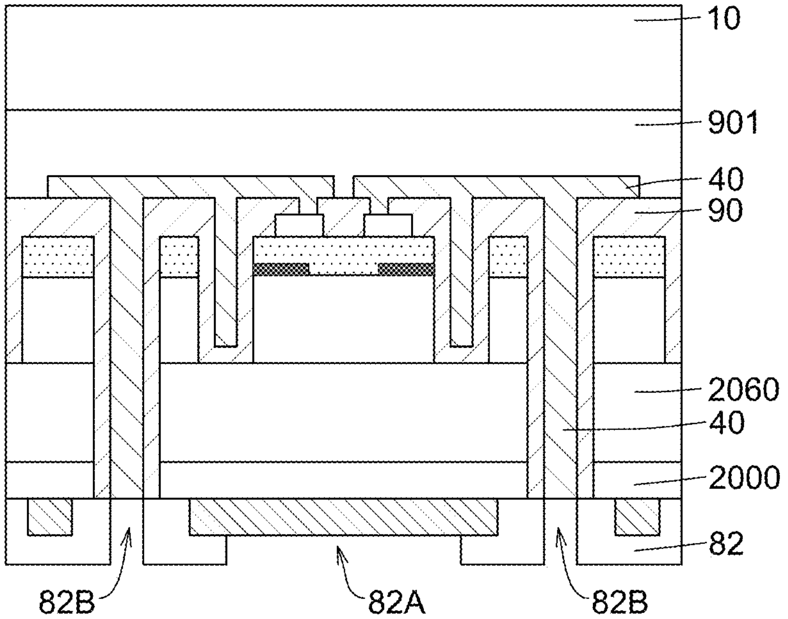
Figure 10L:
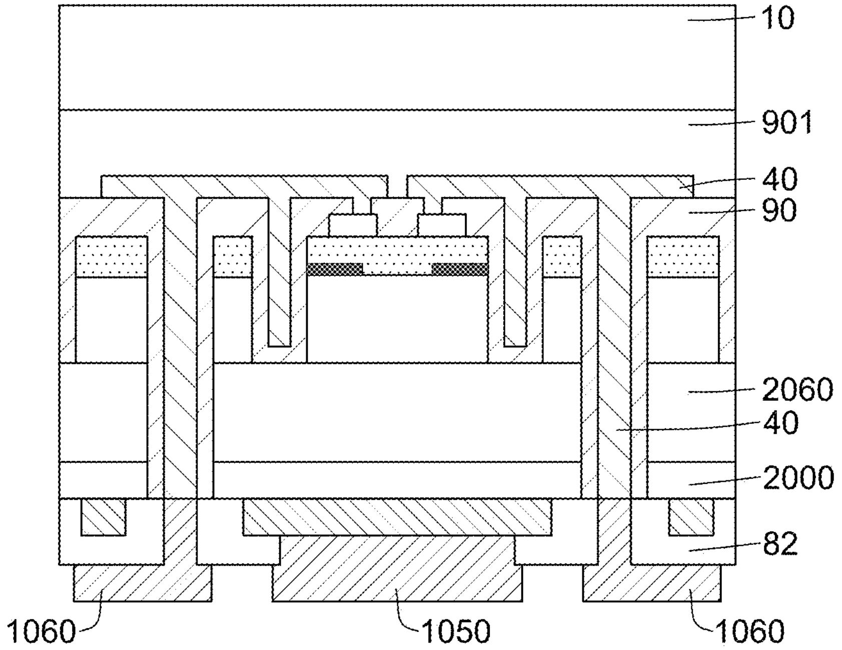

Last, conductive materials are filled in the openings 82A, 82B, so that the electrode structure 1050 and the electrode structure 1060 of the semiconductor light emitting device can be formed, respectively, as shown in FIG. 10L.

The embodiment shown in FIG. 2A through FIG. 2K adopts a two-staged mesa etching process, where the P-type semiconductor layer side and the N-type semiconductor layer side of the semiconductor device are etched, so that the metal connection can be prevented from being affected owing to the height difference of the etched portions. Moreover, the electrical connection can be achieved through evaporation or chemical gold plating (electrodeless gold plating). However, in this configuration, since the light emitting apertures are the only supporting portions at the P-type semiconductor layer side, the resistance to stress is relatively insufficient. Moreover, according to the embodiment, the manufacturing process is more complicated. In this embodiment, the feature of the configuration is that, the original GaAs growth substrate is removed by using the wet etching process completely, and only the ohm contacts (the portion of the growth substrate where the thickness is less than or equal to 1 micrometer) are retained. From a side view, the conductive through hole is a combination of a trapezoid and an inverse trapezoid (along the direction from the substrate to the epitaxial structure), and there are two passivation layers and three metal conductive layers on the N-type semiconductor structure.

As compared with the embodiment shown in FIG. 2A through FIG. 2K, the embodiment shown in FIG. 10A through FIG. 10L also adopts the two-staged mesa etching process, and in this embodiment, the etching process is only applied to the P-type semiconductor layer side (for example, the P-type DBR structure side). According to the embodiment, the etching depth is much deeper, and the electroplating process is utilized to form the conductive through hole structure (for example, the metal connecting layer 40 shown in FIG. 10G). According to this embodiment, most of the epitaxial layers of the semiconductor device can be retained as the supporting portions, so that the light emitting apertures can be prevented from being damaged owing to the stress to cause failure, and the overall manufacturing process can be relatively simplified. In this embodiment, the feature of the configuration is that, portions of the original substrate 2000 are retained (that is, the thinned substrate 2000 shown in FIG. 10I, where the thickness of the thinned substrate 2000 is limited to the thinning accuracy of the milling and polishing process, usually about 10-20 micrometers), the conductive through hole is trapezoidal-shaped (along the direction from the substrate to the epitaxial structure), the N side structure layer may only have one electrical passivation layer (as shown in FIG. 10K) and two metal conductive layers (as the electrode structure shown in FIG. 10L).

Figure 11:
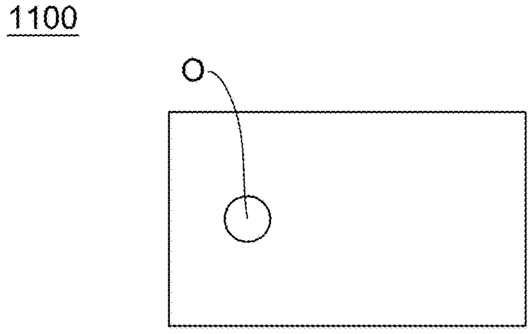
FIG. 11 and FIG. 12 illustrate a schematic top perspective view and a schematic bottom perspective view of a semiconductor light emitting device according to an exemplary embodiment, respectively.
Figure 12:
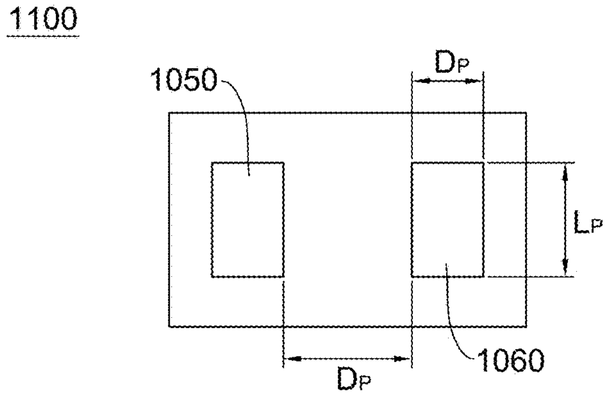

FIG. 11 and FIG. 12 illustrate a schematic top perspective view and a schematic bottom perspective view of a semiconductor light emitting device according to an exemplary embodiment, respectively. In this embodiment, the semiconductor light emitting 1100 may be for example a single-hole VCSEL, and the hole diameter of the light emitting aperture O is about in a range between 30 and 40 micrometers. However, owing to the limitations of the flip chip type electrode structure (for example, the pad) to the circuit board and the packaging process, in general, the minimum size $L_p \times W_p$ of each of the electrode structures 1050, 1060 is 80 micrometers×50 micrometers, and the distance $D_p$ is 90 micrometers. Accordingly, the size and the distance of the electrode structures are all greater than the size of the light emitting apertures. In this embodiment, to prevent the size difference between the electrode structure and the light emitting aperture from affecting the chip utilization rate, a structure with the electrostatic discharge (ESD) protection function is integrated in the VSCEL chip structure. Therefore, a VCSEL device with the ESD protection function can be obtained without increasing or greatly increasing the overall size of the VCSEL device.

Figure 13:
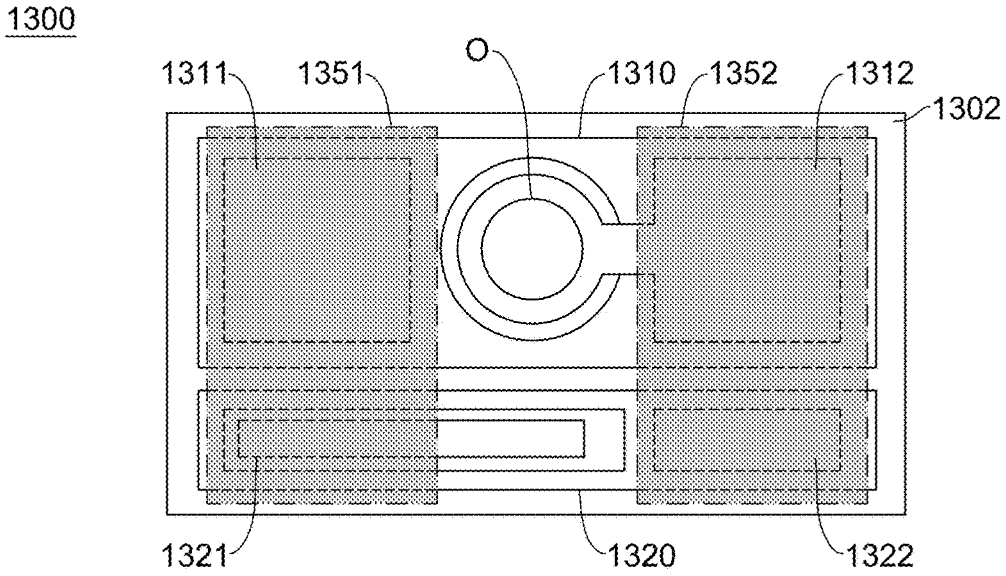
FIG. 13 illustrates a schematic plan perspective view of a semiconductor light emitting device according to an exemplary embodiment.

FIG. 13 illustrates a schematic top perspective view of a semiconductor light emitting device according to an exemplary embodiment. In this embodiment, for example, the VCSEL epitaxial structure may be the epitaxial structure of the semiconductor light emitting device according to one or some embodiments mentioned above, and the epitaxial structure can be separated into two independent regions (e.g. regions 1310 and 1320) by etching, the upper region 1310 can be performed as a VCSEL epitaxial region and the lower region 1320 can be performed as an ESD protection epitaxial region. The region 1310 has a P-type side electrode structure 1312 and an N-type side electrode structure 1311 for electrical connection, and the region 1320 has a P-type side electrode structure 1321 and an N-type side electrode structure 1322 for electrical connection. In another embodiment, for example, the VCSEL epitaxial structure may be the epitaxial structure of the semiconductor light emitting device according to one or some embodiments mentioned above, and the ESD protection epitaxial structure is grown below the VCSEL epitaxial structure and such configuration does not affect the optoelectronic property of the VCSEL device, and the ESD protection function can be adjusted through this configuration.

As shown in FIG. 13, in this embodiment, the semi-insulating GaAs substrate is served as the growth substrate of the semiconductor device for performing the epitaxy growth, or a substrate transfer process is applied to replace the original conductive GaAs substrate with an insulating substrate. That is, in this embodiment, the substrate 1302 is not electrically conductive. In this embodiment, for a horizontal VCSEL device, through a front wire bonding process, the P-type side electrode structures 1312, 1321 and the N-type side electrode structures 1311, 1322 of the semiconductor light emitting device for electrical connection. As shown, in this embodiment, the N-type side electrode structure 1311 of the upper VCSEL epitaxial region 1310 is connected to the P-type side electrode structure 1321 of the lower ESD protection epitaxial region 1320 through the conductive portion 1351, and the P-type side electrode structure 1312 of the upper VCSEL epitaxial region 1310 is connected to the N-type side electrode structure 1322 of the lower ESD protection epitaxial region 1320 through the conductive portion 1352.

Figure 14:
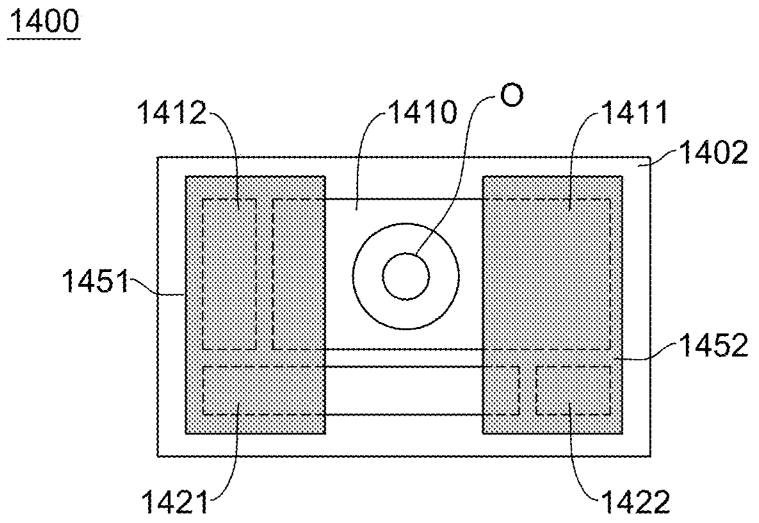
FIG. 14 illustrates a schematic plan perspective view of a semiconductor light emitting device according to another exemplary embodiment.

FIG. 14 illustrates a schematic top perspective view of a semiconductor light emitting device according to another exemplary embodiment. This embodiment is similar to the embodiment shown in FIG. 13; that is, in this embodiment, the substrate 1402 at the bottom portion of the semiconductor light emitting device is a substrate that is not electrically conductive. For example, the semi-insulating GaAs substrate is served as the growth substrate of the semiconductor device for performing the epitaxy growth, or a substrate transfer process is applied to replace the original conductive GaAs substrate with an insulating substrate. Different from the embodiment shown in FIG. 13, in the embodiment shown in FIG. 14, flip-chip electrical connections for the P-type side electrode structures and the N-type side electrode structures of the semiconductor light emitting device are respectively made through a flip-chip soldering process; in other words, in this embodiment, the P-type side electrode 1412 of the upper VCSEL epitaxial region 1410 is electrically connected to the N-type side electrode 1421 of the lower ESD protection epitaxial region 1420 through a solder structure 1451, and the N-type side electrode 1411 of the upper VCSEL epitaxial region 1410 is electrically connected to the P-type side electrode 1422 of the lower ESD protection epitaxial region 1420 through a solder structure 1452.

Figure 15:
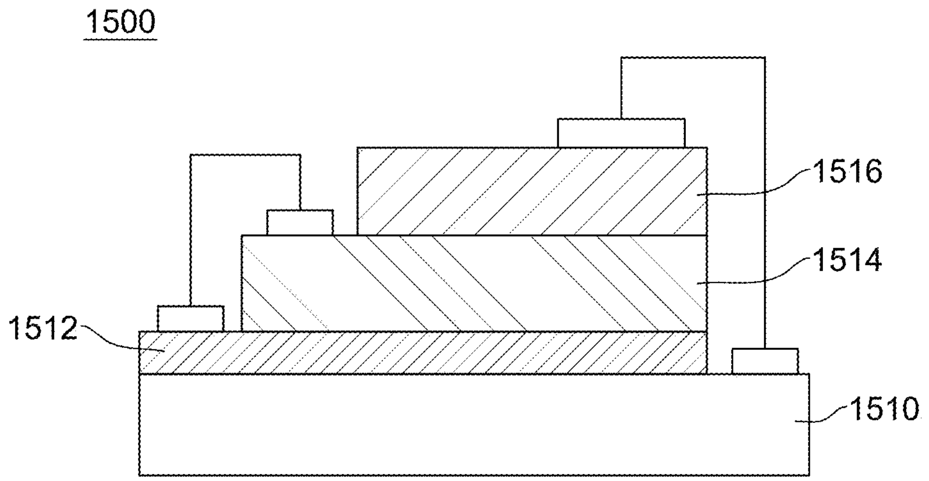
FIG. 15 illustrates a schematic side view of a semiconductor light emitting device according to another exemplary embodiment.

FIG. 15 illustrates a schematic side view of a semiconductor light emitting device according to another exemplary embodiment. In this embodiment, the epitaxial layer stacking process is applied to implement the VCSEL device structure 1500 having ESD protection circuit therein, wherein the P-type semiconductor layer 1512 and the N-type substrate 1510 at the bottom of the VCSEL device structure 1500 may be formed as the structure of the ESD protection circuit which is electrically connected to the upper VCSEL (the VCSEL P-type semiconductor epitaxial layer 1516 and the VCSEL N-type semiconductor epitaxial layer 1514) in the form of electrically parallel connection, thereby enhancing the ESD protection capability. Moreover, the ESD protection capability may be adjusted by changing the doping concentration and the material of the lower P-type semiconductor layer 1512.

Accordingly, one or some embodiments of the disclosure provide a semiconductor light emitting device which has a low capacitance and low resistance, which can be operated under high-frequency environments, and which has the addressable-control function. By dividing the metal conductive layer on the epitaxial surface adjacent to the substrate into several regions according to the number and the position of the light emitting regions, the addressable-control function of the light emitting regions can be achieved.

According to one or some embodiments of the disclosure, since the light emitting region of the semiconductor light emitting device may have the light emitting aperture for light emission and the through hole for electrical conduction at the same time, and the through hole is connected to the metal conductive layer on the substrate side, the through hole can be served as the common electrode structure of the light emitting regions of the semiconductor light emitting device. The number, the shape, and the position of the common electrode structure can be adjusted according to actual configurations of the light emitting regions. Therefore, the operation function of the semiconductor light emitting device can be retained properly and the volume of the semiconductor light emitting device can be reduced. Through the cooperation between the common electrode structure and the independent electrode of the light emitting region, addressable-control function can be performed on different light emitting regions, so that the luminance and the position of the light emitting regions can be adjusted according to the actual application scenarios. According to another concept, in one or some embodiments of the disclosure, the electrodes may be divided into a plurality of sets of P-type side and N-type side electrode structures so as to optimize the current transmission and distribution of a large-scaled chip.

Furthermore, according to one or some embodiment of the disclosure, the epitaxial structure of the semiconductor light emitting device is patterned to form a single-staged or two-staged elevated structure, so that the height of the side wall can be reduced to facilitate the metal wiring process, thereby reducing the overall resistance of the semiconductor light emitting device. According to one or some embodiments of the disclosure, gluing materials with low dielectric constant (low k) (for example, spin-on-glue (SOG) gluing materials) are adopted as the material for the passivation layer in the semiconductor light emitting device. Hence, not only the surface flattening of the overall device can be achieved, but also the overall capacitance of the semiconductor light emitting device can be reduced. Moreover, in the subsequent die attach process, the gluing materials may be served as the cushioning layer for protecting the chip. Therefore, the characteristics and the performance of the semiconductor light emitting device according to one or some embodiments of the disclosure can be further enhanced. Accordingly, the semiconductor light emitting device can be provided for the applications of a time of flight (ToF) three-dimensional detection device or a flood illuminator; however, the applications of the semiconductor light emitting device is not limited thereto.

It should be noted that, the foregoing embodiments of the disclosure are intended only to illustrate the disclosure and not to limit the scope of the disclosure. All modifications and variations of the disclosure by persons skilled in the art are in accordance with the spirit and scope of the disclosure. The same or similar components in different embodiments, or components denoted by the same component symbols in different embodiments, have the same physical or chemical properties. In addition, where appropriate, the above embodiments of the disclosure may be combined or substituted with each other, and are not limited to the particular embodiments described above. The connection relationship between a particular member and other members described in one embodiment may also be applied to other embodiments, all of which fall within the scope of the patent application as attached to the disclosure.

BRIEF SYMBOL DESCRIPTION OF THE DRAWINGS

2 chip
10 substrate
10A, 10B side
20, 30 epitaxial structure
20A, 30A surface
40 metal connecting layer
40A opening
40B spacing
40*a*, 40*b* portion (of the metal connecting layer 40)
42 common electrode connecting layer
50, 60, 70, 80 electrode structure
50', 60', 70', 80' electrode structure
50A, 60A, 70A, 80A electrode structure
50B, 60B, 70B, 80B electrode structure
82, 84, 90 passivation layer
82A, 82B, 84A, 84B opening
90A, 90B opening
100, 300, 400, 500A-500C light emitting device
600A-600E, 700A, 700B, 800 light emitting device
1100, 1300, 1400, 1500 light emitting device
100A-100D light emitting region
300A-300D light emitting region
400A-400D light emitting region
500A1, 500A2, 500B1, 500B2, 500C1-500C9 light emitting region
600A1-600A4 light emitting region
600B1-600B4 light emitting region
600C1-600C4 light emitting region
600D1-600D4 light emitting region
600E1-600E9 light emitting region light emitting region
200 semiconductor epitaxial layer
201, 301 through hole
220, 320 contact structure
222, 322 semiconductor structure
224, 324 active structure
225, 325 current confinement layer
2251, 3251 current limiting region
2252, 3252 current conduction region
226, 326 mesa structure
370 common electrode
420, 520, 242, 342 electrode connecting layer
421, 422 conductive layer
502, 602, 702, 802 middle layer
504, 604, 704, 804 attaching layer
550A1, 550A2, 550B1, 550B2, 550C1-550C3 electrode structure
650A1, 650A2, 650B1-650B4 electrode structure
650C1, 650C2, 650D1, 650E1-650E6 electrode structure
650D11-650D14 opening portion

570A1, 570A2, 570B1, 570B2, 570C1-570C3 electrode structure
670A1, 670A2, 670B1-670B4, 670C1-670C4 electrode structure
670D1-670D4, 670E1-670E6 electrode structure
720, 730 epitaxial structure
726, 736 mesa structure
750, 760, 770, 780 electrode structure
720B planarization surface
821 side portion
822 upper portion
825 current confinement layer
8251-8254 current confinement layer
825A opening (light emitting aperture)
825A1-825A4 opening (light emitting aperture)
840 recessed structure
850A-850D recessed structure
900A-900C light emitting unit
900A1, 900A2, 900B1-900B3, 900C1-900C4 sub unit
900O1, 900O2 light emitting aperture
901 adhesive layer
1040 recessed structure
1050, 1060 electrode structure
1302, 1402 substrate
1310, 1410 VCSEL epitaxial region
1311, 1312, 1321, 1322, 1411, 1412, 1421, 1422 electrode structure
1320, 1420 ESD protection epitaxial region
1351, 1352 conductive portion
1451, 1452 solder structure
1500 VCSEL device structure
1510 substrate
1512 semiconductor layer
1514, 1516 semiconductor epitaxial layer
2000 growth substrate
2020 semiconductor layer
2040 active layer
2060 semiconductor layer
2061 end surface
2261, 3261 upper surface
2262, 3262 side surface
8226 mesa structure
RS groove structure
CE common electrode structure
P, P1-P4, P11-P16, P21-P24, P31-P32 epitaxial columnar structure
PA upper surface
PB side surface
O, O1, O2 light emitting aperture
V reserved position
V1, V2 reserved region
TP thermal conductive structure
M1 middle region
U through hole
G1-G3' gap
w1, w2, W1, W2, Wm width

What is claimed is:

1. A semiconductor light emitting device comprising:
a substrate;
a first epitaxial structure and a second epitaxial structure on the substrate side by side;
a connecting layer between the first epitaxial structure and the substrate, between the second epitaxial structure and the substrate, and between the first epitaxial structure and the second epitaxial structure;
a first electrode structure on the first epitaxial structure away from the substrate;
a second electrode structure on the second epitaxial structure away from the substrate;
a third electrode structure electrically connected to the connecting layer; and
a through hole structure in the first epitaxial structure, wherein a conductive layer is in the through hole structure and connected to the connecting layer and the third electrode structure.

2. The semiconductor light emitting device according to claim 1, wherein the connecting layer comprises a first portion and a second portion, and the first portion and the second portion are between the first epitaxial structure and the second epitaxial structure; the first portion is electrically connected to the first epitaxial structure, the second portion is electrically connected to the second epitaxial structure, and a spacing is between the first portion and the second portion, so that the first portion is not connected to the second portion.

3. The semiconductor light emitting device according to claim 1, further comprising a plurality of the third electrode structures, wherein at least one of the third electrode structures is between the first epitaxial structure and the second epitaxial structure.

4. The semiconductor light emitting device according to claim 1, further comprising a plurality of the third electrode structures on a peripheral region of the semiconductor light emitting device, wherein the plurality of third electrode structures are together electrically connected to the connecting layer.

5. The semiconductor light emitting device according to claim 4, wherein the plurality of third electrode structures on the peripheral region of the semiconductor light emitting device surround the first electrode structure and the second electrode structure.

6. The semiconductor light emitting device according to claim 1, wherein the semiconductor light emitting device has a first light emitting region and a second light emitting region adjacent to the first light emitting region, the first epitaxial structure has a plurality of first epitaxial columnar structures in the first light emitting region, and the second epitaxial structure has a plurality of second epitaxial columnar structures in the second light emitting region.

7. The semiconductor light emitting device according to claim 6, wherein the first epitaxial structure further includes a first mesa structure, the second epitaxial structure further includes a second mesa structure, and the first epitaxial columnar structures are on the first mesa structure and the second epitaxial columnar structures are on the second mesa structure.

8. The semiconductor light emitting device according to claim 7, wherein a first distance is between at least one of the first epitaxial columnar structures and at least one of the second epitaxial columnar structures that are adjacent to each other, a second distance is between at least two of the first epitaxial columnar structures that are adjacent to each other, and the first distance is greater than the second distance.

9. The semiconductor light emitting device according to claim 7, wherein a first distance is between one of the first epitaxial columnar structures and one of the second epitaxial columnar structures that are adjacent to each other, a third distance is between at least two of the second epitaxial columnar structures that are adjacent to each other, and the first distance is greater than the third distance.

10. The semiconductor light emitting device according to claim 8, wherein the through hole structure is in the first epitaxial structure between the first epitaxial columnar structure and the second epitaxial columnar structure that are adjacent to each other, and the through hole structure is between the connecting layer and the third electrode structure.

11. The semiconductor light emitting device according to claim 7, further comprising at least one thermal conductive structure, wherein the at least one thermal conductive structure is at least on a back surface of the first light emitting region or at least on a back surface of the second light emitting region, the at least one thermal conductive structure covers an area where the first epitaxial columnar structures or the second epitaxial columnar structures are located.

12. The semiconductor light emitting device according to claim 11, wherein the first electrode structure is between the at least one thermal conductive structure and the first mesa structure, and the second electrode structure is between the at least one thermal conductive structure and the second mesa structure.

13. The semiconductor light emitting device according to claim 1, wherein the semiconductor light emitting device has a first light emitting region and a second light emitting region surrounding the first light emitting region, the first epitaxial structure is in the first light emitting region, and the second epitaxial structure is in the second light emitting region.

14. The semiconductor light emitting device according to claim 1, further comprising a passivation layer between the first epitaxial structure and the second epitaxial structure, wherein a surface of the passivation layer is coplanar with a surface of the first epitaxial structure and a surface of the second epitaxial structure.

15. The semiconductor light emitting device according to claim 14, wherein the first epitaxial structure includes a first mesa structure and a first epitaxial columnar structure on the first mesa structure, and the second epitaxial structure includes a second mesa structure and a second epitaxial columnar structure on the second mesa structure.

16. The semiconductor light emitting device according to claim 15, wherein a width of the first mesa structure is equal or close to a width of the first epitaxial columnar structure, and a width of the second mesa structure is equal or close to a width of the second epitaxial columnar structure.

17. A semiconductor light emitting device comprising:

a substrate;

a first epitaxial structure and a second epitaxial structure on the substrate side by side;

a connecting layer between the first epitaxial structure and the substrate, between the second epitaxial structure and the substrate, and between the first epitaxial structure and the second epitaxial structure;

a first electrode structure on the first epitaxial structure away from the substrate;

a second electrode structure on the second epitaxial structure away from the substrate;

a third electrode structure electrically connected to the connecting layer, wherein the semiconductor light emitting device has a first light emitting region and a second light emitting region adjacent to the first light emitting region, the first epitaxial structure has a plurality of first epitaxial columnar structures in the first light emitting region, and the second epitaxial structure has a plurality of second epitaxial columnar structures in the second light emitting region; and a plurality through hole structures in the first epitaxial structure or in the second epitaxial structure, wherein a distance between the through hole structure and a side portion of the substrate is less than a distance between the first light emitting region and the side portion of the substrate or less than a distance between the second light emitting region and the side portion of the substrate, and a conductive layer is in the through hole structure and connected to the connecting layer and the third electrode structure.

* * * * *